US008131721B2

(12) United States Patent
Kataoka et al.

(10) Patent No.: US 8,131,721 B2
(45) Date of Patent: Mar. 6, 2012

(54) INFORMATION RETRIEVAL METHOD, INFORMATION RETRIEVAL APPARATUS, AND COMPUTER PRODUCT

(75) Inventors: Masahiro Kataoka, Kawasaki (JP);
Hiroyuki Torii, Kawasaki (JP);
Masahiro Kurishima, Kawasaki (JP);
Hideo Kasai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 12/418,886

(22) Filed: Apr. 6, 2009

(65) Prior Publication Data

US 2009/0193020 A1    Jul. 30, 2009

Related U.S. Application Data

(63) Continuation of application No. PCT/JP2006/320827, filed on Oct. 19, 2006.

(51) Int. Cl.
*G06F 7/00* (2006.01)
*G06F 17/30* (2006.01)

(52) U.S. Cl. . 707/736; 707/793; 707/796; 707/999.101; 715/242; 382/232; 382/244; 711/201; 711/E12.083

(58) Field of Classification Search .................. 707/736, 707/770, 796, 793, 999.101; 715/242; 382/232, 382/244; 711/201, E12.083
See application file for complete search history.

(56) References Cited

U.S. PATENT DOCUMENTS

| | | | | |
|---|---|---|---|---|
| 3,521,034 A | * | 7/1970 | Mooers | 235/439 |
| 3,916,388 A | * | 10/1975 | Shimp et al. | 711/201 |
| 6,931,418 B1 | * | 8/2005 | Barnes | 707/776 |
| 7,340,485 B2 | * | 3/2008 | Varpela et al. | 707/827 |
| 7,769,904 B2 | * | 8/2010 | Eller | 709/250 |
| 7,882,083 B2 | * | 2/2011 | Kataoka et al. | 707/692 |
| 2002/0136462 A1 | * | 9/2002 | Hebert, Jr. | 382/246 |
| 2003/0115191 A1 | * | 6/2003 | Copperman et al. | 707/3 |

(Continued)

FOREIGN PATENT DOCUMENTS

JP          A 2-159618          6/1990

(Continued)

OTHER PUBLICATIONS

David C. Torney & Byron Goldstein—"Rates of Diffusion-Limited Reaction in Periodic Systems"—Journal of Statistical Physics, vol. 49, No. 3-4, Jul. 21, 1987 (pp. 725-750:1-26).*

(Continued)

*Primary Examiner* — John E Breene
*Assistant Examiner* — Anh Ly
(74) *Attorney, Agent, or Firm* — Greer, Burns & Crain, Ltd.

(57) ABSTRACT

An information retrieval apparatus includes an acquiring unit that acquires a numerical value defining a boundary of a numerical range; a detecting unit that detects a number of places in and a head numeral of the numerical value; an extracting unit that extracts from a bit string group, a bit string indicating whether a numerical value in a numerical value group having the number of places and the head numeral is present in files subject to retrieval; a specifying unit that specifies a file corresponding to a bit in the extracted bit string, the bit indicating the presence of a numerical value of the numerical value group; a determining unit that determines whether a numerical value in the specified file meets the boundary condition; and a designating unit that, based on a determination by the determining unit designates the specified file to have a numerical value within the numerical range.

8 Claims, 47 Drawing Sheets

U.S. PATENT DOCUMENTS

| | | | | |
|---|---|---|---|---|
| 2005/0163387 A1* | 7/2005 | Sugita | ............................ | 382/232 |
| 2005/0278616 A1* | 12/2005 | Eller | ............................ | 709/247 |
| 2006/0174209 A1* | 8/2006 | Barros | ............................ | 715/764 |
| 2006/0218154 A1* | 9/2006 | Furusho | ............................ | 707/100 |
| 2008/0098024 A1* | 4/2008 | Kataoka et al. | ............... | 707/101 |
| 2009/0193020 A1* | 7/2009 | Kataoka et al. | ................... | 707/5 |
| 2010/0131475 A1* | 5/2010 | Kataoka et al. | ............... | 707/693 |

FOREIGN PATENT DOCUMENTS

| | | |
|---|---|---|
| JP | A 3-19081 | 1/1991 |
| JP | A 3-147036 | 6/1991 |
| JP | A 5-61918 | 3/1993 |
| JP | A 5-314188 | 11/1993 |
| JP | A 6-309369 | 11/1994 |

OTHER PUBLICATIONS

T. J. Carroll & R. M. Ring—"Propagation of Short Radio Waves in a Normally Stratified Troposphere"—Proceedings of the Institute of Radio Engineers (IRE), vol. 43, Issue 10 Oct. 1955 (pp. 1384-1390:1-7) (Current Version: Jan. 15, 2007).*

* cited by examiner

FIG.5

| | TYPE | NUMERICAL VALUE/CHARACTER DATA | APPEARANCE FREQUENCY (NUMBER OF TIMES) | NUMBER OF APPEARANCE FILES | APPEARANCE RANK | APPEARANCE MAP 012········· ······n |
|---|---|---|---|---|---|---|
| NUMERICAL VALUE DATA | NUMERAL | 0 ⋮ 9 | 1,238 635 | 230 157 | 102 135 | 1011000110110011011011· · ·0110111001 1000101111000101010011· · ·0110111001 |
| | NUMERICAL CONSECUTIVE CHARACTERS | NUMERICAL CONSECUTIVE CHARACTERS 00 ⋮ NUMERICAL CONSECUTIVE CHARACTERS 99 | | | | 1000101111000101010011· · ·0110111001 1011000110110011011011· · · |
| | NUMERICAL CHARACTER GROUP | ONE-PLACE/HEAD NUMERAL 1 ⋮ ONE-PLACE/HEAD NUMERAL 9 TWO-PLACE/HEAD NUMERAL 1 ⋮ | | | | 1000101111000101010011· · ·0110111001 |
| | NUMERICAL CHARACTER ABSTRACTED DATA | MILD HIGH BLOOD PRESSURE MODERATE HIGH BLOOD PRESSURE SEVERE HIGH BLOOD PRESSURE MILD ABNORMALITY SEVERE ABNORMALITY | | | | 1011000110110011011011· · ·0110111001 |
| CHARACTER DATA | ENGLISH CHARACTER | A ⋮ z | 1,238 635 | 230 157 | 102 135 | 1011000110110011011011· · ·0110111001 1000101111000101010011· · ·0110111001 |
| | KANA | あ ⋮ ん | 14,397 5,392 | 382 436 | 58 72 | 1101110111111001111· · · 1011111111101111001111· · · |
| | KANJI | 亜 ⋮ 運 | 14,397 5,392 | 382 436 | 1,249 4,531 | 1101110111111001111· · · 1011111111101111001111· · · |
| | NON-STANDARD CHARACTER | NON-STANDARD CHARACTER 1 ⋮ | 14,397 5,392 | 382 436 | 6,731 6,940 | 1101110111111001111· · · 1011111111101111001111· · · |
| | CONSECUTIVE CHARACTERS | CONSECUTIVE CHARACTERS 1 ⋮ CONSECUTIVE CHARACTERS 256 | 1,238 635 | 230 157 | 1,235 2,045 | 1011000110110011011011· · ·0110111001 1000101111000101010011· · ·0110111001 |

| NUMERAL/ CHARACTER | APPEARANCE FREQUENCY | COMPRESSION CODE |
|---|---|---|
| 0 | 1/16(0.0625)+0.00012 | [0000] |
| 1 | 〃 +0.00011 | [0001] |
| 2 | 〃 +0.00010 | [0010] |
| 3 | 〃 +0.00009 | [0011] |
| 4 | 〃 +0.00008 | [0100] |
| 5 | 〃 +0.00007 | [0101] |
| 6 | 〃 +0.00006 | [0110] |
| 7 | 〃 +0.00005 | [0111] |
| 8 | 〃 +0.00004 | [1000] |
| 9 | 〃 +0.00003 | [1001] |
| DECIMAL POINT (.) | 〃 +0.00002 | [1010] |
| FEEDER | 〃 +0.00001 | [1011] |
| OTHERS | | [1100] AND SUBSEQUENT CODE |

FIG.13

| NUMERAL/ CHARACTER | APPEARANCE FREQUENCY | COMPRESSION CODE |
|---|---|---|
| 0 | 1/32(0.03125)+0.000012 | [00000] |
| 1 | 〃 +0.000011 | [00001] |
| 2 | 〃 +0.000010 | [00010] |
| 3 | 〃 +0.000009 | [00011] |
| 4 | 〃 +0.000008 | [00100] |
| 5 | 〃 +0.000007 | [00101] |
| 6 | 〃 +0.000006 | [00110] |
| 7 | 〃 +0.000005 | [00111] |
| 8 | 〃 +0.000004 | [01000] |
| 9 | 〃 +0.000003 | [01001] |
| DECIMAL POINT (.) | 〃 +0.000002 | [01010] |
| FEEDER | 〃 +0.000001 | [01011] |
| OTHERS | | [01100] AND SUBSEQUENT CODE |

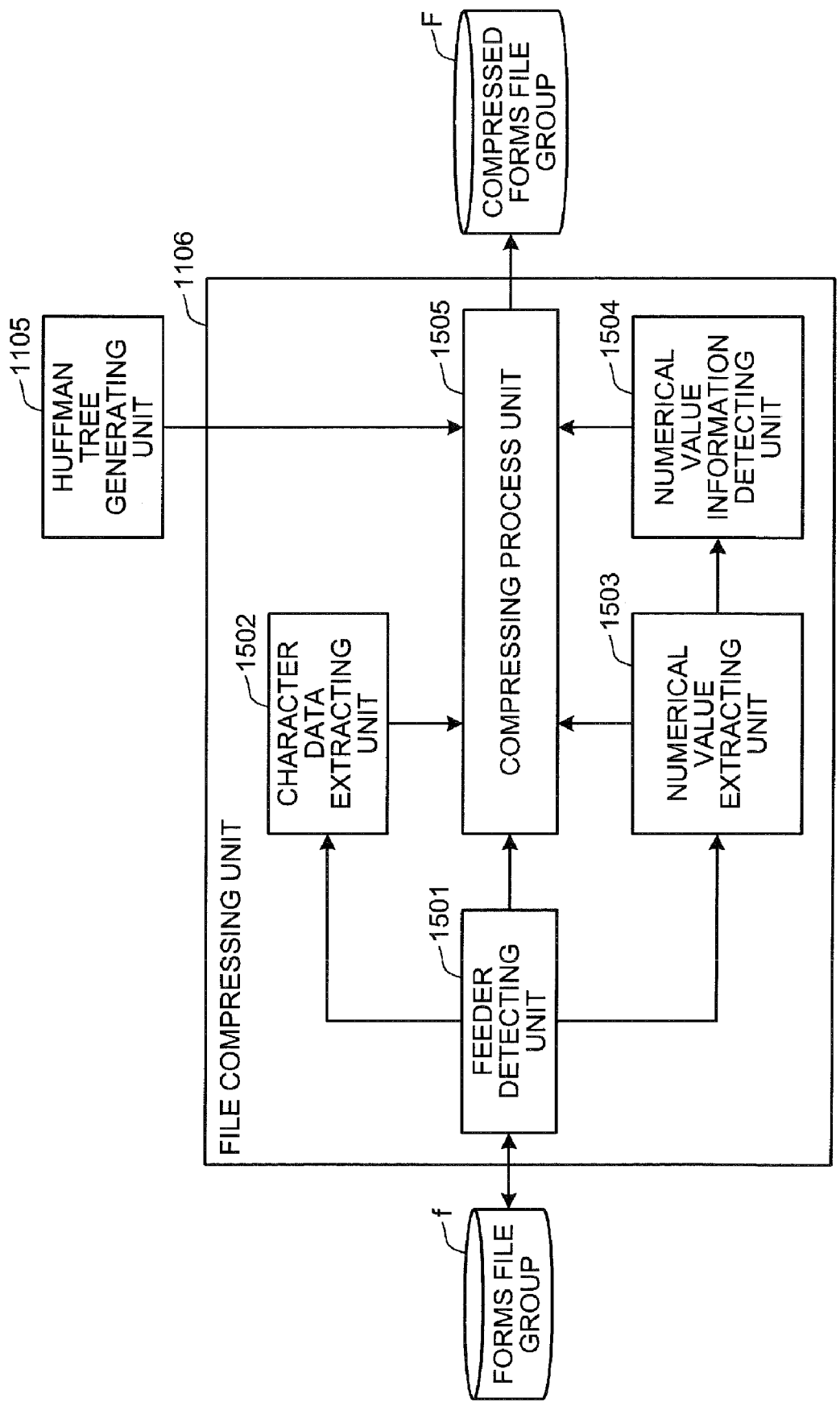

FIG.17B

| COMPRESSED BLOCK DATA | | | ORIGINAL UNCOMPRESSED BLOCK DATA | | |
|---|---|---|---|---|---|
| | OFFSET | LENGTH | OFFSET | NUMBER OF CHARACTERS | LENGTH |
| C1 | 100 | 1780 | 0 | 4000 | 3575 |
| C2 | 1880 | 1695 | 3575 | 4000 | 3275 |
| . | . | . | . | . | . |
| . | . | . | . | . | . |
| . | . | . | . | . | . |
| . | . | . | . | . | . |
| Cm | 16420 | 160 | 32770 | 352 | 320 |

FIG.22

| RETRIEVAL KEYWORD "出金伝票" | FILE NUMBER i OF FORMS FILE fi | | | |
|---|---|---|---|---|
| | 0 | 1 | 2 | 3 |
| FLAG ROW INDICATIVE OF PRESENCE/ABSENCE OF "出" | 1 | 1 | 0 | 0 |
| FLAG ROW INDICATIVE OF PRESENCE/ABSENCE OF "金" | 0 | 1 | 1 | 0 |
| FLAG ROW INDICATIVE OF PRESENCE/ABSENCE OF "伝" | 0 | 1 | 1 | 0 |
| FLAG ROW INDICATIVE OF PRESENCE/ABSENCE OF "票" | 0 | 1 | 0 | 0 |
| NARROWED DOWN RESULT | 0 | 1 | 0 | 0 |

FIG.24

| LENGTH OF COMPRESSED KEYWORD (BIT) | CHECK INTERVAL (BYTE) | CHECK DETERMINATION (BIT) | NOTE |
|---|---|---|---|
| 64 ~ | 7 | 8 | |
| 56 ~ 63 | 6 | 8 | |
| 48 ~ 55 | 5 | 8 | |
| 40 ~ 47 | 4 | 8 | |
| 32 ~ 39 | 3 | 8 | |
| 24 ~ 31 | 2 | 8 | |
| 16 ~ 23 | 1 | 8 | |
| 11 ~ 15 | 1 | 3 ~ 7 | ADJUST LAST BITS |
| 01 ~ 10 | - | - | NO EXECUTION OF NO-MATCHING CHECK IN COMPRESSED FORM BUT EXECUTE CHARACTER STRING CHECK AFTER DECOMPRESSION |

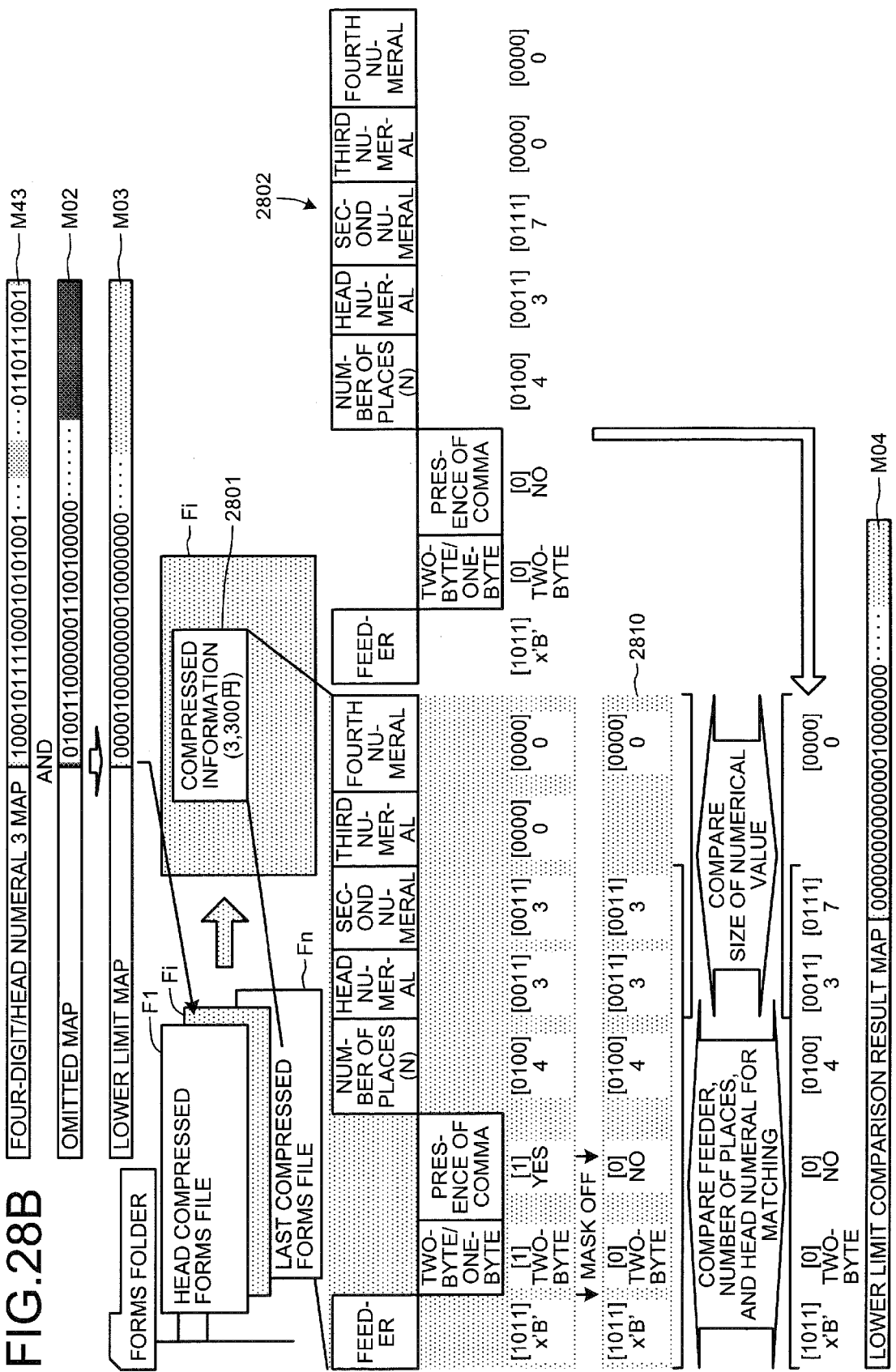

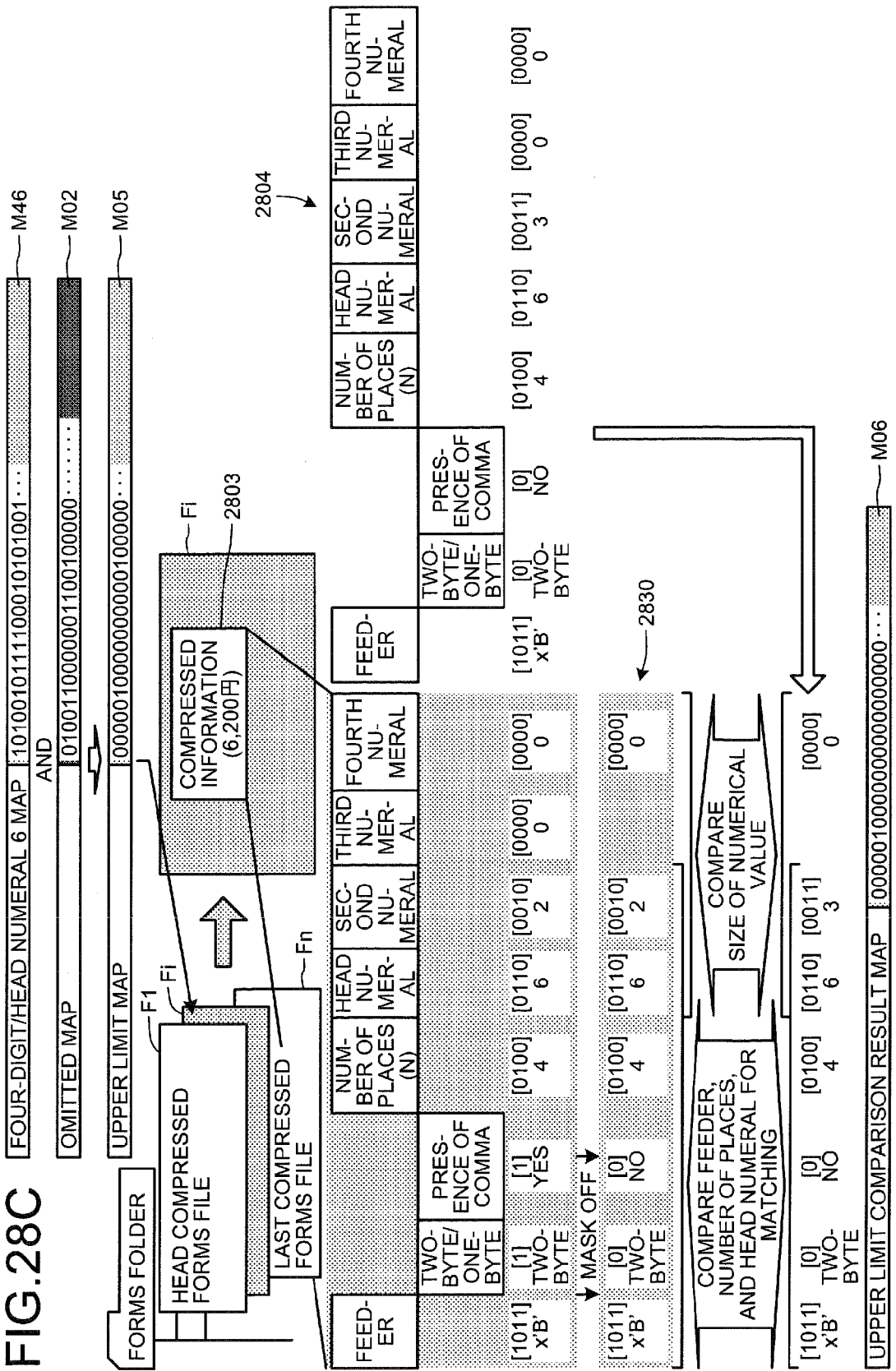

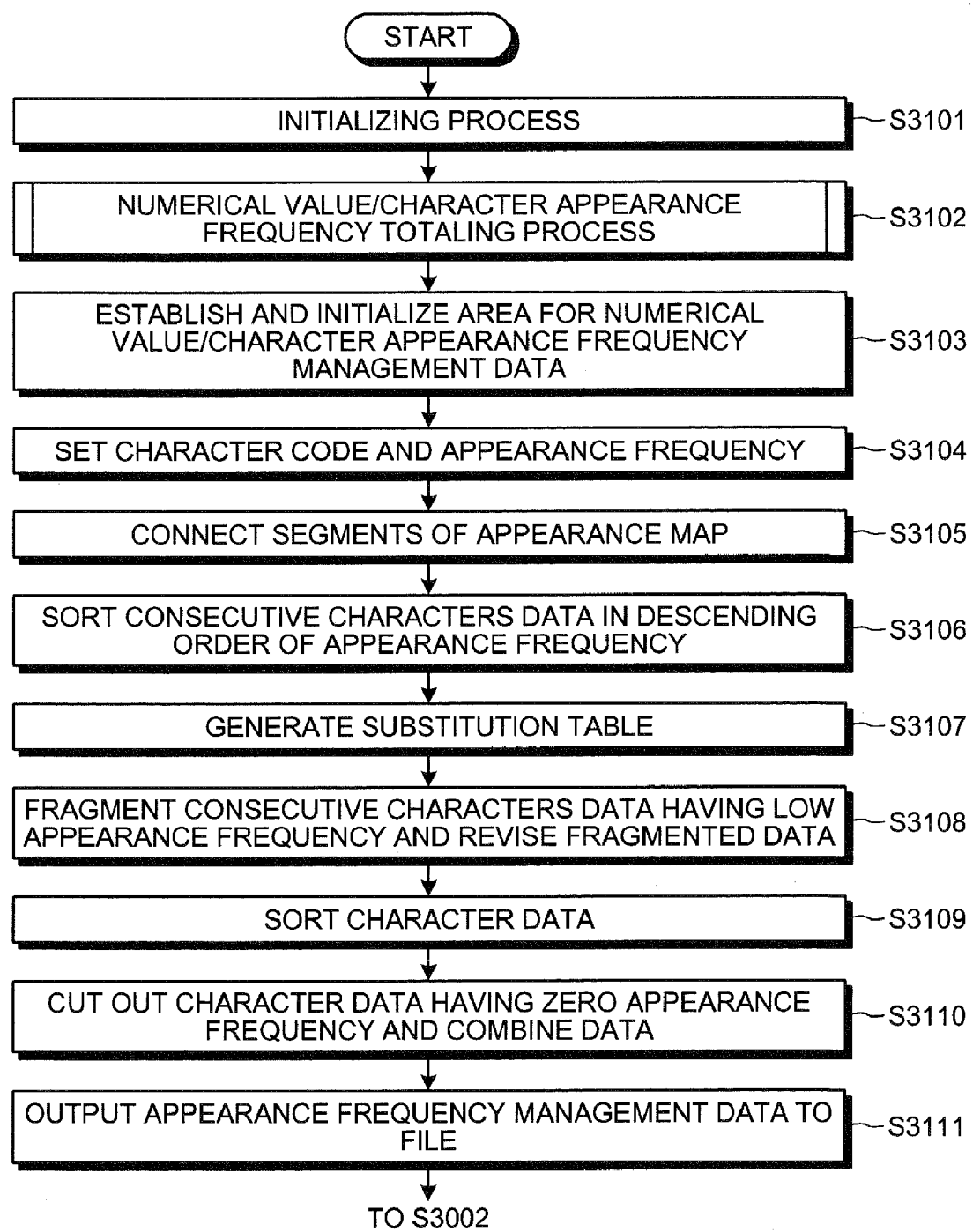

INFORMATION RETRIEVAL METHOD, INFORMATION RETRIEVAL APPARATUS, AND COMPUTER PRODUCT

This application is a U.S. Continuation Application of International Application No. PCT/JP2006/320827, filed Oct. 19, 2006.

FIELD

The embodiments discussed herein are related to a technique of increasing the speed of numerical value matching retrieval, numerical value range retrieval, and numerical value abstracted retrieval with respect to numerical value data.

BACKGROUND

In conventional full text retrieval, an index is made for character strings to execute high-speed retrieval; however, no index is made for numerical values. Further, although comparison for matching numerical character strings is performed, comparison for matching numerical values is not. For example, different numerical expressions such as a string including two-byte numerals "6850円" and a string including one-byte numerals "¥6,850" are determined to be "not matching" when compared as numerical character strings notwithstanding the fact that both express an identical numerical value.

The Electronic Ledger Storage Law stipulates that a forms system must have a retrieval function suitable for designation of a numerical range, such as that, for example, disclosed in Japanese Laid-Open Patent Application Publication No. H3-19081. Electronic ledgers are conventionally stored in a compressed/encoded form for data volume reduction and security.

Thus, in numerical value retrieval with respect to stored electronic ledgers, a file of each ledger is decompressed and decoded, and is compared in size with each numerical value of the data. This process requires enormous hardware resources and extensive processing time. Relevant full text retrieval methods are classified into the following three types, the respective speeds of numerical retrieval for which cannot be improved.

Advanced-index, full-text retrieval: In full text retrieval with respect to the Internet, an advanced index is used to increase retrieval speed. However, numerical value retrieval requires an index of an even greater size, and is, therefore, not improved in terms of retrieval speed with this retrieval method.

Simplified-index, full-text retrieval: This retrieval method increases the speed of full text retrieval using a simplified index, such as a character composition table for kanji; however, the speed of numerical value retrieval does not increase.

Indexless full-text retrieval: This method involves performing character string checks with respect to all data using a high-speed retrieval engine, but does not increase the speed of numerical value retrieval.

However, with the numerical value matching retrieval according to the conventional techniques above, faster retrieval speeds cannot be achieved for matching retrieval with respect to noncompressed/nonencoded numerical values, which leads to extremely time-consuming numerical value matching retrieval. In addition, the conventional numerical value matching retrieval does not determine different numerical expressions such as "6850円" and "¥6,850" to be "matching", bringing about a need for faster matching retrieval using a simplified index and an improved method of determining "matching".

When numerical value matching retrieval is performed with respect to compressed/encoded numerical values according to conventional matching retrieval, electronic ledger data, etc., which has been compressed and encoded for storage and security, are subject to size comparison after decompression and decoding; thereby requiring a large amount of processing time. Therefore, a problem arises in that improving retrieval speed involves revision of decompression and decoding processes.

When numerical value range retrieval is performed with respect to noncompressed/nonencoded numerical values according to conventional matching retrieval, a problem arises in that faster retrieval involves using a simplified index, similar to the above case of "numerical value matching retrieval".

When numerical value range retrieval is performed with respect to compressed/encoded numerical values according to conventional range retrieval, a problem arises in that improving retrieval speed involves revision of decompression and decoding processes, similar the above case of "numerical value matching retrieval".

With no particular method found in the conventional technique, abstracted retrieval with respect to numerical values concerning clinical test data, etc., involves alteration of numerical value range retrieval mixed with human judgment and a combination of various retrievals. Hence, the establishment of a technique for data abstraction and improved retrieval speed are desirable.

SUMMARY

According to an aspect of an embodiment, a computer-readable recording medium stores therein an information retrieval program that causes a computer to execute acquiring a numerical value defining a boundary of a numerical value range; detecting a number of places in and a head numeral of the numerical value acquired at the acquiring; extracting from a group of bit strings indicating, according to file, whether numerical values in a numerical value group meeting a number of places and a head numeral are present in files subject to retrieval, a bit string indicating, according to file, whether a numerical value in a numerical value group having the number of places and the head numeral detected at the detecting is present in files subject to retrieval; specifying, among the files subject to retrieval, a file corresponding to a bit in the bit string extracted at the extracting, the bit indicating a presence of a numerical value of the numerical value group having the number of places and the head numeral detected at the detecting; determining whether an in-file numerical value included in the file specified at the specifying meets a boundary condition of the numerical value defining the boundary; and designating, as a file having a numerical value within the numerical value range, the file specified at the specifying, based on a determination result obtained at the determining.

BRIEF DESCRIPTION OF DRAWINGS

FIG. 5 is a diagram of appearance frequency management data;

FIG. 12 is a diagram of an example of revision of the appearance frequency of a numeral, etc.;

FIG. 13 is a diagram of another example of revision of the appearance frequency of a numeral, etc.;

FIG. 15 is a functional diagram of a file compressing unit depicted in FIG. 11;

FIG. 17B is a table of a comparison between the compressed block data C1 to Cm and the original block data before compression;

FIG. 22 is a diagram of an example of narrowing down compressed forms files to a compressed forms file Fi;

FIG. 24 is a table of shift operation of shifting compressed block data of FIG. 23;

FIGS. 28A to 28D are explanatory diagrams of examples of size comparison in a numerical value range;

FIG. 31 is a flowchart of the appearance frequency management data generating process (step S3001) of FIG. 30;

DESCRIPTION OF EMBODIMENT(S)

Preferred embodiments of the present invention will be explained with reference to the accompanying drawings.

Figure 1:
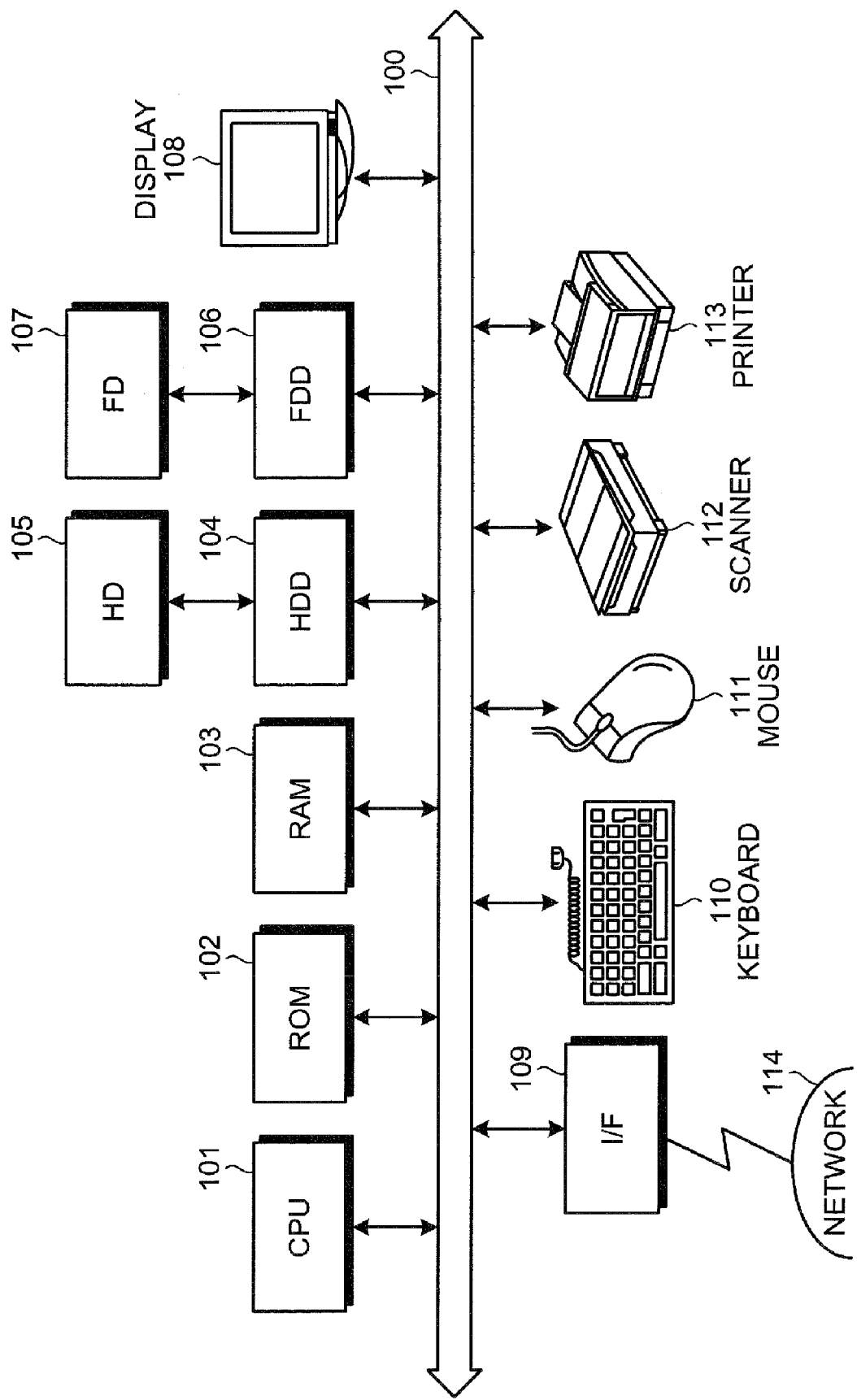
FIG. 1 is a block diagram of an information retrieval apparatus according to an embodiment.

FIG. 1 is a block diagram of an information retrieval apparatus according to an embodiment.

As depicted in FIG. 1, an information retrieval apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107, a display 108, an interface (I/F) 109, a keyboard 110, a mouse 111, a scanner 112, and a printer 113, connected to one another by way of a bus 100.

The CPU 101 governs overall control of the information retrieval apparatus. The ROM 102 stores therein programs such as a boot program. The RAM 103 is used as a work area of the CPU 101. The HDD 104, under the control of the CPU 101, controls the reading and writing of data with respect to the HD 105. The HD 105 stores therein the data written under control of the HDD 104.

The FDD 106, under the control of the CPU 101, controls the reading and writing of data with respect to the FD 107. The FD 107 stores therein the data written under control of the FDD 106, the data being read by the information retrieval apparatus.

In addition to the FD 107, a compact disc-read-only memory (CD-ROM) (compact disc-recordable (CD-R), compact disc-rewritable (CD-RW)), magneto optical disk (MO) digital versatile disk (DVD), a memory card, etc. may be adopted as a removable recording medium. The display 108 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 108.

The I/F 109 is connected to a network 114 such as the Internet through a communication line and is connected to other apparatuses through the network 114. The I/F 109 administers an internal interface with the network 114 and controls the input/output of data from/to external apparatuses. For example, a modem or a LAN adaptor may be employed as the I/F 109.

The keyboard 110 includes, for example, keys for inputting letters, numerals, and various instructions and performs the input of data. Alternatively, a touch panel-type input pad or numeric keypad, etc. may be adopted. The mouse 111 performs the movement of the cursor, selection of a region, or movement and size change of windows. A track ball or a joy stick may be adopted provided each respectively has a function similar to a pointing device.

The scanner 112 optically reads an image and takes in the image data into the information retrieval apparatus. The scanner 112 may have an optical character recognition (OCR) function as well. The printer 113 prints image data and text data. The printer 113 may be, for example, a laser printer or an ink jet printer.

Figure 2:
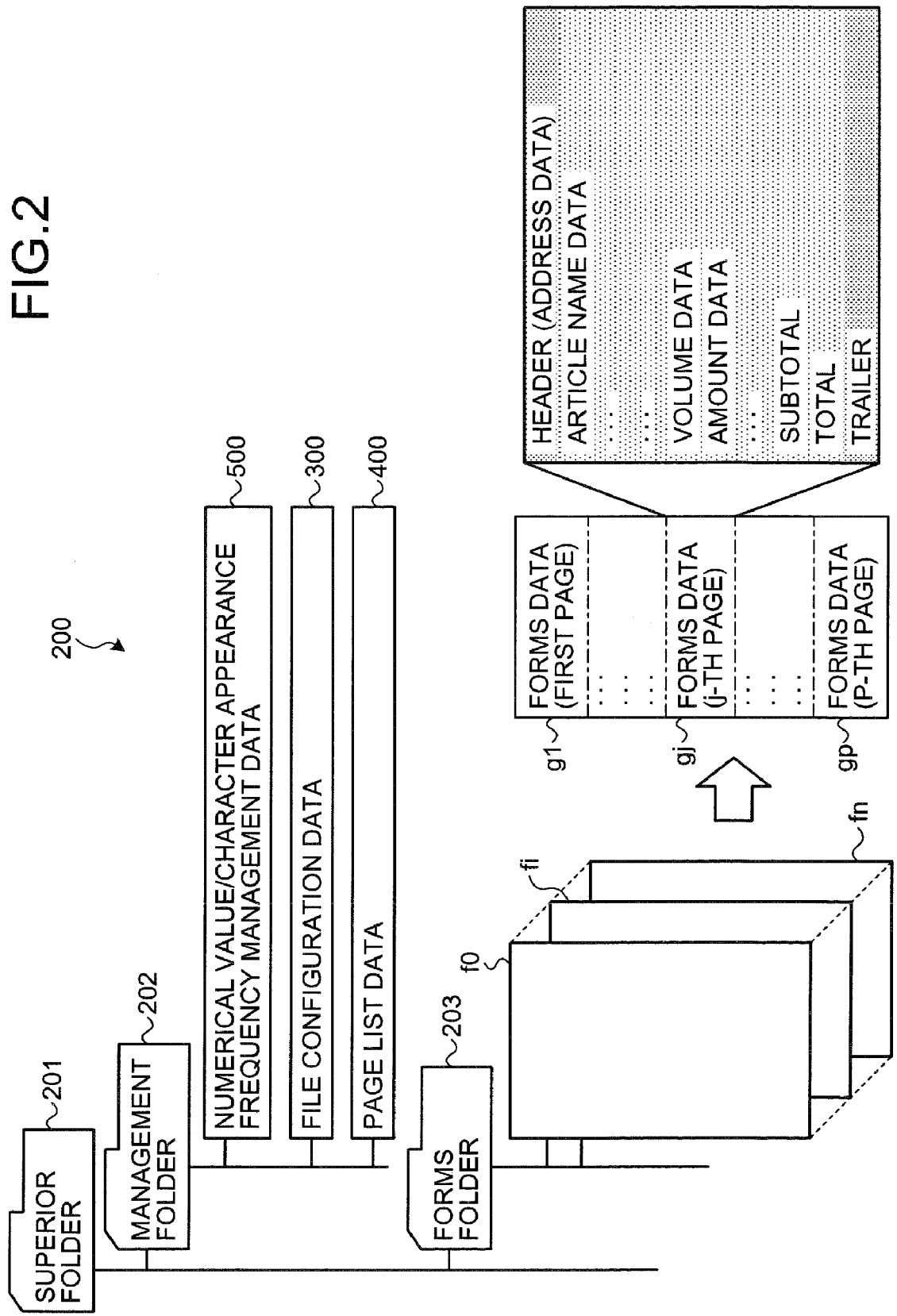
FIG. 2 is a diagram of a data configuration of electronic forms.

FIG. 2 is a diagram of a data configuration of electronic forms. In the present specification, the electronic forms depicted in FIG. 2 represent ledgers and forms converted into electronic data. Contents 200 of the electronic forms are saved in a superior folder 201, which includes subordinate folders consisting of a management folder 202 and a forms folder 203.

The management folder 202 stores therein file configuration data 300 (see FIG. 3), page list data 400 (see FIG. 4), and appearance frequency management data 500 (see FIG. 5). The forms folder 203 stores therein a forms file group f including forms files fi (i=0 to n).

The forms files fi have forms data gj (j=1 to P) where the forms files f0 to fn collectively have P pages of forms data gj in total. The forms data gj is formatted in, for example, the HyperText Markup Language (HTML) format or the Extensible Markup Language (XML) format, and includes various item data, such as a header segment (address data) including an anchor and a headword, article name data, quantity data, amount data, a subtotal segment, a total segment, and a trailer segment.

Figure 3:
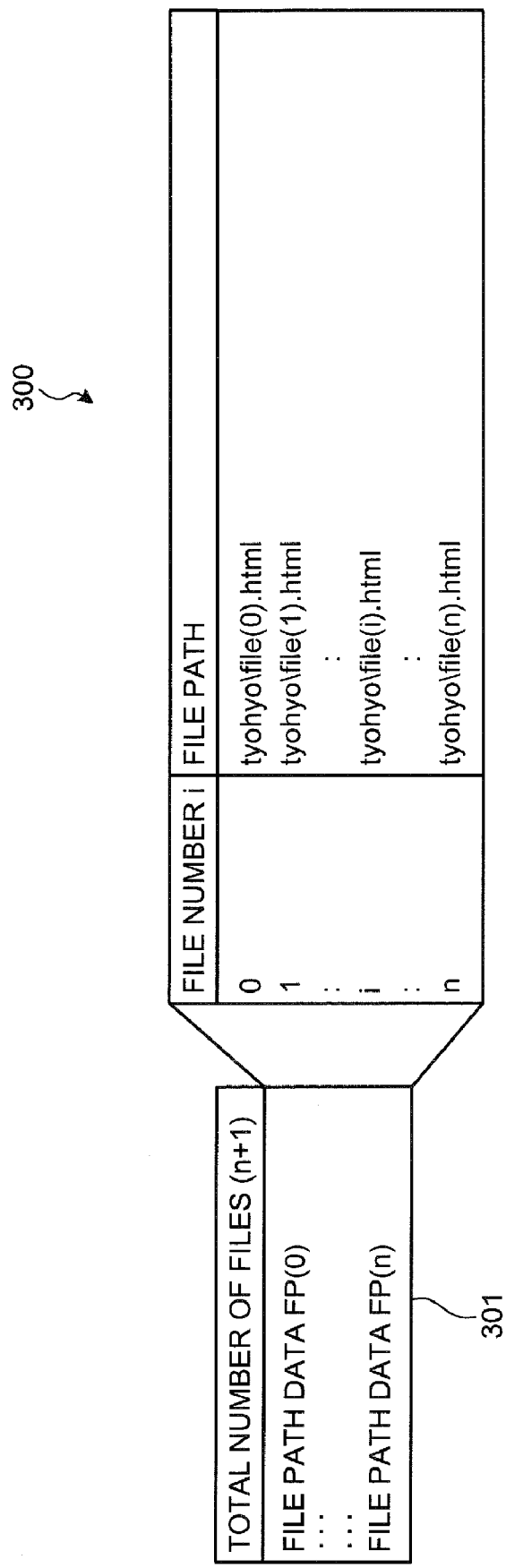
FIG. 3 is a diagram of file configuration data depicted in FIG. 2.

FIG. 3 is a diagram of the file configuration data 300 depicted in FIG. 2. The file configuration data 300 is data correlating a file path for each of the forms files f0 to fn for each file number i (i=0 to n). In FIG. 3, a forms file fi having a file number i is expressed as "file(i).html".

Figure 4:
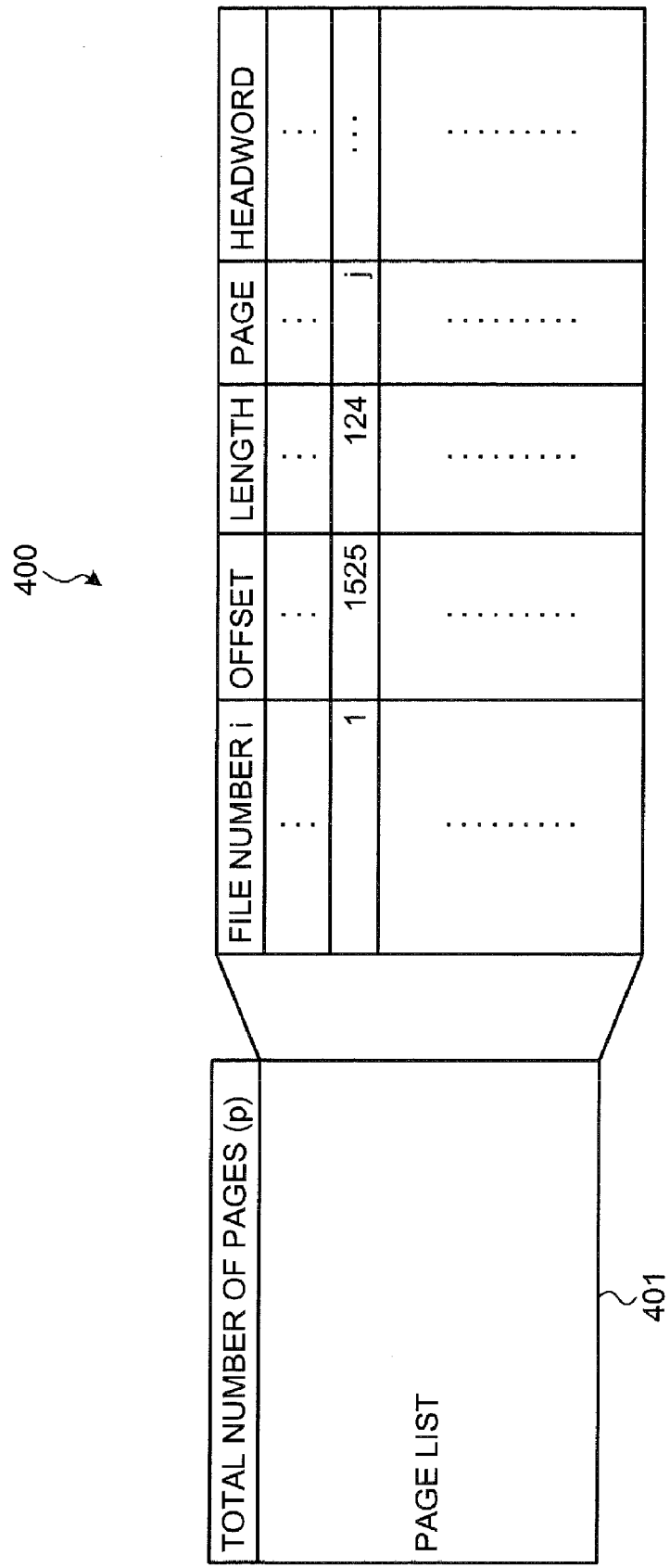
FIG. 4 is a diagram of page list data depicted in FIG. 2.

FIG. 4 is a diagram of the page list data 400 depicted in FIG. 2. The page list data 400 is data correlating the forms files fi, the forms data gj, and the file configuration data 300 depicted in FIG. 2. The page list data 400 includes the total number of forms files fi (n+1) a block size (m byte), the total number of forms data gj (P), file path data FP(0) to FP(n) for the forms files fi, and a page list.

The page list data 400 further includes a file number i, the number of blocks, and a file path as depicted in FIG. 3 for each file path data FP(i). The page list 401 is a list in which offset, length, a page number j, and a headword are described for each file number i.

FIG. 5 is a diagram of the appearance frequency management data 500. As depicted in FIG. 5, the appearance frequency management data 500 is data for management of the appearance frequency of numerical value/character data. Numerical value/character data is classified into numerical value data and character data. Numerical value data is data including numerals of 0 to 9, consecutive numerals consisting of a series of two or more numerals, such as 00 to 99, numerical value groups each consisting of numerical values having the same number of places (digits) and the same head numeral, and abstracted numerical value data of which numerical values give abstractive expressions, such as slightly high blood pressure.

A numerical value group is a group of numerical values within a numerical value range defined by the number of places and a head numeral. For example, a numerical value group defined by the number of places of three and a headword of 2 is a group of numerical values within a numerical value range of 200 to 299.

Character data is data including English characters, kana, kanji, and consecutive characters. Specifically, character data include English characters, katakana, and symbols based on an 8-bit character-encoding scheme (ASCII); English characters, katakana, and symbols based on a 16-bit character-encoding scheme (JIS); and kana and kanji based on the 16-bit character-encoding scheme (JIS). In the present specification, these character data of phonogram and kanji centering around 8-bit code data, such as English characters, kana, and katakana, are referred to as "standard character data".

Character data also includes non-standard characters and consecutive characters, in addition to the standard character data. Consecutive characters represent character data of a string of two or more characters. For example, when two kanas each notated by a 16-bit code make up consecutive characters, the consecutive characters represent character data notated by a 32-bit code. Binary data of an address pointer, etc., is also included in the above "character data" for convenience, although such binary data is non-character data. Hereinafter, binary data is included in "character data" in terminology unless a specific notation is made.

The appearance frequency management data 500 includes the appearance frequency, the number of appearance files (or number of blocks), an appearance rank, and appearance maps 510 (501 to 509) of numerical value/character data. The appearance frequency is the frequency (number of times) at which numerical value/character data appears in the forms files f0 to fn collectively. The number of appearance files is the number of forms files in which numerical value/character data appears among all the forms files f0 to fn. An appearance rank is a position in a ranking of appearance frequencies.

The appearance maps 510 are strings of bits, each string consisting of n+1 bits arranged in the order of the forms files fi, and each bit indicating the presence/absence of numerical value/character data. In FIG. 5, the bit at the left end corresponds to the forms file f0 while the bit at the right end corresponds to the forms file fn.

For each bit, "1" indicates ON while "0" indicates OFF. Specifically, when a bit corresponding to a forms file fi is "1" on the appearance maps 510 for a certain numerical value/character data, it means that the numerical value/character data is present in the forms file fi. When the bit corresponding to the forms file fi is "0", it means that the numerical value/character data is not present in the forms file fi.

Figure 6:
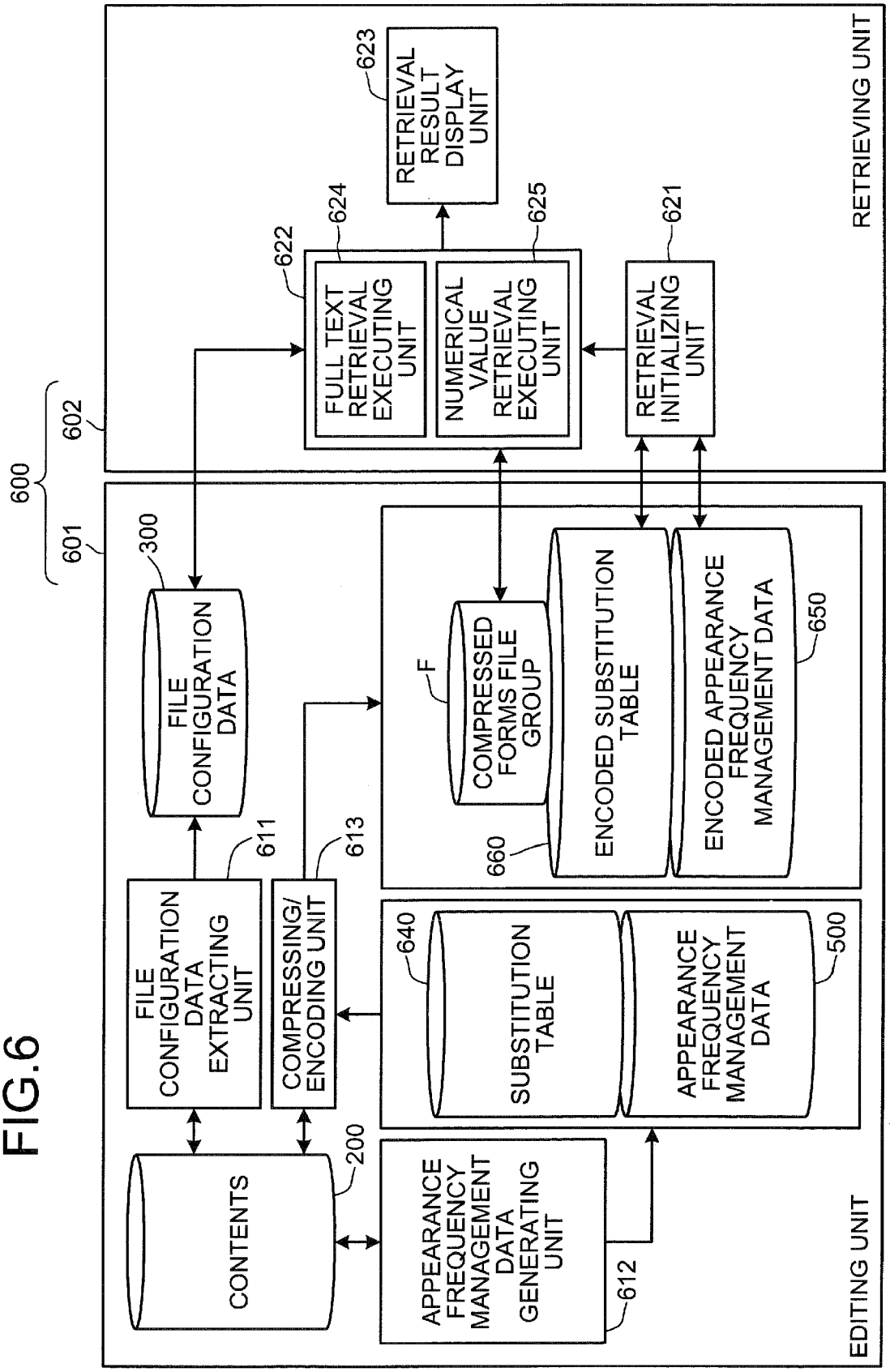
FIG. 6 is a functional diagram of an information retrieval apparatus according to an embodiment.

FIG. 6 is a functional diagram of an information retrieval apparatus according to an embodiment. As depicted in FIG. 6, an information retrieval apparatus 600 includes an editing unit 601 and a retrieving unit 602.

The editing unit 601 includes a file configuration data extracting unit 611, an appearance frequency management data generating unit 612, and a compressing/encoding unit 613. Although files of forms are an example of a subject to be retrieved, data other than that of forms may be the subject of retrieval provided the data includes numerical value data.

The file configuration data extracting unit 611 refers to the file configuration data depicted in FIG. 3 and extracts the page list data 400 depicted in FIG. 4 from the forms files f0 to fn. The appearance frequency management data generating unit 612 generates the appearance frequency management data 500 from the forms files f0 to fn, and further generates a substitution table 640 for substituting consecutive numerals or consecutive characters written in multiple forms files f0 to fn with a non-standard character. Hereinafter, consecutive numerals and consecutive characters are collectively referred to as "consecutive character data".

The compressing/encoding unit 613 compresses the forms files f0 to fn to generate a compressed forms file group F, and encodes the appearance frequency management data 500 and the substitution table 640 to generate encoded appearance frequency management data 650 and an encoded substitution table 660.

The retrieving unit 602 includes a retrieval initializing unit 621, a retrieval executing unit 622, and a retrieval result display unit 623. The retrieval initializing unit 621 decodes the encoded appearance frequency management data 650 and the encoded substitution table 660 to initialize the retrieval performed by the retrieving unit 602.

The retrieval executing unit 622 executes retrieval processing using the appearance frequency management data 500 and the substitution table 640 to generate a retrieval candidate list. Specifically, the retrieval executing unit 622 includes a full text retrieval executing unit 624 that executes full text retrieval and a numerical value retrieval executing unit 625 that executes numerical value retrieval.

The full text retrieval executing unit 624 receives input of a retrieval keyword and executes full text retrieval with respect to compressed forms files to generate a retrieval candidate list displaying the forms file(s) fi corresponding to the retrieval keyword.

The numerical value retrieval executing unit 625 receives input of a numerical value or a numerical value range and executes numerical value retrieval with respect to the compressed forms file group F to generate a retrieval candidate list displaying the forms file(s) fi corresponding to the input numerical value or numerical value range.

The retrieval result display unit 623 decompresses a retrieval candidate selected by a user from among the retrieval candidates given by the retrieval executing unit 622, and displays the decompressed retrieval candidate as a retrieval result. Respective functions of the forms files, the appearance frequency management data 500, the file configuration data 300, the page list data 400, the substitution table 640, the compressed forms file group F, the encoded appearance frequency management data 650, and the encoded substitution table 660 as described are implemented, for example, through recording media, such as the ROM 102, RAM 103, and HD 105 depicted in FIG. 1.

Respective functions of the editing unit 601 (including internal functional configuration) and the retrieving unit 602 (including internal functional configuration) are implemented, for example, when the CPU 101 executes a program recorded on a recording medium, such as the ROM 102, RAM 103, and HD 105 depicted in FIG. 1.

Figure 7:
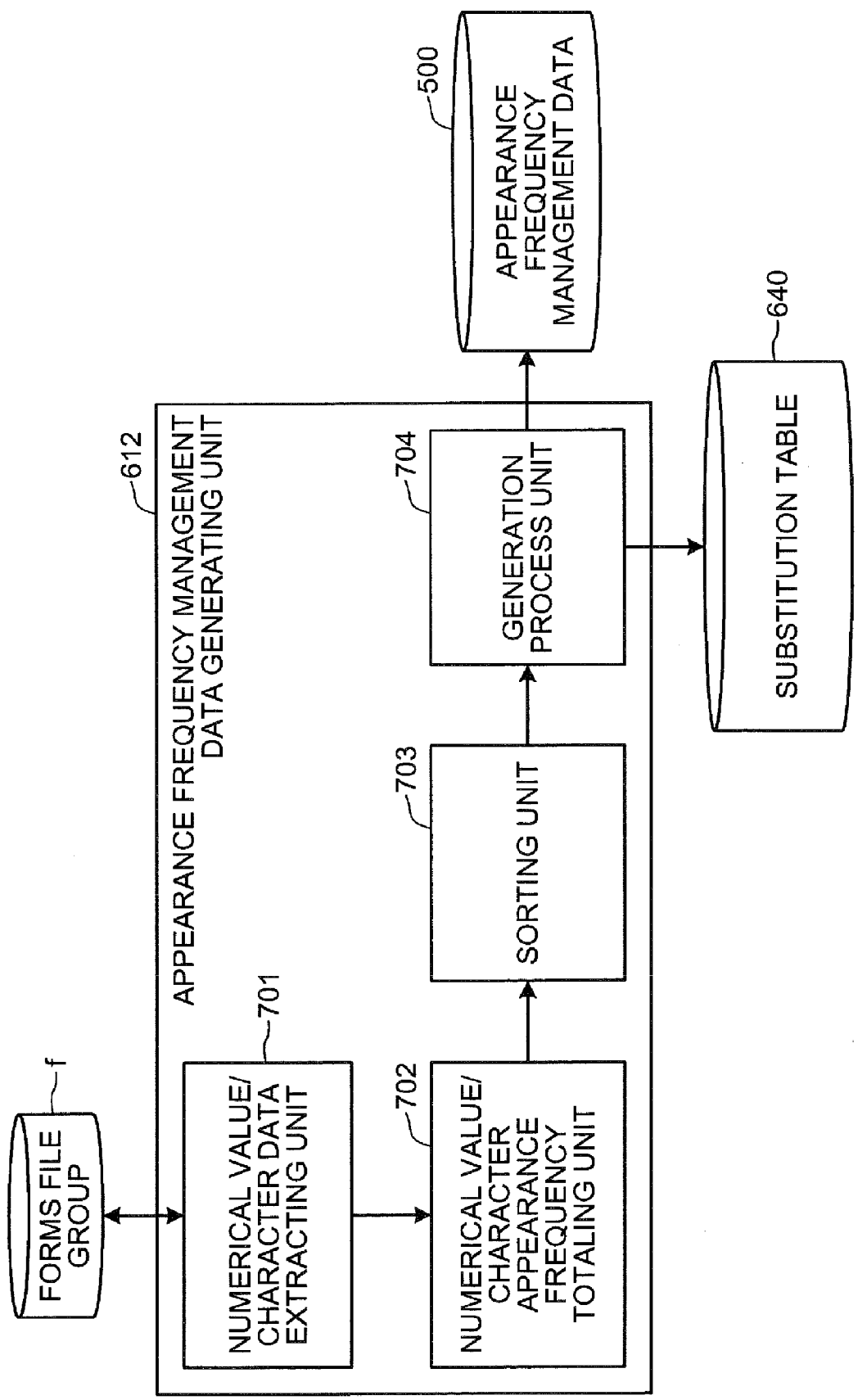
FIG. 7 is a functional diagram of an appearance frequency management data generating unit depicted in FIG. 6.

FIG. 7 is a functional diagram of the appearance frequency management data generating unit 612 depicted in FIG. 6. As depicted in FIG. 7, the appearance frequency management data generating unit 612 includes a numerical value/character data extracting unit 701, a numerical value/character appearance frequency totaling unit 702, a sorting unit 703, and a generation process unit 704.

The numerical value/character data extracting unit 701 extracts numerical/character data sequentially from forms files. The numerical value/character appearance frequency totaling unit 702 totals the respective frequencies at which the numerical/character data extracted by the numerical value/character data extracting unit 701 appears in the forms files fi, and detects the presence/absence of the numerical/character data in each of the forms files f0 to fn.

The sorting unit 703 sorts the numerical value/character data according to appearance frequency. The generating process unit 704 generates the appearance frequency management data 500, using the appearance frequencies of the sorted numerical/character data and the appearance maps 501 to 509 indicative of the result of presence/absence detection for each of numerical/character data. The generating process unit 704 also generates the substitution table 640. A process of generating the appearance frequency management data 500 and the substitution table 640 by the appearance frequency management data generating unit 612 will be described in detail.

Figure 8:
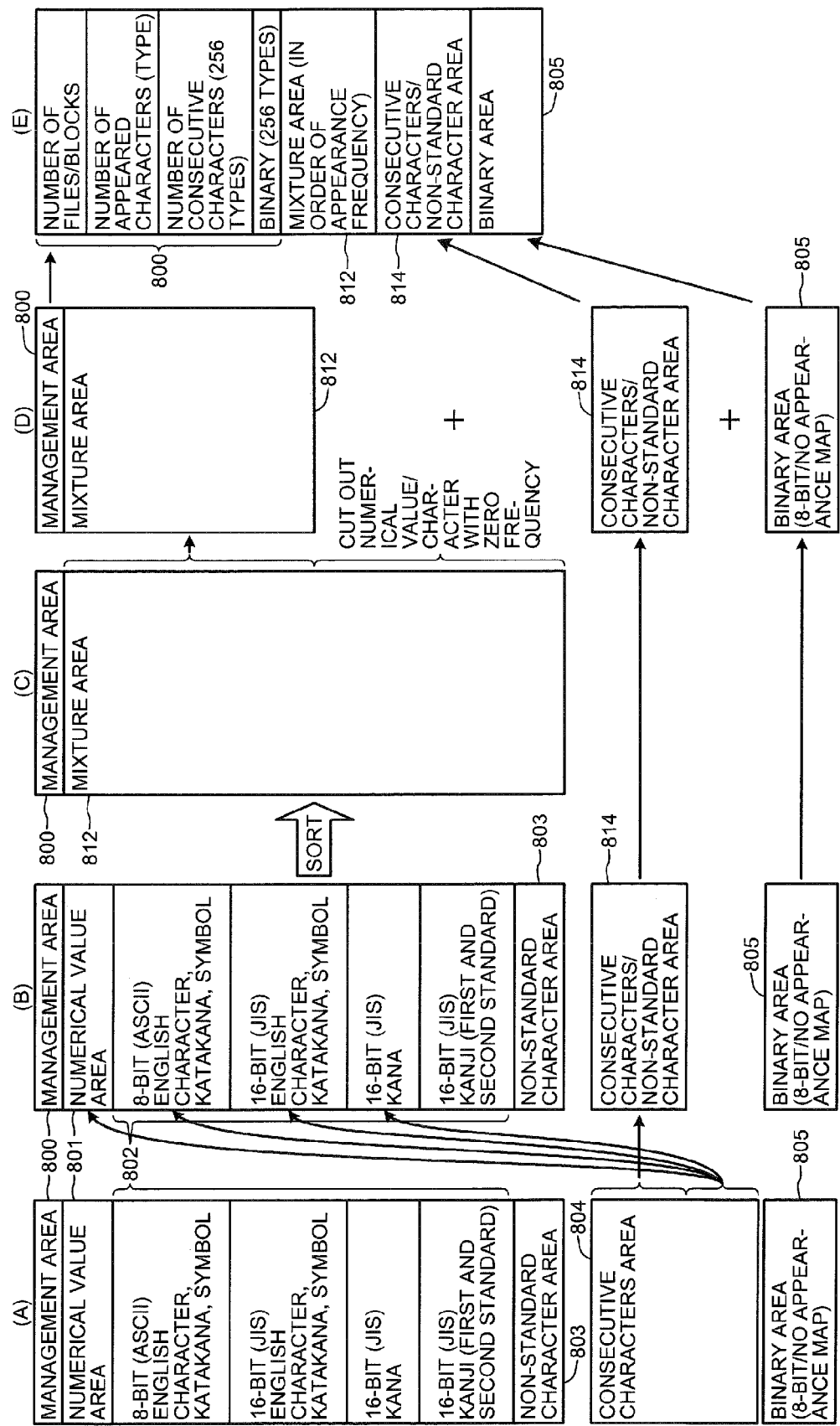
FIG. 8 is a schematic of a process of generating the appearance frequency management data.

FIG. 8 is a schematic of the process of generating the appearance frequency management data 500. Section A in FIG. 8 depicts a data configuration of the appearance frequency management data 500 that results when the numerical value/character appearance frequency totaling unit 702 totals numerical value/character data. Section B in FIG. 8 depicts a data configuration of the appearance frequency management data 500 that results after consecutive characters/non-standard character substitution processing. Section C in FIG. 8 depicts a data configuration of the appearance frequency management data 500 that results after mixture data including standard character data and non-standard character data are sorted. Section D in FIG. 8 depicts a data configuration of the appearance frequency management data 500 that results after mixture data with a low appearance frequency is cut out. Section E in FIG. 8 depicts a data configuration of the appearance frequency management data 500 generated ultimately.

In section A of FIG. 8, reference numeral 800 denotes a management area of the appearance frequency management data 500. Reference numeral 801 denotes a numerical value area in which the appearance frequency, the number of appearance files, the appearance rank, and an appearance map of numerical data (not including consecutive numerals) are stored. Reference numeral 802 denotes a standard character area in which the appearance frequency, the number of appearance files, the appearance rank, and an appearance map of standard character data are stored, the standard character data including English characters, katakana, and symbols based on an 8-bit character-encoding scheme (ASCII), English characters, katakana, and symbols based on a 16-bit character-encoding scheme (JIS), and kana and kanji based on the 16-bit character-encoding scheme (JIS).

Reference numeral 803 denotes a non-standard character area in which the appearance frequency, the number of appearance files, the appearance rank, and an appearance map of non-standard character data are stored. Reference numeral 804 denotes a consecutive characters area in which the appearance frequency, the number of appearance files, the appearance rank, and an appearance map of consecutive characters data are stored. Reference numeral 805 denotes a binary area in which the appearance frequency, the number of appearance files, and the appearance rank of 8-bit binary data are stored.

In the data configuration depicted in section A of FIG. 8, consecutive characters data in the consecutive characters area 804 are sorted in the order of appearance frequency. Consecutive characters data having a given appearance frequency or higher is substituted with non-standard character data that do not coincide with existing non-standard character data (hereinafter, "consecutive characters/non-standard character data"). In this manner, consecutive characters data consisting of a string of characters with a high appearance frequency are replaced with non-standard character data, which is single character data; thereby reducing data volume and thus improving compression efficiency. Consecutive characters data having an appearance frequency lower than the given appearance frequency is consecutive characters data that does not appear frequently. Such consecutive characters data is, therefore, fragmented into single character data, which are allocated to corresponding areas. As a result, the data configuration of the appearance frequency management data 500 depicted in section A of FIG. 8 becomes the data configuration depicted in section (B) resulting after the consecutive characters/non-standard character substitution processing.

In the data configuration depicted in section B of FIG. 8, data in the numerical value area 801, standard character data in the standard character area 802, and non-standard character data in the non-standard character area 803 are mixed, and are sorted in descending order of appearance frequency, which results in the data configuration depicted in section C. In the data configuration depicted in section C, consecutive characters/non-standard character data in the consecutive characters/non-standard character area 814 and binary data in the binary area 805 of section B are not subject to sorting.

In the data configuration depicted in section C, data having a low appearance frequency, such as data of zero appearance, is cut out from a mixture area 812 in which numerical value data, standard character data, and non-standard character data are present together. Cutting out low appearance frequency data results in the data configuration depicted in section D. In the data configuration depicted in section D, the management area 800 and the mixture area 812, the consecutive characters/non-standard character area 814, and the binary area 805 are combined together to ultimately generate the appearance frequency management data 500 having the data configuration depicted in section E.

In the appearance frequency management data 500, the management area 800 stores therein the number of files/blocks, the number of types of character data that appear (number of appeared character data (type)), the number of consecutive characters/non-standard character data (number of consecutive characters (256 types)), and the number of binary data (256 types).

In the appearance frequency management data 500 depicted in FIG. 5, with the exception of binary data, appearance frequencies and the appearance maps 510 are correlated with the numerical value/character data. The numerical value/character data is sorted in descending order of appearance frequency. In the appearance frequency management data 500 depicted in FIG. 5, the numerical value/character data and the appearance frequency thereof are encoded by an encoding algorithm of exclusive-OR (XOR), etc., using a prescribed master key, which will be described later.

Figure 9:
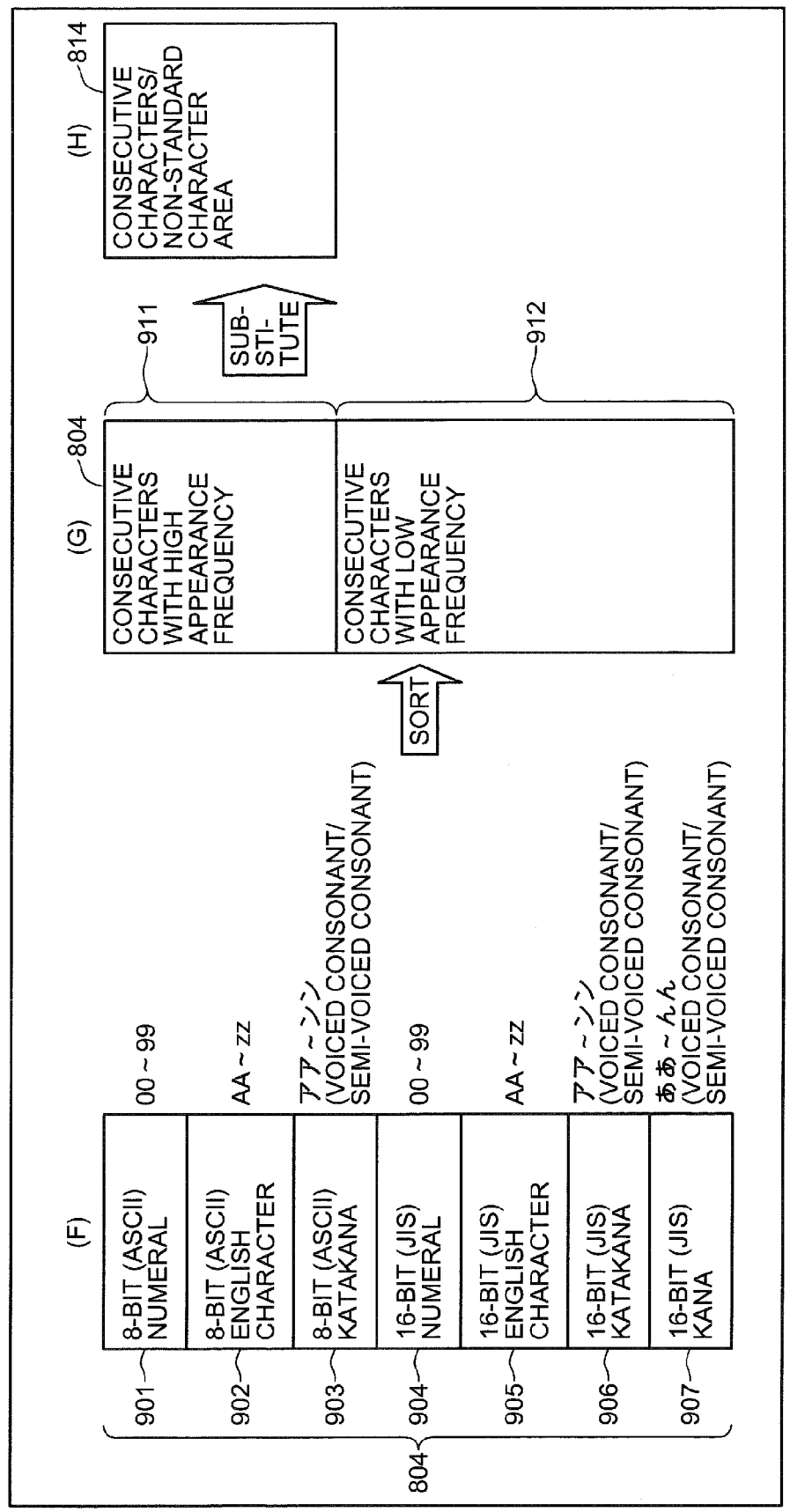
FIG. 9 is a schematic of consecutive characters/non-standard character substitution processing.

FIG. 9 is a schematic of consecutive characters/non-standard character substitution processing. In FIG. 9, section F depicts a data configuration of the consecutive characters area 804 of the appearance frequency management data 500 that results when consecutive characters data is totaled by the numerical value/character appearance frequency totaling unit 702. Section G depicts a data configuration of the consecutive characters area 804 that results after consecutive characters data is sorted. Section H depicts a data configuration that results after the substitution processing.

In the data configuration depicted in section F, the consecutive characters area 804 includes areas 901 to 907. The area 901 stores therein information concerning numerical string data ("00" to "99") in the 8-bit character-encoding scheme (ASCII) format; the information including the numerical string data, the appearance frequency, the number of appearance files, the appearance rank, and an appearance map.

The area 902 stores therein information concerning English character string data ("AA" to "zz") in the 8-bit character-encoding scheme (ASCII) format; the information including the English character string data, the appearance frequency, the number of appearance files, the appearance rank, and an appearance map. The area 903 stores therein information concerning katakana string data ("ｱﾞｱﾞ to ﾝﾟﾝﾟ", voiced consonant, semi-voiced consonant) in the 8-bit character-encoding scheme (ASCII) format; the information including the katakana string data, the appearance frequency, the number of appearance files, the appearance rank, and an appearance map.

The area 904 stores therein information concerning numerical string data ("00" to "99") in the 16-bit character-encoding scheme (JIS) format; the information including the numerical string data, the appearance frequency, the number of appearance files, the appearance rank, and an appearance map. The area 905 stores therein information concerning English character string data ("AA" to "zz") in the 16-bit character-encoding scheme (JIS) format; the information including the English character string data, the appearance frequency, the number of appearance files, the appearance rank, and an appearance map.

The area 906 stores therein information concerning katakana string data ("ｱﾞｱﾞ to ﾝﾟﾝﾟ", voiced consonant, semi-voiced consonant) in the 16-bit character-encoding scheme (JIS) format; the information including the katakana string data, the appearance frequency, the number of appearance files, the appearance rank, and an appearance map. The area 907 stores therein information concerning kana string data ("ああ to んん", voiced consonant, semi-voiced consonant) in the 16-bit character-encoding scheme (JIS) format; the information including the kana string data, the appearance frequency, the number of appearance files, the appearance rank, and an appearance map.

The data configuration depicted in section G of FIG. 9 is the result of sorting consecutive characters data making up the data configuration depicted in section F in descending order of appearance frequency. In the data configuration depicted in section G, an area 911 has information concerning consecutive characters data having a high appearance frequency, which is to be substituted with non-standard data. An area 912, on the other hand, has information concerning consecutive characters data having an appearance frequency that is lower than the given appearance frequency (low appearance frequency consecutive characters data). This low appearance frequency consecutive characters data is fragmented into single character data. Hence, the appearance frequency and the appearance maps 505 to 509 of character data are revised.

The data configuration depicted in section H of FIG. 9 is the result of substituting the high appearance frequency consecutive characters data in the data configuration depicted in section G with non-standard character data. The consecutive characters/non-standard character area 814 stores therein information concerning consecutive characters/non-standard character data resulting from the substitution; the information including the consecutive characters/non-standard character data, the appearance frequency, the number of appearance files, the appearance rank, and an appearance map.

Figure 10:
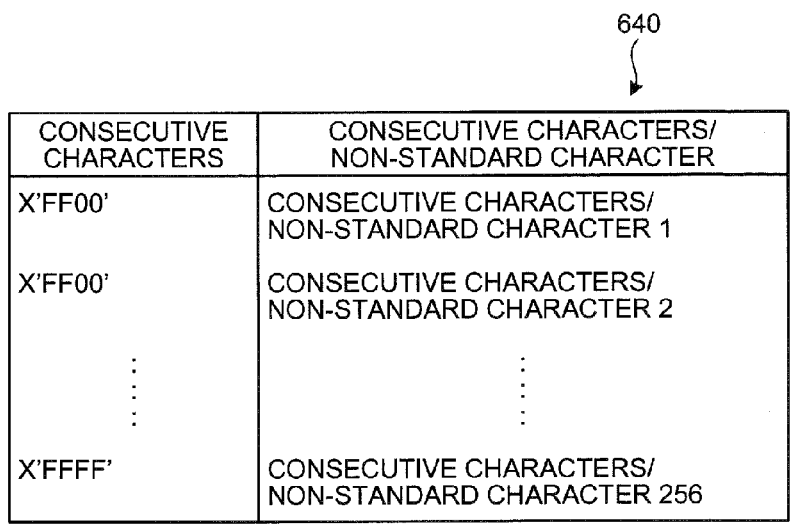
FIG. 10 is a diagram of a substitution table generated ultimately.

FIG. 10 is a diagram of the substitution table 640 generated ultimately. The substitution table 640 is generated by correlating the consecutive characters data in the area 911 of the data configuration depicted in section G of FIG. 9 and the consecutive characters/non-standard character data in the area 814 of the data configuration depicted in section H of FIG. 9.

Figure 11:
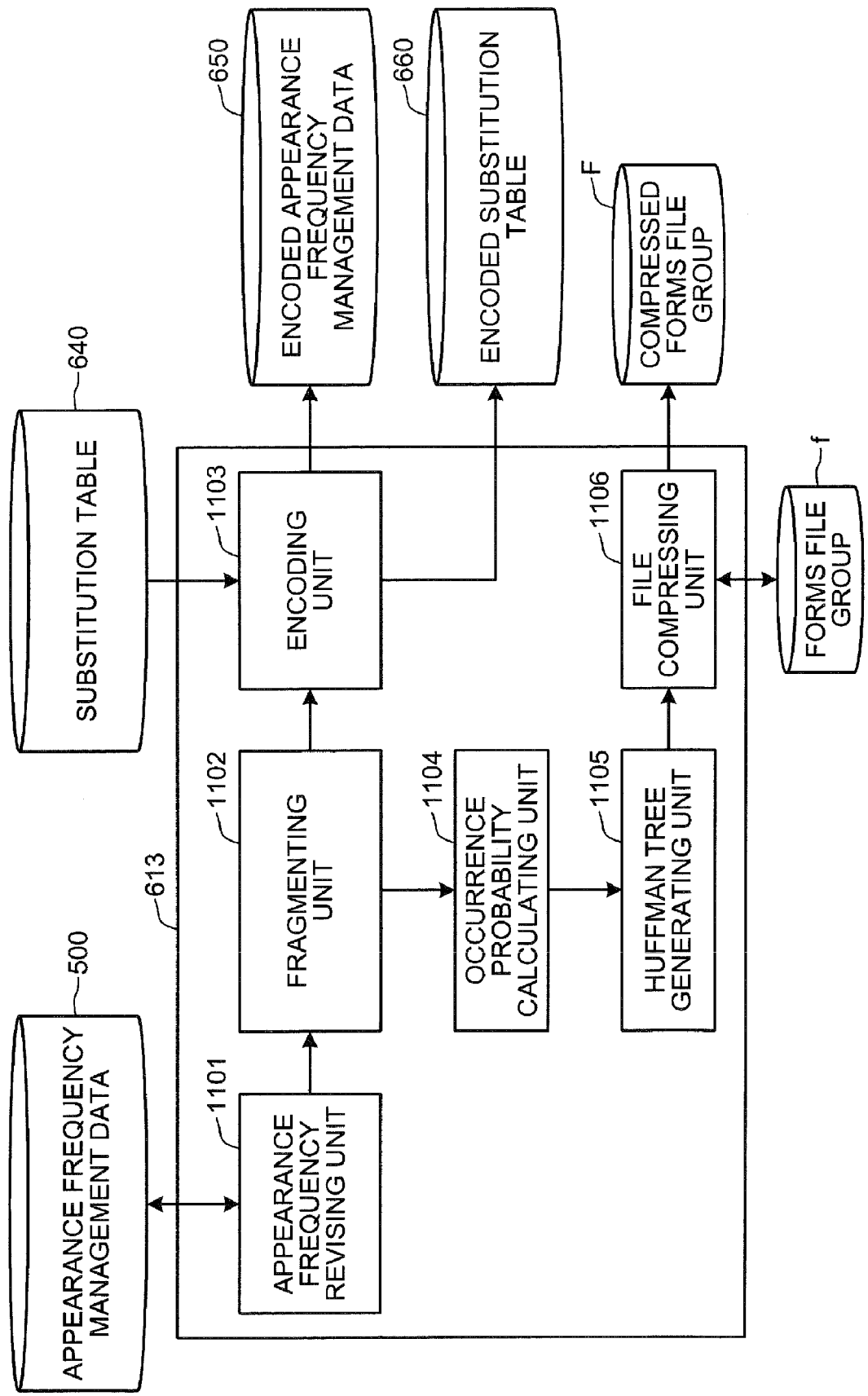
FIG. 11 is a functional diagram of a compressing/encoding unit depicted in FIG. 6.

FIG. 11 is a functional diagram of the compressing/encoding unit 613 depicted in FIG. 6. As depicted in FIG. 11, the compressing/encoding unit 613 includes an appearance frequency revising unit 1101, a fragmenting unit 1102, an encoding unit 1103, an occurrence probability calculating unit 1104, a Huffman tree generating unit 1105, and a file compressing unit 1106.

The appearance frequency revising unit 1101 revises the appearance frequency of numerals in the appearance frequency management data 500. Specifically, for example, the bit width of a compression code for a numeral such as 0 to 9, a decimal point, and a feeder (hereinafter "numeral, etc.") is set and an appearance frequency corresponding to the set bit width is set for a numeral, etc., such as 0 to 9. More specifically, the appearance frequency of a numeral, etc., is revised forcibly to be higher than the appearance frequency of character data.

FIG. 12 is a diagram of an example of revision of the appearance frequency of a numeral, etc. FIG. 12 depicts a code table for revising the appearance frequency of numerical value/character data. As depicted in FIG. 12, the bit width of the compression code is 4 bits; hence, the appearance frequency of each numerical value, etc., is $1/16$, to which another appearance frequency is further added according to the appearance rank of each numerical value, etc. The revision example depicted in FIG. 12 is effective in application to a forms file having many numerals. When the sum of appearance frequencies exceeds 1 as a result of revision, the appearance frequency of other character data is revised according to the corresponding appearance frequency thereof.

FIG. 13 is a diagram of another example of revision of the appearance frequency of a numeral, etc. FIG. 13 depicts a code table for revising the appearance frequency of numerical value/character data. In FIG. 13, the bit width of the compression code is 5 bits; hence, the appearance frequency of each numerical value, etc., is $1/32$, to which another appearance frequency is further added according to the appearance rank of each numerical value, etc. The revision example depicted in FIG. 13 is effective in application to a Web homepage having much character data. When the sum of appearance frequencies exceeds 1 as a result of revision, the appearance frequency of other character data is revised according to the corresponding appearance frequency thereof.

The fragmenting unit 1102 depicted in FIG. 11 sorts numerical value/character data in the character area of the appearance frequency management data 500 in descending order of appearance frequency. Numerical value/character data having a low appearance frequency, i.e., an appearance frequency that is lower than a given appearance frequency, is fragmented into 8-bit code data and is stored in the binary area where 8-bit code binary data is stored.

The encoding unit 1103 encodes the appearance frequency management data 500 resulting from data fragmenting by the fragmenting unit 1102 through XOR processing, using a prescribed master key, to generate the encoded appearance frequency management data 650. The substitution table 640 may also be encoded through XOR processing, using a prescribed master key, to generate the encoded substitution table 660.

The occurrence probability calculating unit 1104 sorts numerical value data, standard character data, consecutive characters/non-standard character data, and binary data in the appearance frequency management data 500 resulting from data fragmenting by the fragmenting unit 1102, in descending order of appearance frequency to calculate the occurrence probabilities of the data. The Huffman tree generating unit 1105 generates a Huffman Tree from the occurrence probabilities calculated by the occurrence probability calculating unit 1104.

The file compressing unit 1106 compresses the forms file group f using the Huffman tree generated by the Huffman tree generating unit 1105 to generate the compressed forms file group F. Specifically, the file compressing unit 1106 compresses the forms file group f by assigning shorter bits to numerical value/character data written in the forms files f0 to fn in descending order of post-amendment appearance frequency, i.e., in descending order of occurrence probability. The compression of the forms file group f by the file compressing unit 1106 is carried out by using compressing methods that differ for compressing numerical values and character data, which will be described later.

Figure 14:
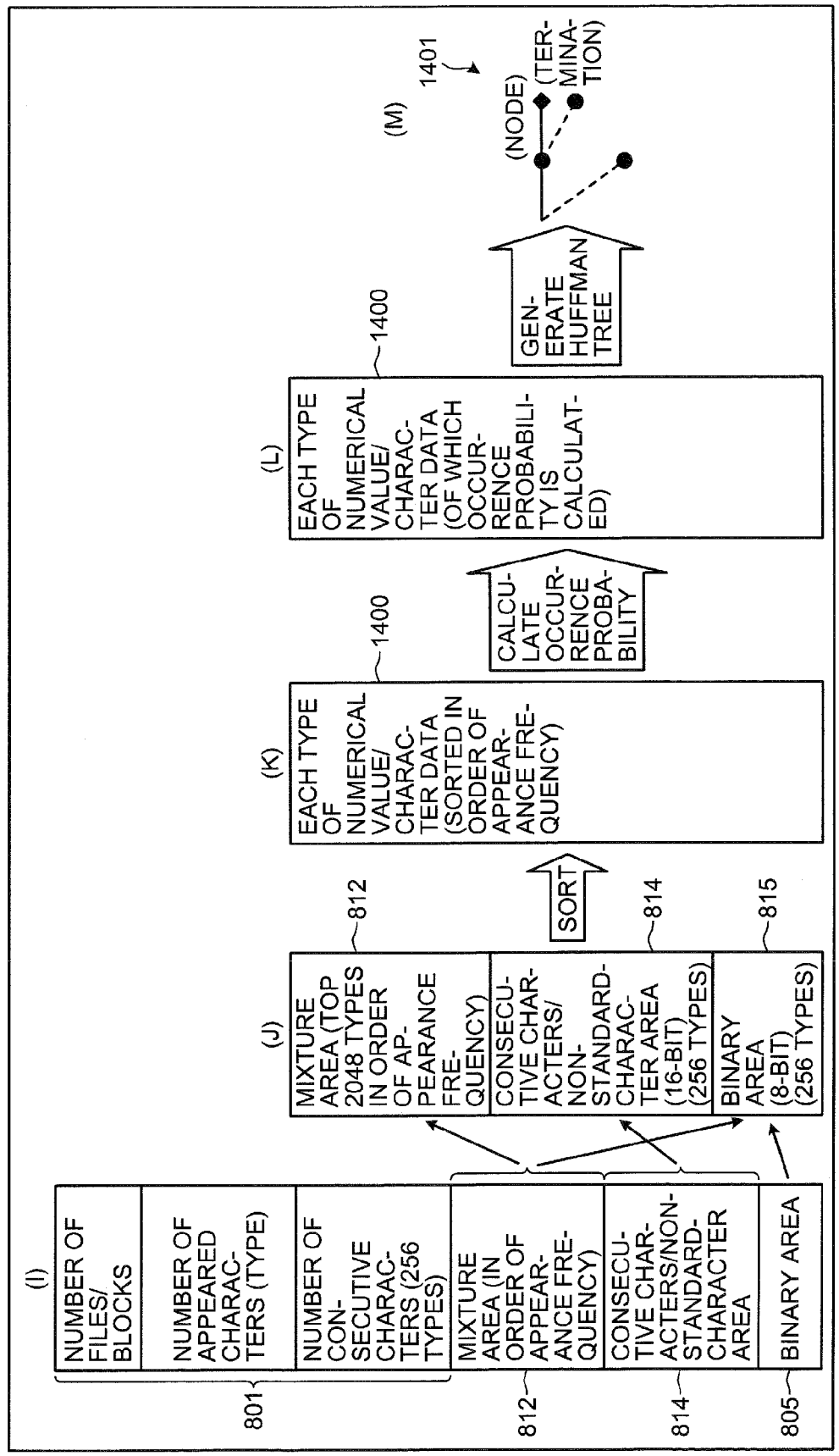
FIG. 14 is a diagram of a Huffman tree generating process by the compressing/encoding unit.

FIG. 14 is a diagram of a Huffman tree generating process by the compressing/encoding unit 613. In the appearance frequency management data 500 of a data configuration as depicted in FIG. 14, low appearance frequency character data is fragmented by the fragmenting unit 1102, and the fragmented character data is stored in the binary area storing binary data (data configuration (J) of FIG. 14).

Subsequently, in the data configuration (J), all of numerical value/character data in the mixture area, in the consecutive characters/non-standard character area, and in the binary area are sorted in descending order of appearance frequency (data configuration (K) of FIG. 14). In an area 1400 of the data configuration of (K), the occurrence probability of each of numerical value/character data is calculated using the appearance frequency as a Huffman compression parameter (data configuration (L) of FIG. 14). Finally, with the data configuration (L), a Huffman tree is generated from the occurrence probability of each of numerical value/character data (data configuration (M) of FIG. 14).

FIG. 15 is a functional diagram of the file compressing unit 1106 depicted in FIG. 11.

As depicted in FIG. 15, the file compressing unit 1106 includes a feeder detecting unit 1501, a character data extracting unit 1502, a numerical value extracting unit 1503, a numerical value information detecting unit 1504, and a compressing process unit 1505.

The feeder detecting unit 1501 detects a feeder in a forms file fi. Because a feeder is at the head of a numerical value, detection of the feeder means the presence of the numerical value following the feeder. No detection of a feeder, therefore, means recognition of character data.

When the feeder detecting unit 1501 does not detect a feeder at a feeder position, the character data extracting unit 1502 extracts, as character data, data located at the position. The extracted character data is subjected to a compressing process at the compressing process unit 1505.

When the feeder detecting unit 1501 detects a feeder, the numerical value extracting unit 1503 extracts a numerical value correlated with the feeder, e.g., a numerical string following the feeder, as a numerical value. When a comma or decimal point is included in the numerical string, the comma or decimal point is also extracted.

The numerical value information detecting unit 1504 extracts detailed information concerning the numerical value extracted by the numerical value extracting unit 1503. The detailed information is, for example, information indicating the number of places of the numerical value, whether the numerical value is two-byte or one-byte, whether the numerical value includes a comma or a decimal point, and the location of the decimal point if included.

The compressing process unit 1505, using the Huffman tree generated by the Huffman tree generating unit 1105, compresses character data extracted by the character data extracting unit 1502 and numerical value data extracted by the numerical value extracting unit 1503.

When numerical values are compressed, a numeral expressing the number of places and a numeral in each place are each converted into a compression code corresponding to the numeral. Compression codes for numerals each in each place are arranged in the order of the places. If a numerical value includes a decimal point, the numerical value is converted into a compression code corresponding to the decimal point. The presence/absence of a comma and two-byte/one-byte are each expressed by 1 bit.

In a numerical value compressing process, only the numerical value is extracted from the numerical value information concerning a monetary amount, blood pressure, etc. The extracted numerical value is compressed. Specifically, a compression code for a feeder is read out, referring to the code tables depicted in FIGS. 12 and 13.

Subsequently, a bit indicative of whether the numerical value is a two-byte numerical value or a one-byte numerical value (two-byte/one-byte bit) is set. This two-byte/one-byte bit is "1" when the numerical value is a two-byte numerical value, and is "0" when the numerical value is a one-byte numerical value. A comma presence/absence bit indicative of whether the numerical value is expressed using a comma "," is set. This comma presence/absence bit is "1" when the numerical value includes a comma, and is "0" when the numerical value includes no comma.

The number of places of the numerical value is then detected. The detected number of places does not include the number of places following a decimal point. A compression code for a numeral equivalent to the detected number of places is read out of the code table depicted in FIG. 12. Compression codes for each numeral at each place from the head place to the end place making up the numerical value are read out from the coding tables depicted in FIGS. 12 and 13.

When the numerical value includes a decimal point, a compression code for the decimal point is read out from the coding tables depicted in FIGS. 12 and 13. In this manner, the numerical value is compressed into a numerical string composed of compression codes and bits. An example of a compressing process using the code table depicted in FIG. 12 will be described hereinafter. A numerical value subjected to the compressing process is referred to as a compressed numerical value.

Figure 16A:
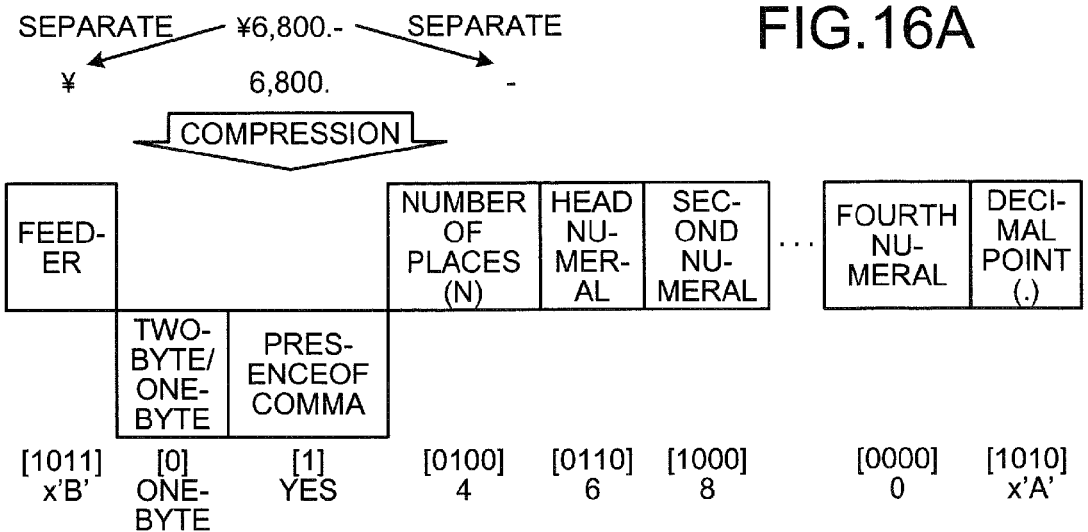
FIG. 16A is a diagram of a first example of a numerical value compressing process.

FIG. 16A is a diagram of a first example of a numerical value compressing process. As depicted in FIG. 16A, "¥" at the head position and "-" at the end position are separated from numerical value information ""¥"6,800.-" to extract a numerical value "6,800.", which is compressed.

Specifically, a compression code "1011" for a feeder "x'B'" indicative of the starting point of the numerical value is read out from the code table depicted in FIG. 12. Subsequently, a two-byte/one-byte bit "0" indicative of the numerical value "6,800." being a one-byte numerical value is set. A comma presence/absence bit "1" indicative of the numerical value "6,800." being expressed using a comma "," is also set. The number of places "4" of the numerical value "6,800." is then detected, and a compression code "0100" for the detected number of places "4" is read out from the code table depicted in FIG. 12.

Subsequently, compression codes "0110", "1000", "0000", and "0000" for the head numeral "6", the second numeral "8", the third numeral "0", and the end numeral "0" of the numerical value "6,800." are read out from the code table depicted in FIG. 12. Lastly, a compression code "1010" for the decimal point "x'A'" of the numerical value "6,800." is read out from the code table depicted in FIG. 12. The numerical value "6,800." is compressed in this manner.

Figure 16B:
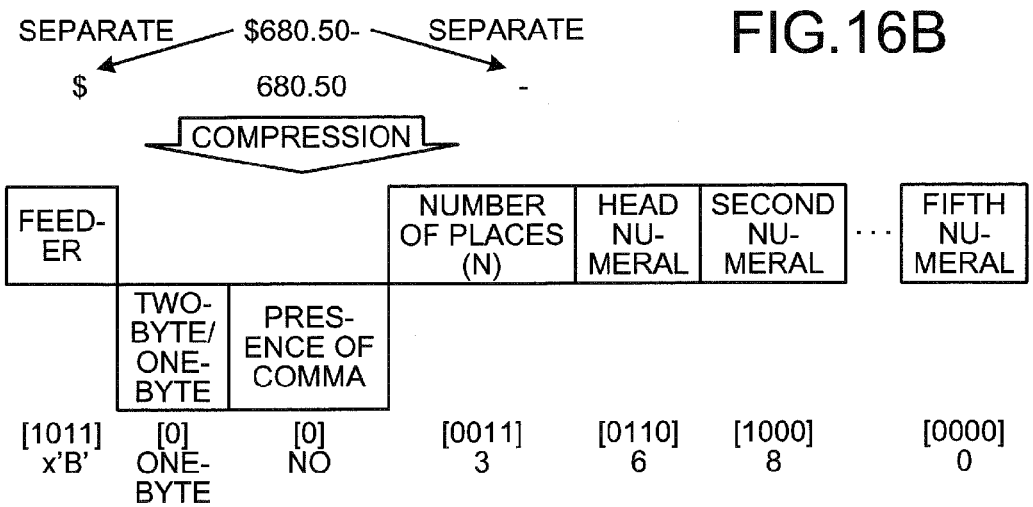
FIG. 16B is a diagram of a second example of the numerical value compressing process.

FIG. 16B is a diagram of a second example of the numerical value compressing process. As depicted in FIG. 16B, "$" at the head position and "-" at the end position are separated from numerical value information "$680.50-" to extract a numerical value "680.50", which is compressed.

Specifically, the compression code "1011" for the feeder "x'B'" indicative of the starting point of the numerical value is read out from the code table depicted in FIG. 12. Subsequently, a two-byte/one-byte bit "0" indicative of the numerical value "680.50" being a one-byte numerical value is set. A comma presence/absence bit "0" indicative of the numerical value "680.50" being expressed without using a comma "," is also set. The number of places "3" of the numerical value "680.50" is then detected, and a compression code "0011" for the detected number of places "3" is read out from the code table depicted in FIG. 12.

Subsequently, compression codes "0110", "1000", "0000", "1010", "0101", and "0000" for the head numeral "6", the second numeral "8", the third numeral "0", the decimal point "x'A'", the fourth numeral "5", and the end numeral "0" of the numerical value "680.50" are read out from the code table depicted in FIG. 12. The numerical value "680.50" is compressed in this manner.

Figure 16C:
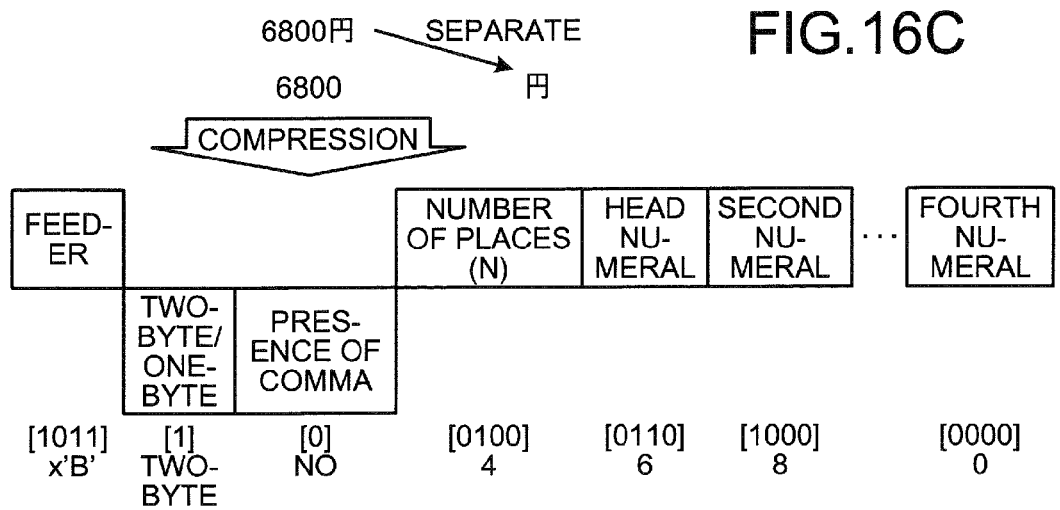
FIG. 16C is a diagram of a third example of the numerical value compressing process.

FIG. 16C is a diagram of a third example of the numerical value compressing process. As depicted in FIG. 16C, "円" at the end position is separated from numerical value information "6800円" to extract a numerical value "6800", which is compressed.

Specifically, the compression code "1011" for the feeder "x'B'" indicative of the starting point of the numerical value is read out from the code table depicted in FIG. 12. Subsequently, a two-byte/one-byte bit "1" indicative of the numerical value "6800" being a two-byte numerical value is set. A comma presence/absence bit "0" indicative of the numerical value "6800" being expressed without using a comma "," is also set. The number of places "4" of the numerical value "6800" is then detected, and the compression code "0100" for the detected number of places "4" is read out from the code table depicted in FIG. 12.

Subsequently, compression codes "0110", "1000", "0000", and "0000" for the head numeral "0", the second numeral "8", the third numeral "0", and the end numeral "0" of the numerical value "6800" are read out of the code table depicted in FIG. 12. The numerical value "6800" is compressed in this manner.

Figure 16D:
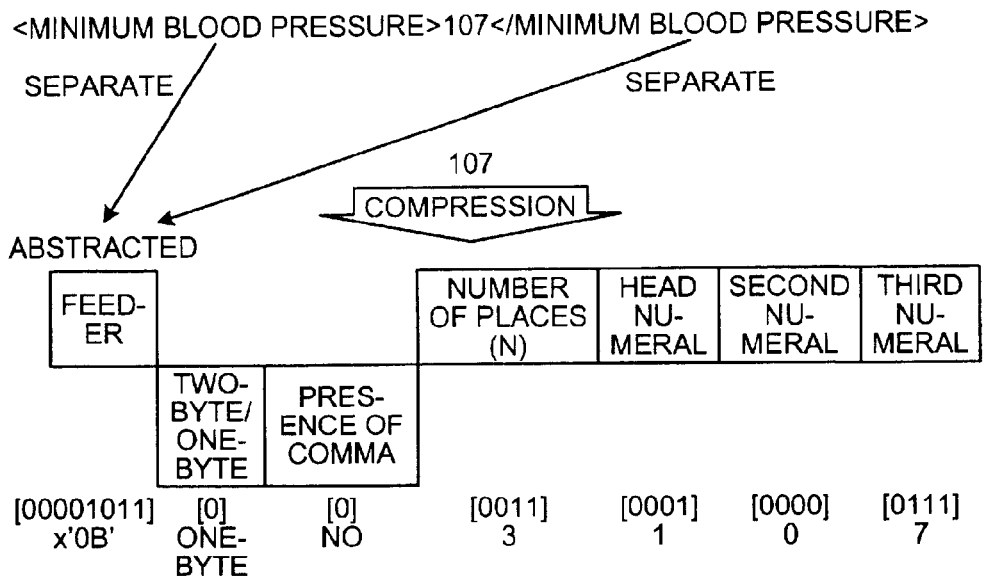
FIG. 16D is a diagram of an example of a process of compressing numerical value abstracted data.

FIG. 16D is a diagram of an example of a process of compressing numerical value abstracted data. As depicted in FIG. 16D, in HTML data description, "</minimum blood pressure>" at the head position and the same at the end position are separated from numerical value abstracted data representing a minimum blood pressure "<minimum blood pressure>107<minimum blood pressure>" to extract a numerical value "107", which is compressed.

Specifically, a compression code "00001011" for a feeder "x'0B'" indicative of the starting point of the numerical value is read out from the code table depicted in FIG. 12. The feeder "x'0B'" is a feeder that identifies the numerical value as the last blood pressure. Subsequently, a two-byte/one-byte bit "0" indicative of the numerical value "107" being a one-byte numerical value is set. A comma presence/absence bit "0" indicative of the numerical value "107" being expressed without using a comma "," is also set. The number of places "3" of the numerical value "107" is then detected, and the compression code "0011" for the detected number of places "3" is read out from the code table depicted in FIG. 12.

Subsequently, compression codes "0001", "0000", and "0111" for the head numeral "1", the second numeral "0", and the third numeral "7" of the numerical value "107" are read out from the code table depicted in FIG. 12. The numerical value "107" is compressed in this manner.

Figure 17A:
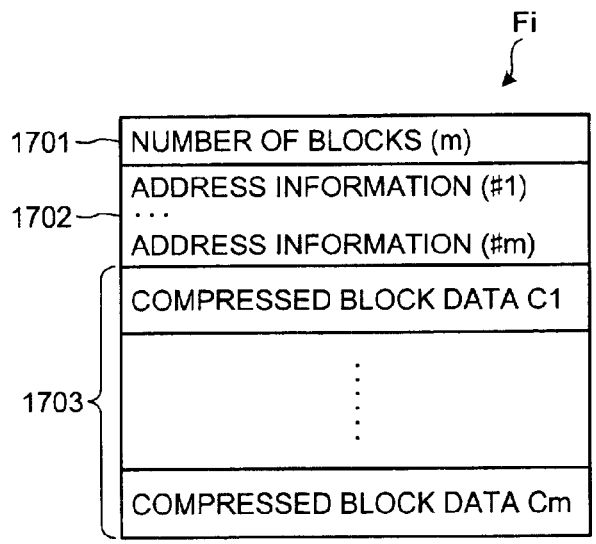
FIG. 17A is a diagram of a data configuration of a compressed forms file resulting from compression by the file compressing unit.

FIG. 17A is a diagram of a data configuration of a compressed forms file resulting from compression by the file compressing unit 1106. With reference to FIG. 17A, an arbitrary compressed forms file Fi will be described. The compressed forms file Fi is made up of an area 1701 storing therein information of the number of blocks (m), an area 1702 storing therein address information (#1 to #m) of m blocks, and an area 1703 storing therein compressed block data C1 to Cm of the blocks.

FIG. 17B is a table of a comparison between the compressed block data C1 to Cm and the original block data before compression. As depicted in FIG. 17B, the lengths of the compressed block data C1 to Cm are reduced approximately to the half of the lengths of the corresponding original block data through compression.

Figure 18:
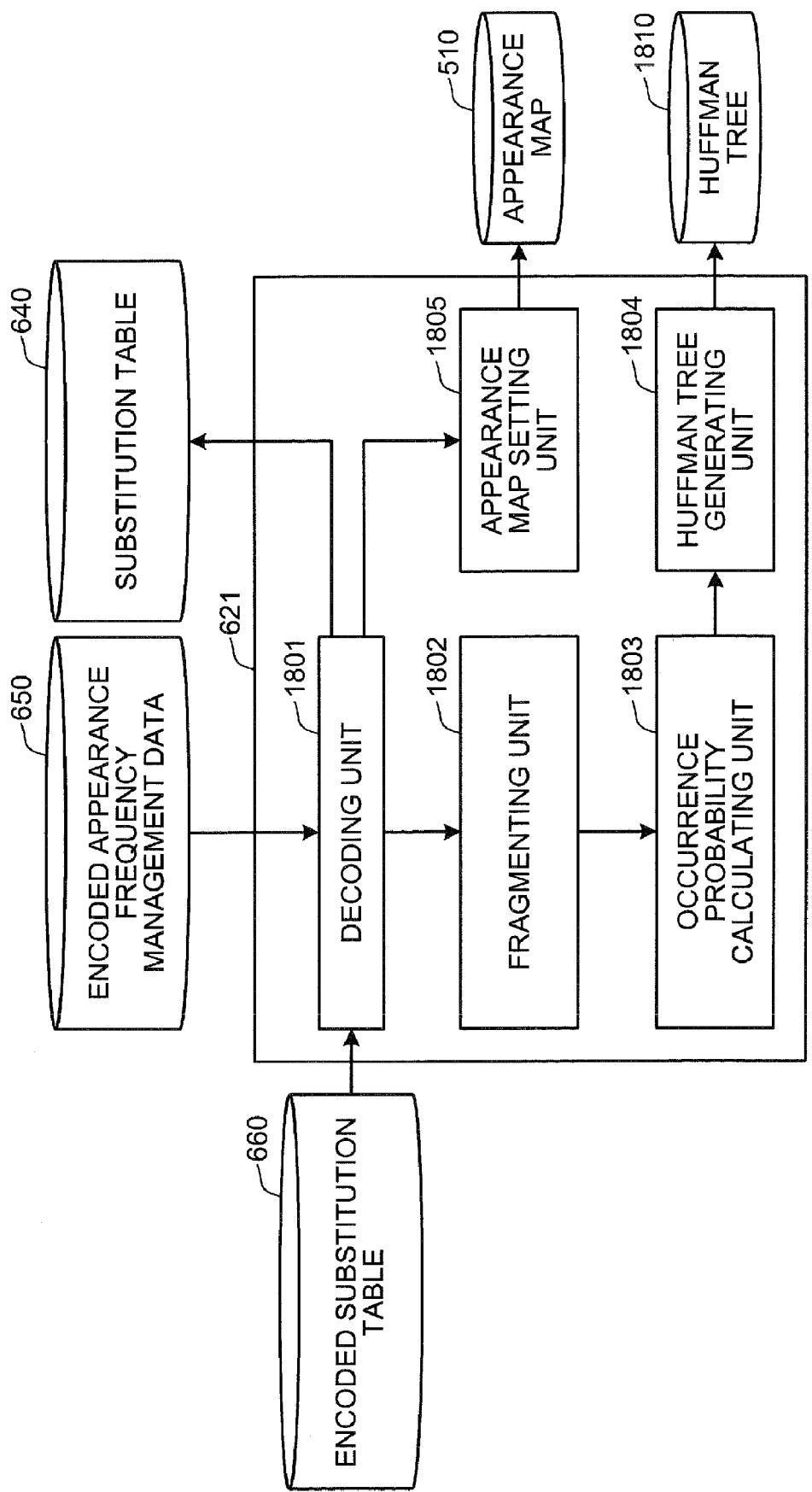
FIG. 18 is a functional diagram of a retrieval initializing unit depicted in FIG. 6.

FIG. 18 is a functional diagram of the retrieval initializing unit 621 depicted in FIG. 6. As depicted in FIG. 18, the retrieval initializing unit 621 includes a decoding unit 1801, a fragmenting unit 1802, an occurrence probability calculating unit 1803, a Huffman tree generating unit 1804, and an appearance map setting unit 1805.

The decoding unit 1801 decodes the encoded appearance frequency management data 650. Specifically, the decoding unit 1801 executes a decoding process through exclusive-OR (XOR) using the encoding master key of FIG. 11. In the same manner, the decoding unit 1801 also decodes the encoded substitution table 660 into the original substitution table 640. The fragmenting unit 1802, the occurrence probability calculating unit 1803, and the Huffman tree generating unit 1804 execute the same process carried out by the fragmenting unit 1102, the occurrence probability calculating unit 1104, and the Huffman tree generating unit 1105 depicted in FIG. 11 to generate a Huffman tree 1810, which is the Huffman tree that is revised by the appearance frequency revising unit 1101.

The appearance map setting unit 1805 reads the appearance maps 510 of the decoded appearance frequency management data 500, and expands the read contents on a memory to link the contents to a row/column corresponding table. The row/column (kuten) code is character code for two-byte characters established by Japanese Industrial Standards (JIS). The row/column corresponding table is the table on which the address of each line and column is stored.

Figure 19:
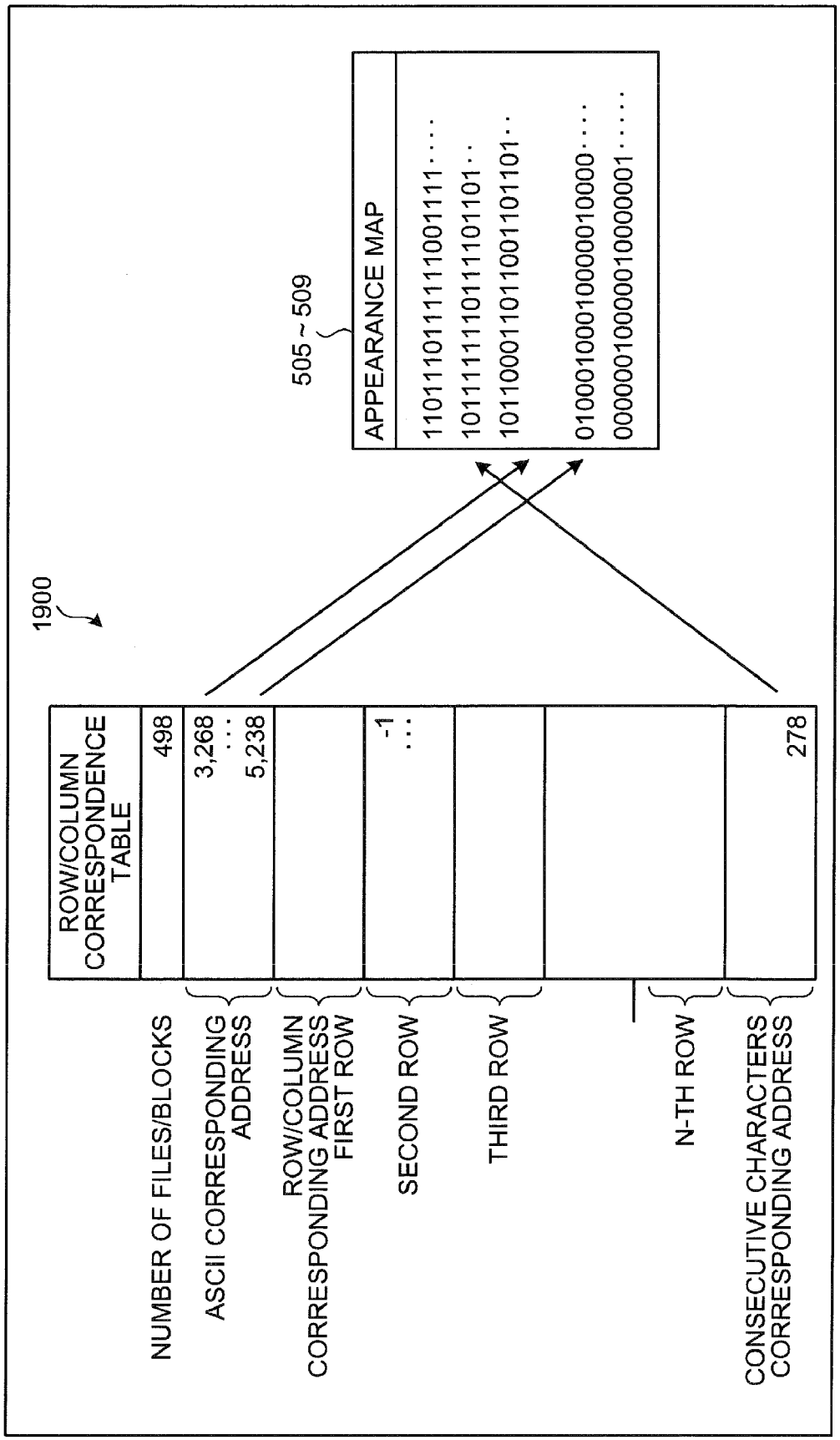
FIG. 19 is a diagram of the corresponding relation between a character row/column correspondence table and an appearance map.

FIG. 19 is a diagram of the corresponding relation between a character row/column correspondence table and the appearance map. A character row/column correspondence table 1900 correlates character data of the appearance frequency management data 500 with the appearance maps 505 to 509. The appearance maps 505 to 509 representing strings of bits indicative of the presence/absence of character data corresponding to rows/columns can be called up, using the character row/column corresponding table 1900.

Figure 20:
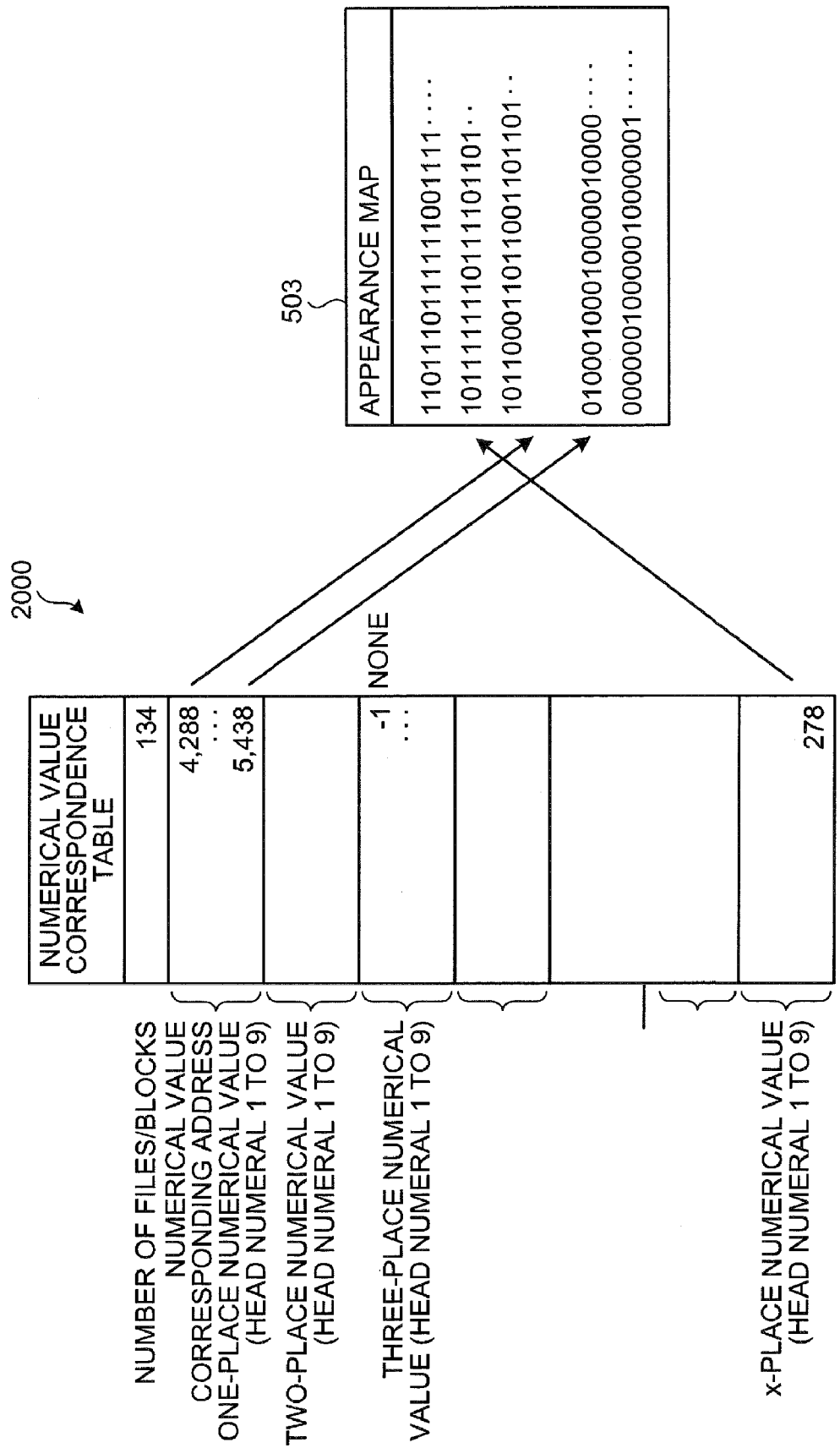
FIG. 20 is a diagram of the corresponding relation between a numerical value row/column correspondence table and the appearance map.

FIG. 20 is a diagram of the corresponding relation between a numerical value row/column correspondence table and the appearance map. A numerical value row/column correspondence table 2000 correlates numerical value groups of the appearance frequency management data 500 with the appearance map 503. The appearance map 503 representing strings of bits indicative of the presence/absence of numerals in numerical groups corresponding to rows/columns can be called up, using the character row/column corresponding table 2000.

Figure 21:
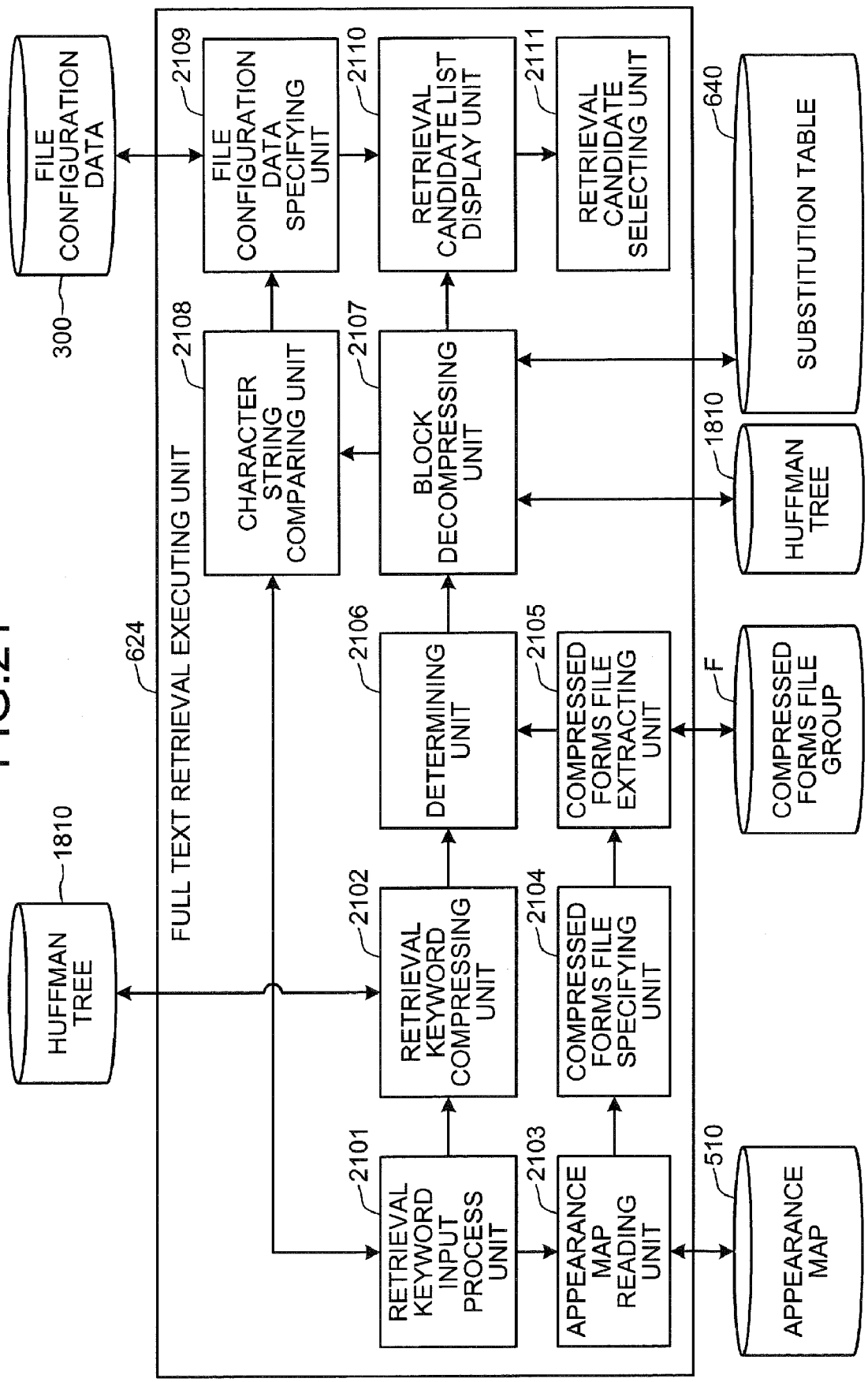
FIG. 21 is a functional diagram of a full text retrieval executing unit in the retrieval executing unit.

FIG. 21 is a functional diagram of the full text retrieval executing unit 624 in the retrieval executing unit 622.

As depicted in FIG. 21, the full text retrieval executing unit 624 includes a retrieval keyword input process unit 2101, a retrieval keyword compressing unit 2102, an appearance map reading unit 2103, a compressed forms file specifying unit 2104, a compressed forms file extracting unit 2105, a determining unit 2106, a block decompressing unit 2107, a character string comparing unit 2108, a file configuration data specifying unit 2109, a retrieval candidate list display unit 2110, and a retrieval candidate selecting unit 2111.

The retrieval keyword input process unit 2101 receives input of a retrieval keyword from a user. When multiple retrieval keywords are received, the retrieval keyword input process unit 2101 connects respective character strings of the retrieval keywords. When consecutive characters of a retrieval keyword is equivalent to given consecutive characters, the retrieval keyword input process unit 2101 replaces the consecutive characters with a non-standard character using the substitution table 640, and then fragments the retrieval keyword into single characters.

The retrieval keyword compressing unit 2102 compresses the retrieval keyword input through the retrieval keyword input process unit 2101, using the Huffman tree 1810 generated by the Huffman tree generating unit 1804 of the retrieval initializing unit 621. Using the appearance map 510 set by the appearance map setting unit 1805, the appearance map reading unit 2103, for each character of the retrieval keyword, reads a string of bits respectively corresponding to the forms files f0 to fn. Specifically, because each character data on the appearance maps 510 is linked to a row/column through the row/column corresponding table, the appearance map reading unit 2103 is able to read a string of bits for each character data of the retrieval keyword matching the row/column.

The compressed forms file specifying unit 2104 calculates the logical product of strings of bits respectively corresponding to the forms files f0 to fn read from the appearance map 510 to specify a compressed forms file in which all of the character data of the retrieval keyword are present, thus narrowing down compressed forms files. An example of a narrowing down process will be described.

FIG. 22 is a diagram of an example of narrowing down compressed forms files to a compressed forms file Fi. As depicted in FIG. 22, a retrieval keyword is "出金伝票" and the number of forms files is four, which means that files including characters of the retrieval keyword are narrowed down to the files having file numbers i=0 to i=3. As depicted in FIG. 22, for example, a bit string for a character "出" is [1100]. This bit string signifies that the forms files f0 and f1 with file numbers 0 and 1 include the character "出" while the forms files f2 and f3 with file numbers 2 and 3 do not include the character "出".

A narrowing down result depicted in FIG. 22 indicates the logical product (AND) of bits for each file having a file number i. According to this narrowing down result, only the forms file f1 having the file number 1 has, for each of the characters of the retrieval keyword, the bit "1" indicative of the presence of the character. Thus, all of the characters making up the retrieval keyword, i.e., "出", "金", "伝", and "票", are present collectively only in the forms file f1, and are not present collectively in any of the other forms file f0, f2, and f3. Hence, a file to be opened as a file-to-be-retrieved is specified as the compressed forms file Fi created by compressing the forms file fi. This prevents the opening/closing of unnecessary files to improve retrieval speed.

Depicted in FIG. 21, the compressed forms file extracting unit 2105 extracts, from among the compressed forms file group F, the forms file Fi specified by the compressed forms file specifying unit 2104. In the example depicted in FIG. 22, the compressed forms file F1 having the file number 1 is extracted.

The determining unit 2106 determines whether a retrieval keyword compressed by the retrieval keyword compressing unit 2102 (hereinafter "compressed keyword") is included in the compressed forms file Fi extracted by the compressed forms file extracting unit 2105. Specifically, this determination is made for each of compressed block data in the compressed forms file Fi.

When the result of the determination is "no matching", it means that the compressed forms file Fi does not include the retrieval keyword. When the result of the determination is "matching", it means that the compressed forms file Fi includes the retrieval keyword. In the example depicted in FIG. 22, the compressed forms file F1 includes the retrieval keyword 出金伝票.

The block decompressing unit 2107 decompresses only the compressed block data of compressed forms file Fi that is determined to be "matching" by the determining unit 2106. The determining unit 2106 and the block decompressing unit 2107 enable determination of the presence of the retrieval keyword in the compressed forms file Fi without decompression. If a determination result is "no matching", the compressed forms file Fi is excluded from retrieval candidates before decompression of the compressed forms file Fi, so that only the forms file(s) having a match to the keyword is decompressed. When a decompressed forms file fi includes consecutive characters/non-standard character data, the block decompressing unit 2107 substitutes the consecutive characters/non-standard character data with the original consecutive characters data, using the substitution table 640 decompressed by the decompressing unit 1801.

The character string comparing unit 2108 compares a character string in block data decompressed by the block decompressing unit 2107 with the retrieval keyword input through the retrieval keyword input process unit 2101.

When a character string of the forms data gj matching the retrieval keyword is present, the file data configuration specifying unit 2109 specifies the page number j of the forms data gj and the file number i of a forms file fi to which the forms data gj belongs.

The retrieval candidate list display unit 2110 edits the page list data 400, and extracts a file list on which the page number j of the forms data gj and the file number of the forms file fi to which the forms data gj belongs is specified by the file data configuration specifying unit 2109, from among file lists in the file configuration data 300 to display the extracted file list as a retrieval candidate list (e.g., headword list) on the display 108 depicted in FIG. 1.

The retrieval candidate selecting unit 2111 receives a selection of a retrieval candidate, from among the retrieval candidate list displayed by the retrieval candidate list display unit 2110, by the user.

According to a character string no-matching check method in full text retrieval, although compressed/encoded data is not decompressed, a retrieval keyword is compressed to perform no-matching check.

In checking character strings of noncompressed data, comparison is made according to each byte or each character. For compressed data, however, recognizing the boundary between characters is difficult, which makes it necessary to shift bit by bit and make a comparison. Based on recognition of this fact, the full text retrieval executing unit 624 executes a no-matching check process on a compressed forms file, based on byte-to-byte operation that the CPU 101 is well capable of.

Figure 23:
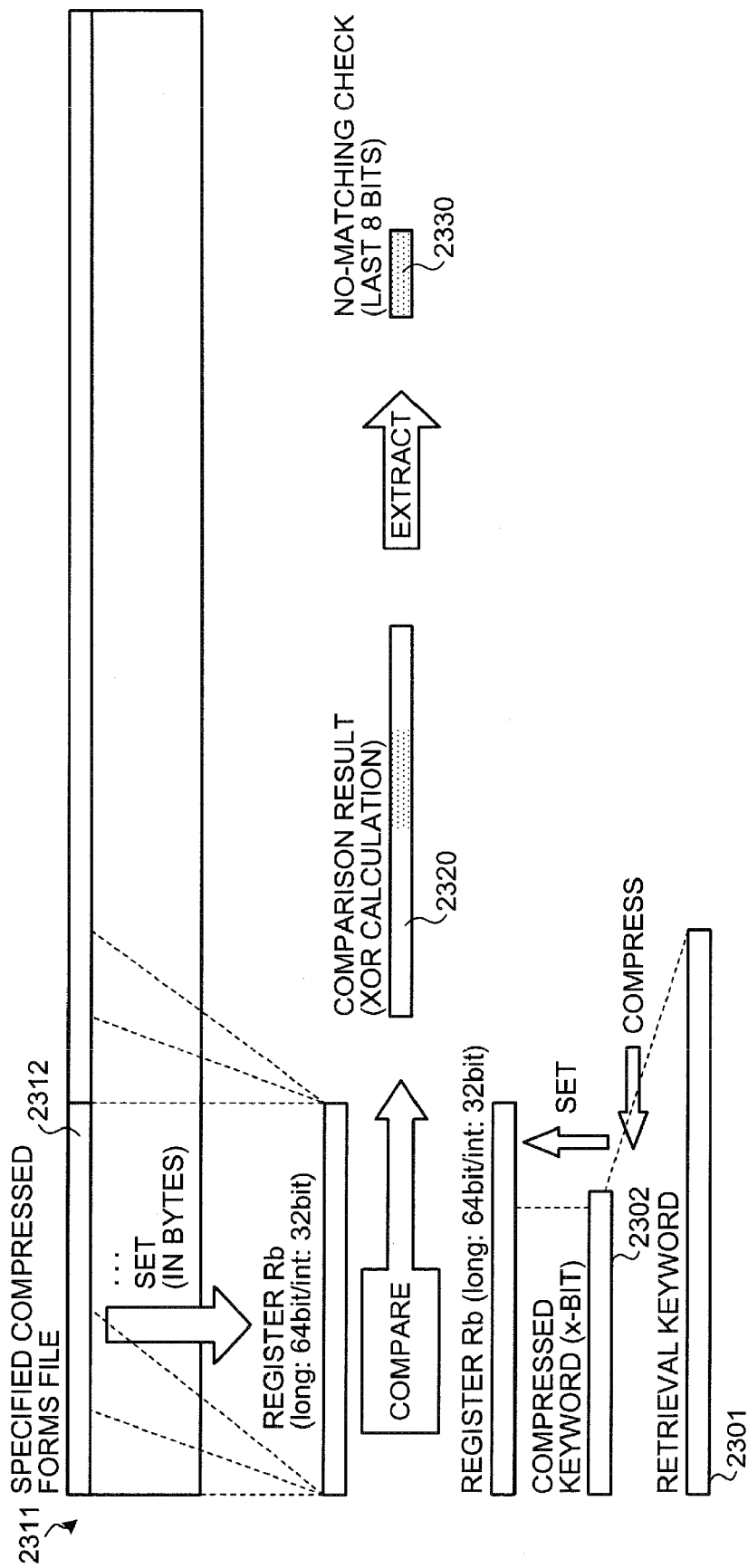
FIG. 23 is a diagram of a no-matching check process carried out by the full text retrieval executing unit.

FIG. 23 is a diagram of the no-matching check process carried out by the full text retrieval executing unit 624. A retrieval keyword 2301 input through the retrieval keyword input process unit 2102 depicted in FIG. 21 is compressed by the retrieval keyword compressing unit 2102 into a compressed keyword 2302 of x bits, using the Huffman tree 1810, and is set in a register Ra.

Meanwhile, compressed block data 2312 in specified compressed forms file (compressed forms file) 2311 extracted by the compressed forms file extracting unit 2105 is set in a register Rb, and is compared with the compressed keyword 2302 set in the register Ra. Specifically, the compressed block data 2312 shifted a given number of bytes is set in the register Rb, and is compared sequentially with the compressed keyword 2302.

Specifically, the XOR of the compressed keyword 2302 and the compressed block data 2312 is calculated to output a comparison result 2320. A bit string 2330 consisting of the final 8 bits of the comparison result 2320 (meshed portion in FIG. 23) is then extracted, and is subjected to no-matching check.

FIG. 24 is a table of shift operation of shifting the compressed block data of FIG. 23. In this shift operation, the compressed block data is shifted at check intervals each corresponding to a compressed size (compressed keyword length) of the compressed keyword 2302. When the compressed keyword length is 16 bits or longer, a bit length for check determination is set to 8 bits. When the compressed keyword length is 11 bits to 15 bits, the bit length for check determination is set to 3 bits to 7 bits in adjustment of the final bits. When the compressed keyword length is 1 bit to 10 bits, the no-matching check with respect to a compressed form is not carried out; however, the retrieval keyword 2301 in a decompressed form is checked.

Figure 25:
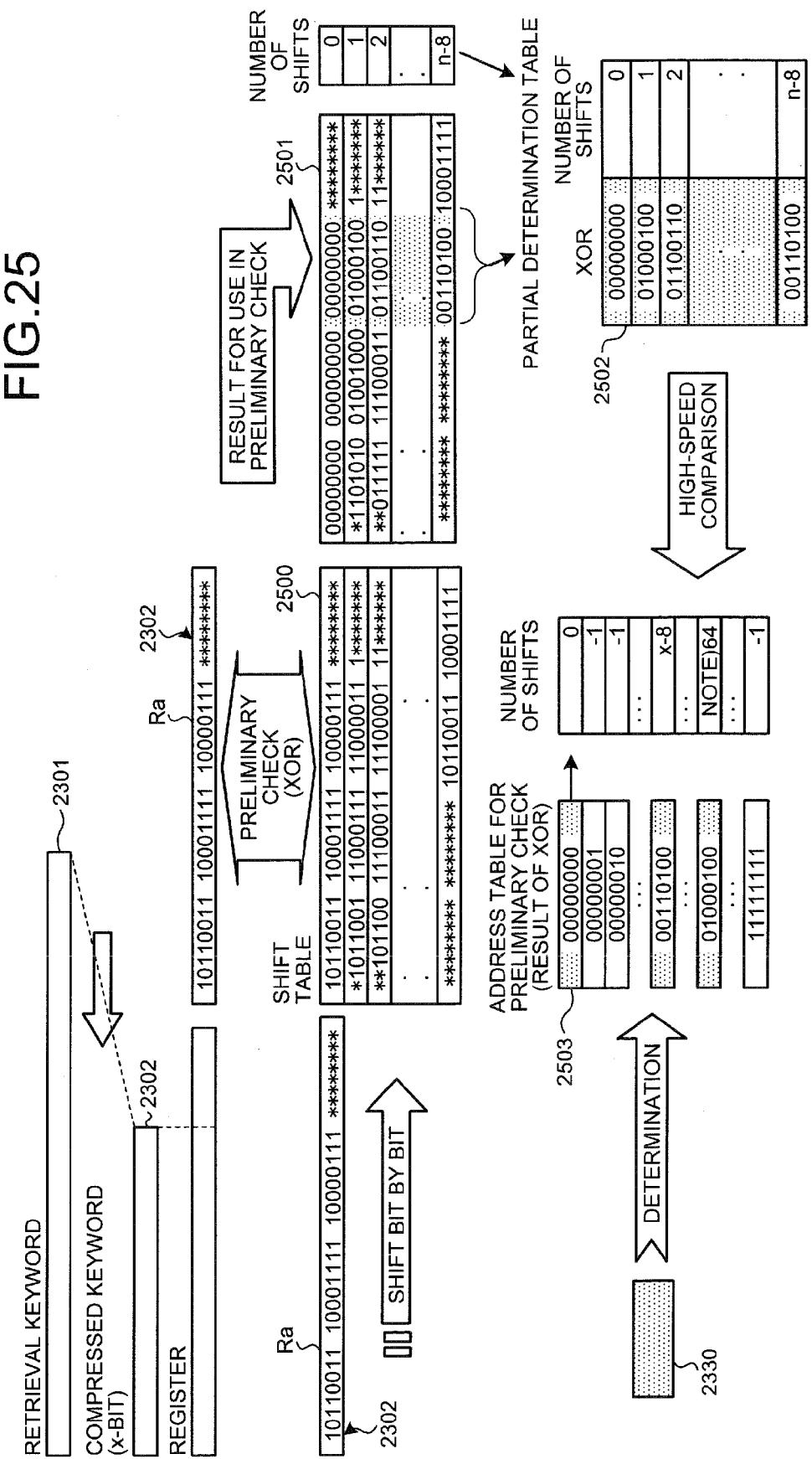
FIG. 25 is a diagram of a process of generating a preliminary check table.

FIG. 25 is a diagram of a process of generating a preliminary check table. In FIG. 25, the compressed keyword 2302 is set in the register Ra, in which "*" (last 8 bits) represent spaces that hold no bits of the compressed keyword 2302. The compressed keyword 2302 in the register Ra is shifted bit by bit to generate a shift table 2500. Since the compressed keyword 2302 is composed of n bits, the generated shift table 2500 is made up of shifted bit strings resulting from shifting ranging from 0 bit shift to x-8 bits shift.

The compressed keyword 2302 set in the register Ra and the shift table 2500 are used in a preliminary check. Specifically, through an XOR calculation, an XOR table 2501 is generated. In each of the shifted bit strings of the XOR table 2501, an 8-bit partial bit string ranging from 17-th bit to 24-th bit that do not include "*" (meshed portion in FIG. 25) is coupled with the number of shifts of the shifted bit string corresponding to partial bit string to generate a partial determination table 2502.

A preliminary check table 2503 for high-speed determination is then generated. The preliminary check table 2503 is generated by assigning the number of shifts to an 8-bit address, with reference to the partial determination table 2502. When a bit string having a number of shifts overlapping another number of shifts appears, the number of shifts of "64"

is assigned to the bit string, and the partial determination table 2502 is referred to when this bit string is subjected to no-matching check. The number of shifts of "−1" is assigned to a bit address not matching any bit strings in the partial determination table 2502. The preliminary check table 2503 is compared with the bit string 2330 for no-matching check to perform no-matching check.

Figure 26:
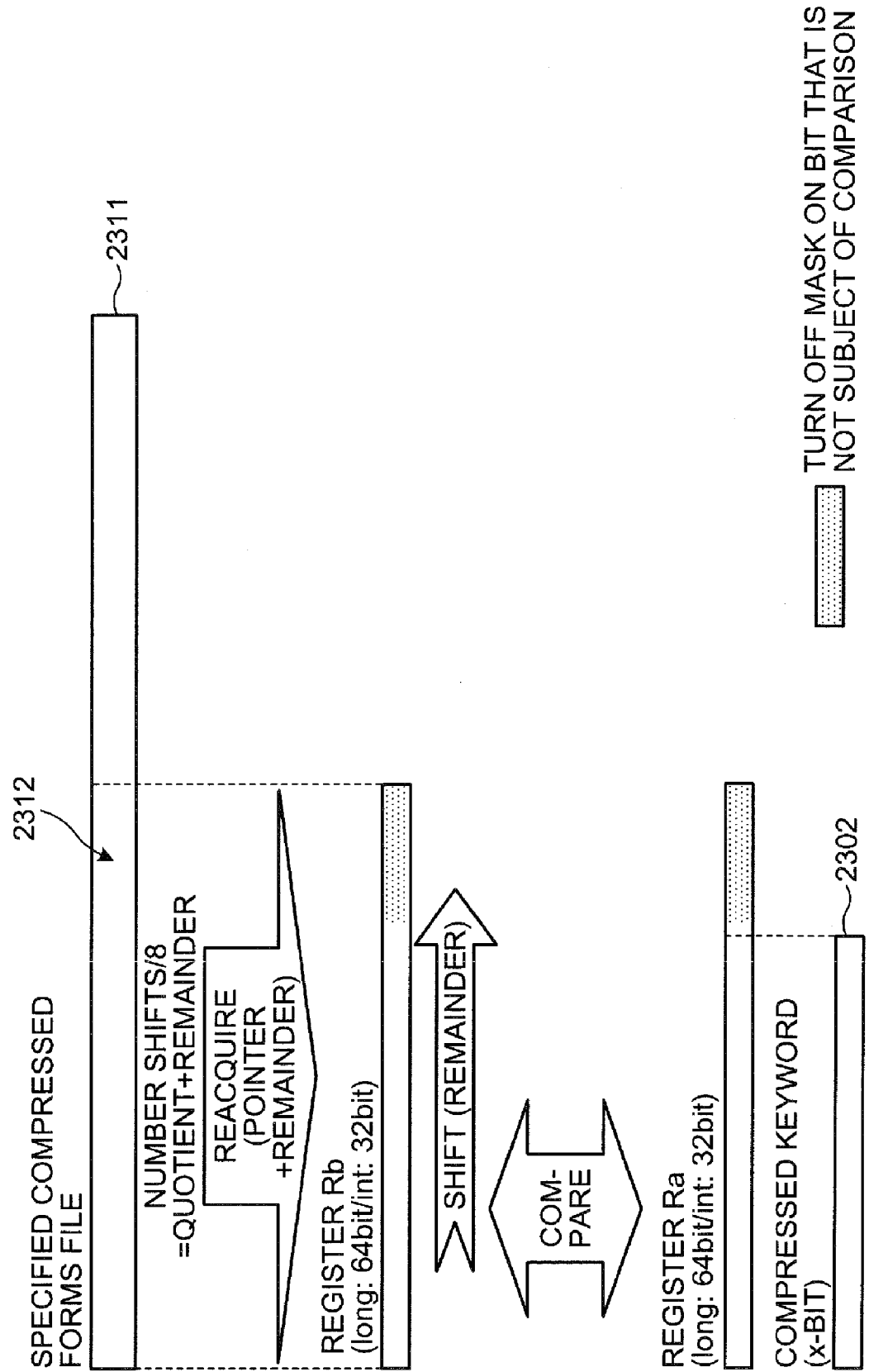
FIG. 26 is a diagram of an all bits no-matching check process.

FIG. 26 is a diagram of an all bits no-matching check process. As depicted in FIG. 26, the current number of shifts is divided by 8 to calculate the quotient and the remainder of the current number of shifts. The quotient is added to the current pointer of the specified compressed forms file 2311 to reacquire the compressed block data 2312 corresponding to the pointer resulting from addition of the quotient, and the reacquired compressed block data 2312 is set in the register Rb. The set compressed block data 2312 is then shifted by the number equivalent to the reminder.

The compressed keyword 2302 is set in the register Ra. In both registers Ra and Rb, masking of bits not to be checked is turned off to compare the register Ra with the register Rb. When both registers match in all bits thereof, the address of the matching bits is recorded.

Figure 27:
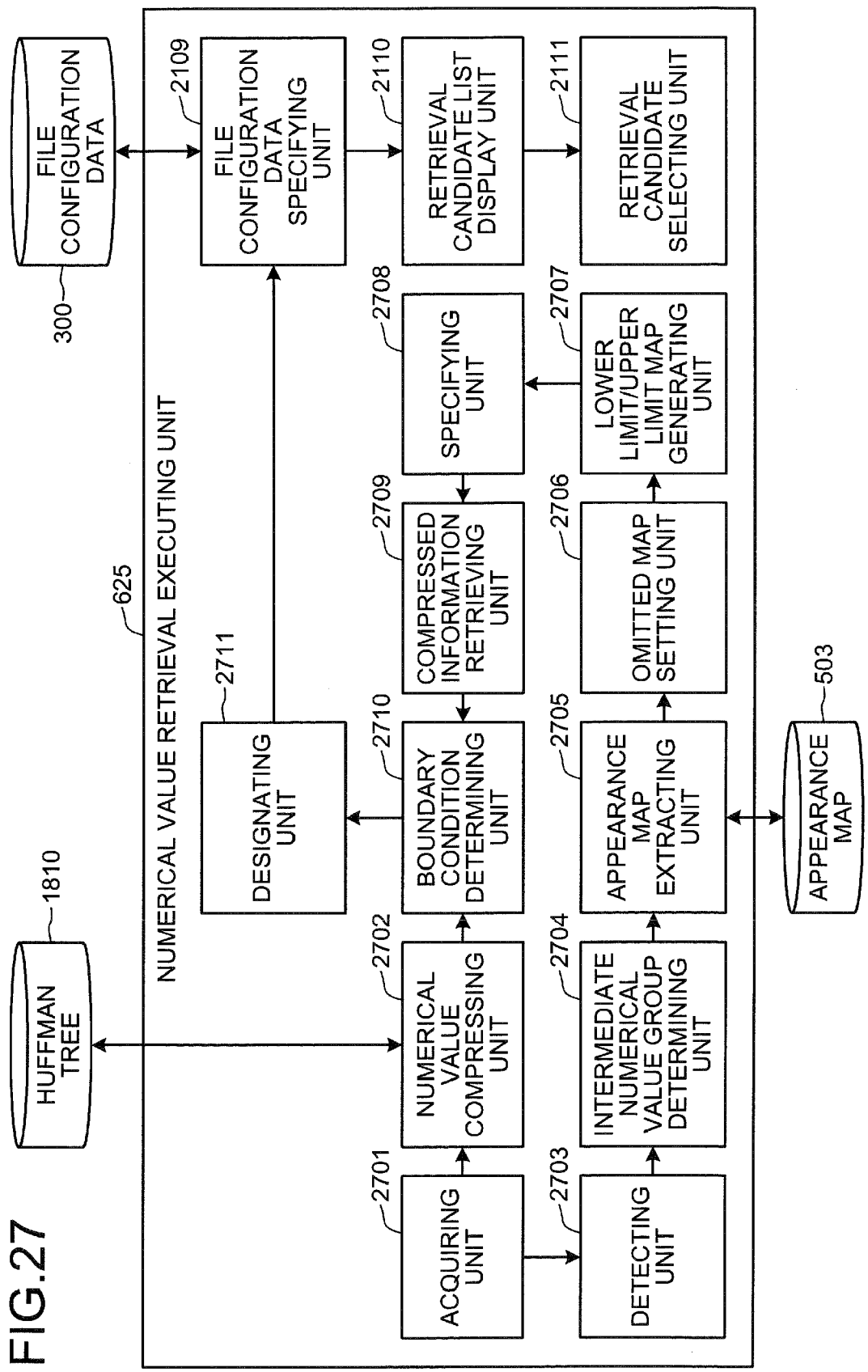
FIG. 27 is a functional diagram of a numerical value retrieval executing unit in the retrieval executing unit.

FIG. 27 is a functional diagram of the numerical value retrieval executing unit 625 in the retrieval executing unit 622. The components identical to those described with respect to FIG. 21 are denoted by the same reference numerals, and description therefor is omitted.

As depicted in FIG. 27, the numerical value retrieval executing unit 625 includes an acquiring unit 2701, a numerical value compressing unit 2702, a detecting unit 2703, an intermediate numerical value group determining unit 2704, an appearance map extracting unit 2705, an omitted map setting unit 2706, a lower limit/upper limit map generating unit 2707, a specifying unit 2708, a compressed information retrieving unit 2709, a boundary condition determining unit 2710, and a designating unit 2711.

The acquiring unit 2701 acquires a numerical value that defines the boundary of an arbitrary numerical value range. A numerical value range is a range that is specified by a numerical value and an operator each defining the boundary of the range. A numerical value defining the boundary includes a numerical value Nx defining the lower limit of the numerical value range (lower limit numerical value), and a numerical value Ny defining the upper limit of the numerical value range (upper limit numerical value). An operator defining the boundary represents an inequality, such as "$\leq$", "<", "$\geq$", and ">", serving as a boundary condition by a lower limit numerical value or an upper limit numerical value.

Thus, when an arbitrary numerical value Z is given, the acquiring unit 2701 can set the following numerical value ranges that a numerical value N may take as a result of user input or initial setting of an operator.

Nx<Z
Nx$\leq$Z
Nx>Z
Nx$\geq$Z
Nx<Z<Ny
Nx$\leq$Z<Ny
Nx<Z$\leq$Ny
Nx$\leq$Z$\leq$Ny The numerical value compressing unit 2702 compresses a numerical value acquired by the acquiring unit 2701. Specifically, the numerical value compressing unit 2702 compresses the numerical value into compressed information including a compressed code for a feeder for numerical value recognition, a compressed code for a two-byte/one-byte bit, a compressed code for a comma presence/absence bit, a compressed code for the number of places, a compressed code for a numeral in each place, and a compressed code for a decimal point (when the numerical value includes the decimal point). A numerical value in each compressed forms file Fi is compressed in this manner. The two-byte/one-byte bit, the comma presence/absence bit, and the respective compression codes therefor are all set to "0" (OFF).

The detecting unit 2703 detects the number of places and the head numeral of a boundary-defining numerical value acquired by the acquiring unit 2701. For example, when the numerical value N is 12,345, the number of places is "5" and the head number is "1". When the numerical value includes a decimal point, the number of places following the decimal point is also counted. For example, when the numerical value N is 12,345.67, the number of places is "7" and the head number is "1". While the uppermost place is regarded as the head place, a series of upper-ranked places from the head may be regarded as the head place. For example, in the case of the numerical value N (N=12,345), the head numeral may be regarded as "12".

The intermediate numerical value group determining unit 2704 determines whether an intermediate numerical value group is included in a numerical value range acquired by the acquiring unit 2701. An intermediate numerical value group is a numerical value group that is present between a numerical value group having the lower limit numerical value of the numerical value range (hereinafter "lower limit numerical value group") and a numerical value group having the upper limit numerical value of the numerical value range (hereinafter "upper limit numerical value group"). If the lower limit numerical value group is different in the number of places from the upper limit numerical value group, the presence of the intermediate numerical value group is concluded. If the number of places are the same but the head numerals are different, the presence of the intermediate numerical value group is also concluded.

For example, when a numerical value range is "3,700 or more to 6,300 or less", a numerical value group including numerical values with four places and the head numeral of 3 are detected as a lower limit numerical value group, and a numerical value group including numerical values with four places and the head numeral of 6 are detected as an upper limit numerical value group. In this case, a numerical value group including numerical values with four places and the head numeral of 4 and a numerical value group including numerical values with four places and the head numeral of 5 are intermediate numerical value groups within the numerical value range.

Further, when a numerical value range is "3,700 to 16,300", a numerical value group including numerical values with four places and the head numeral of 3 are detected as a lower limit numerical value group, and a numerical value group including numerical values with five places and the head numeral of 1 are detected as an upper limit numerical value group. In this case, a numerical value group including numerical values with four places and the head numeral of 4 to a numerical value group including numerical values with four places and the head numeral of 9 are intermediate numerical value groups within the numerical value range.

When a numerical value range is "3,700 to 4,300", a numerical value group including numerical values with four places and the head numeral of 3 are detected as a lower limit numerical value group, and a numerical value group including numerical values with four places and the head numeral of 4 are detected as an upper limit numerical value group. In this case, there is no intermediate numerical value group within the numerical value range.

Similarly, when a numerical value range is "3,700 to 3,900", a numerical value group including numerical values with four places and the head numeral of 3 are detected as a lower limit numerical value group, and a numerical value group including numerical values with four places and the head numeral of 3 are detected as an upper limit numerical value group, i.e., the lower limit numerical value group and the upper limit numerical values group are the same numerical value group. In this case as well, there is no intermediate numerical value group within the numerical value range.

The appearance map extracting unit 2705 extracts appearance maps corresponding to the number of places and the head numeral detected by the detecting unit 2703, from among appearance maps for numerical value groups. For example, when the detecting unit 2703 detects the number of places "5" and a head numeral "1", the appearance map extracting unit 2705 extracts an appearance map for a numerical value group including numerical values with five places and the head numeral of 1. When an intermediate numerical value group is present, an appearance map for the intermediate numerical value group is also extracted.

The omitted map setting unit 2706 sets an omitted map, based on the appearance map of the intermediate numerical value group. The omitted map is set to calculate the logical product of the omitted map and the appearance map of the lower limit numerical value group and of the omitted map and the appearance map of the upper limit numerical value group. Similar to the appearance map 503 of the numerical value group, the omitted map expresses the presence/absence of a numerical value in a forms file fi in the form of ON-bit and OFF-bit. The omitted map, therefore, indicates that a numerical value within the intermediate numerical value group is present in the forms file fi corresponding to an ON-bit, and that a numerical value within the intermediate numerical value group is not present in the forms file fi corresponding to an OFF-bit.

The omitted map is, specifically, set by calculating the logical sum of appearance maps of intermediate numerical value groups to create an intermediate result map and reversing bits in the intermediate result map. If only one appearance map of the intermediate numerical value group is present, bits in this appearance map are reversed to set the omitted map. If the appearance map of the intermediate numerical value group is not present, an omitted map having OFF-bits only is set.

The upper limit/lower limit map generating unit 2707 generates an upper limit map and a lower limit map. The lower limit map is acquired by calculating the logical product of the appearance map of the lower limit numerical value group (lower limit numerical value group map) and the omitted map, and the upper limit map is acquired by calculating the logical product of the appearance map of the upper limit numerical value group (upper limit numerical value group map) and the omitted map. This logical product calculation creates the lower limit map as a map indicative of the presence/absence of only the numerical values within the lower limit numerical value group, and creates the upper limit map as a map indicative of the presence/absence of only the numerical values within the upper limit numerical value group.

The specifying unit 2708 specifies a compressed file-to-be-retrieved having a numerical value within a numerical value group that satisfies the number of places and a head numeral detected by the detecting unit 2703, among compressed files-to-be-retrieved. Specifically, the specifying unit 2708 specifies the forms file fi corresponding to an ON-bit among bits in the lower limit map to extract the compressed forms file Fi from the compressed forms file group F, and, in the same manner, specifies the forms file fi corresponding to an ON-bit among bits in the upper limit map to extract the compressed forms file Fi from the compressed forms file group F.

The compressed information retrieving unit 2709 retrieves from the compressed forms file Fi specified by the specifying unit 2708, compressed information concerning an in-file numerical value. In the compressed forms file Fi, in-file numerical values are compressed into compressed information including a compression code for a feeder, a compression code for a two-byte/one-byte flag, a compression code for a comma flag, a compression code for the number of places, and a compression code for a numeral in each place. The compressed information retrieving unit 2709 detects compressed information concerning an in-file numerical value (e.g., only the compression code for the feeder) to extract the detected compressed information.

The boundary condition determining unit 2710 compares compressed information of a boundary-defining numerical value compressed by the numerical value compressing unit 2702 with compressed information of an in-file numerical value retrieved by the compressed information retrieving unit 2709 to determine whether the in-file numerical value satisfies a boundary condition by the boundary-defining numerical value. The boundary condition is the condition that represents the size relation between the in-file numerical value and the boundary-defining numerical value, such as the in-file numerical value being equal to or larger than, being equal to or smaller than, being larger than, or being smaller than the boundary-defining numerical value.

For example, compressed codes for numerals of the numbers of places are compared first to compare the sizes of the original pre-compression numerical values with each other. When the numbers of places are identical, compression codes for the head numerals are compared with each other to compare the sizes of the original numerical values with each other. When the head numerals are identical, numerals in the places following the head place are compared sequentially with each other to compare the sizes of the original numerical values with each other. In this way, whether the in-file numerical value satisfies the boundary condition by the boundary-defining numerical value is determined.

Because two-byte/one-byte bits, comma presence/absence bits, and respective compression codes therefor are all set to "0" (OFF) in numerical value compression, the two-byte/one-byte bits, comma presence/absence bits, and compression codes therefor are all set to "0" (OFF) in compressed information when compressed information of the in-file numerical value is compared with compressed information of the boundary-defining numerical value. This allows execution of numerical value retrieval without considering a difference in two-byte/one-byte and/or the presence/absence of a comma.

The designating unit 2711 designates the compressed file-to-be-retrieved Fi specified by the specifying unit 2708 to be a file having a numerical value within the numerical value range, based on a determination result given by the boundary condition determining unit 2710. Specifically, when the in-file numerical value satisfies the boundary condition by the boundary-defining numerical value, the designating unit 2711 designates the compressed file-to-be-retrieved Fi specified by the specifying unit 2708 to be the file having the numerical value within the numerical value range. In this designating process, a lower limit comparison result map and an upper limit comparison result map are used, which maps are expressed by bit strings corresponding to forms files, as the appearance maps are. All bits in the maps are set OFF in the initial setting.

In the compressed forms file Fi, when the in-file numerical value satisfies the boundary condition by the lower limit numerical value, a bit in the lower limit comparison result map that corresponds to the compressed forms file Fi is set ON. Likewise, when the in-file numerical value satisfies the boundary condition by the upper limit numerical value, a bit in the upper limit comparison result map that corresponds to the compressed forms file Fi is set ON.

The designating unit 2711 then calculates the logical sum of the finally acquired lower limit comparison result map, the upper limit comparison result map, and an intermediate result map, if it is present, to designate the compressed forms file Fi having the numerical value within the numerical value range.

When the designating unit 2711 determines the compressed forms file Fi having the numerical value within the numerical value range, the file configuration data specifying unit 2109 specifies the page number j of forms data gj having the in-file numerical value satisfying the boundary condition by the boundary-defining numerical value, and the file number i of the forms file fi to which the forms data gj belongs.

An exemplary case will be described, in which the lower limit numerical value and the upper limit numerical value that define a numerical value range have the same number of places and different numerals at the head places. FIGS. 28A to 28D are explanatory diagrams of examples of size comparison in a numerical value range. In the examples, a numerical value range "3,700 to 6,300 yen" is given and a compressed forms file Fi having an amount of money (numerical value) within the range specified by the numerical value range is retrieved. Numerical value information of the lower limit numerical value "3,700 yen" and that of the upper limit numerical value "6,300 yen" are both compressed by the compressing process of FIG. 16C.

Figure 28A:
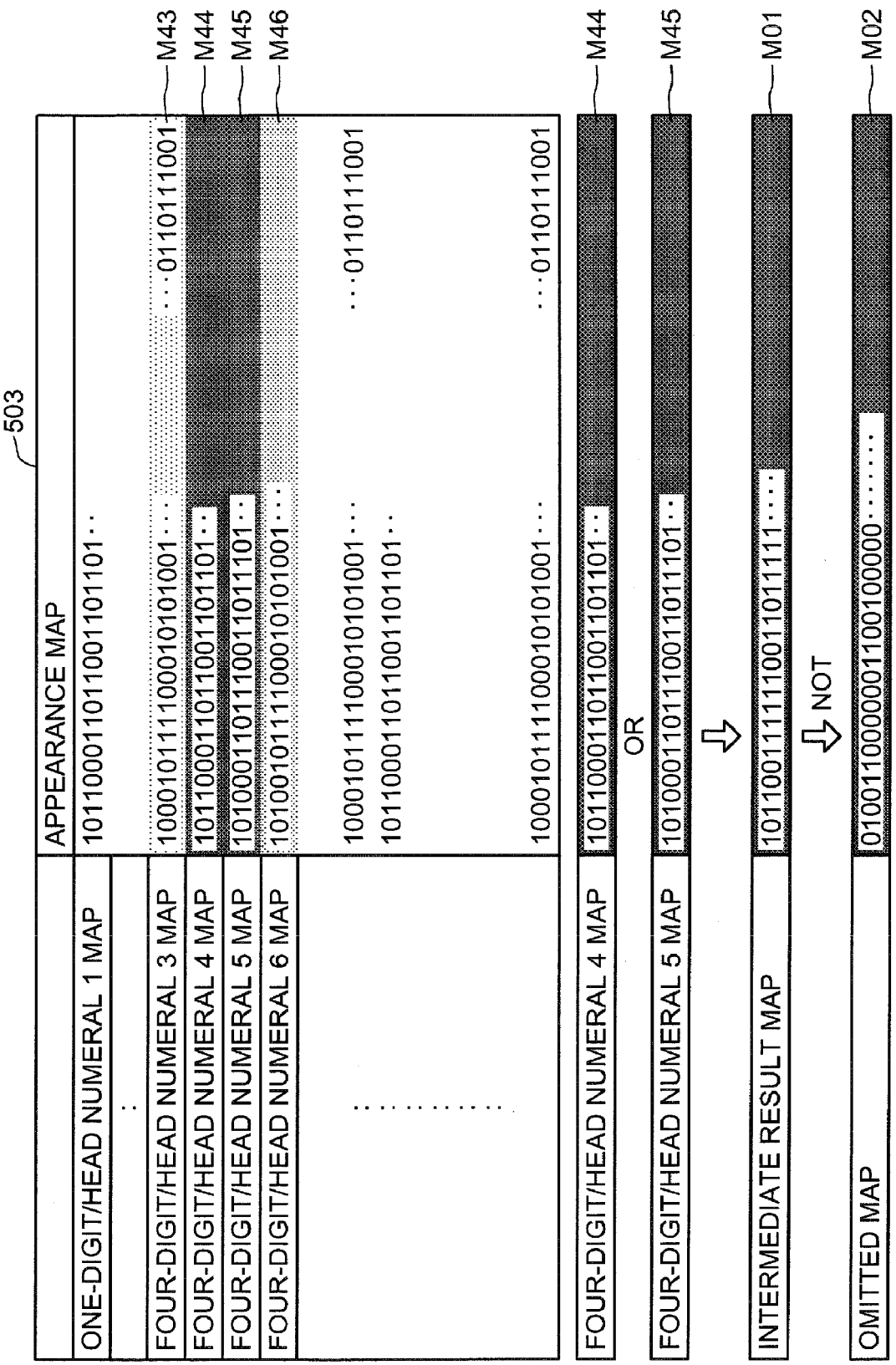

As depicted in FIG. 28A, with respect to the numerical value range "3,700 to 6,300 yen", an appearance map of an intermediate numerical value group is extracted first. Specifically, a four-place/head numeral 4 map M44 and a four-place/head numeral 5 map M45 are extracted as appearance maps of the intermediate numerical value group, the maps M44 and M45 being present between a four-place/head numeral 3 map M43 equivalent to an appearance map of a lower limit numerical value group and a four-place/head numeral 6 map M46 equivalent to an appearance map of an upper limit numerical value group.

The four-place/head numeral 3 map M43 represents the presence/absence of a forms file fi having a numerical value with four places and the head numeral of 3. The four-place/head numeral 4 map M44 represents the presence/absence of a forms file fi having a numerical value with four places and the head numeral of 4. The four-place/head numeral 5 map M45 represents the presence/absence of a forms file fi having a numerical value with four places and the head numeral of 5. The four-place/head numeral 6 map M46 represents the presence/absence of a forms file fi having a numerical value with four places and the head numeral of 6.

The four-place/head numeral 3 map M43 and the four-place/head numeral 6 map M46 are the appearance maps that are used for size comparison. The four-place/head numeral 4 map M44 and the four-place/head numeral 5 map M45 are subjected to logical sum calculation to create an intermediate result map M01, which represents the presence/absence of a forms file fi having numerical values 4000 to 5999. Bits on this intermediate result map M01 are reversed to acquire an omitted map M02.

As depicted in FIG. 28B, the logical product of the four-place/head numeral 3 map M43 and the omitted map M02 of FIG. 28A is calculated to acquire a lower limit map M03. Calculating the logical product of the four-place/head numeral 3 map M43 and the omitted map M02 eliminates a forms file having a numerical value within the intermediate numerical value group.

A compressed forms file Fi with an ON-bit is extracted from the lower limit map M03. The extracted compressed forms file Fi is then searched from the head thereof to find a compression code "1011" for a feeder ("x'B'" in FIG. 28B). When the compression code "1011" for the feeder is found, compressed information 2801 having the compression code "1011" for the feeder at its head is read out. When a two-byte/one-byte bit and a comma presence/absence bit in the compressed information 2801 are respectively "1", both bits are turned to "0" in masking conversion. The compressed information resulting from the masking conversion is referred to as compressed information to-be-compared 2810.

The compressed information to-be-compared 2810 acquired by compressing numerical value information "3,300 yen" in the compressed forms file Fi is then compared with lower limit compressed information 2802 acquired by compressing lower limit numerical value information "3,700 yen". First, compression codes for feeders, for the number of places, and for the head numerals of the compressed information to-be-compared 2810 and the lower limit compressed information 2802 are compared with each other for matching. If, at this stage, any one type of compressed codes do not match, the next feeder in the compressed forms file Fi is retrieved.

When the compression codes for the feeders match, it indicates that the compressed information to-be-compared 2810 and the lower limit compressed information 2802 are the same type of numerical value information. When the numbers of places match, it indicates that the compressed information to-be-compared 2810 is at least a compressed form of a numerical value of a four-digit number. When the head numerals match, it indicates that the compressed information to-be-compared 2810 is at least a compressed form of a numerical value with the head numeral of "3". When all of the compression codes for the feeders, the number of places, and the head numerals match, therefore, compression codes for numerals in the same place are compared in size.

In this example, compression codes for the second numerals are compared revealing that the lower limit numerical value information "3,700 yen" is larger than the numerical value information "3,300 yen" in the compressed information to-be-compared 2810. In this case, the bit corresponding to the compressed forms file Fi remains "0" in the lower limit comparison result map M04. Subsequently, the next feeder in the compressed forms file Fi is retrieved. When numerical value information equal to or larger than the lower limit numerical value information "3,700 yen" is present, the bit corresponding to the compressed forms file Fi is turned to "1" in the lower limit comparison result map M04.

This comparison process is carried out on each of the compressed forms files F0 to Fn for which a bit is ON in the lower limit map M03 to acquire the lower limit comparison result map M04. In this manner, the compressed forms file Fi having a numerical value with four places and the head numeral of "3" is extracted from the lower limit map M03. This enables the forms file fi to be retrieved in its compressed form.

As depicted in FIG. 28C, the logical product of the four-place/head numeral 6 map M46 and the omitted map M02 of FIG. 28A is calculated to acquire an upper limit map M05.

Calculating the logical product of the four-place/head numeral 3 map M43 and the omitted map M02 eliminates a forms file having a numerical value within the intermediate numerical value group.

A compressed forms file Fi with an ON-bit is extracted from the upper limit map M05. The extracted compressed forms file Fi is then searched from the head thereof to find a compression code "1011" for a feeder ("x'B'" in FIG. 28C). When the compression code "1011" for the feeder is found, compressed information 2803 having the compression code "1011" for the feeder at its head is read out. When a two-byte/one-byte bit and a comma presence/absence bit in the compressed information 2803 are respectively "1", both bits are turned to "0" in masking conversion. The compressed information resulting from the masking conversion is referred to as compressed information to-be-compared 2830.

The compressed information to-be-compared 2830 acquired by compressing numerical value information "6,200 yen" in the compressed forms file Fi is then compared with upper limit compressed information 2804 acquired by compressing upper limit numerical value information "6,300 yen". First, compression codes for feeders, for the number of places, and for the head numerals of the compressed information to-be-compared 2830 and the upper limit compressed information 2804 are compared with each other for matching. If, at this stage, any one type of compression codes do not match, the next feeder in the compressed forms file Fi is retrieved.

When the compression codes for the feeders match, it indicates that the compressed information to-be-compared 2830 and the upper limit compressed information 2804 are the same type of numerical value information. When the numbers of places match, it indicates that the compressed information to-be-compared 2830 is at least a compressed form of a numerical value of a four-digit number. When the head numerals match, it indicates that the compressed information to-be-compared 2830 is at least a compressed form of a numerical value with the head numeral of "6". When all of the compression codes for the feeders, the number of places, and the head numerals match, therefore, compression codes for numerals in the same place are compared in size.

In this example, compression codes for the second numerals are compared revealing that the upper limit numerical value information "6,300 yen" is larger than the numerical value information "6,200 yen" in the compressed information to-be-compared 2830. In this case, the bit corresponding to the compressed forms file Fi is changed to "1" in the upper limit comparison result map M06.

This comparison process is carried out on each of the compressed forms files Fi for which a bit is ON in the upper limit map M05 to acquire the upper limit comparison result map M06. In this manner, the compressed forms file Fi having a numerical value with four places and the head numeral of "6" is extracted from the upper limit map M05. This enables the forms file fi to be retrieved in its compressed form.

Figure 28D:
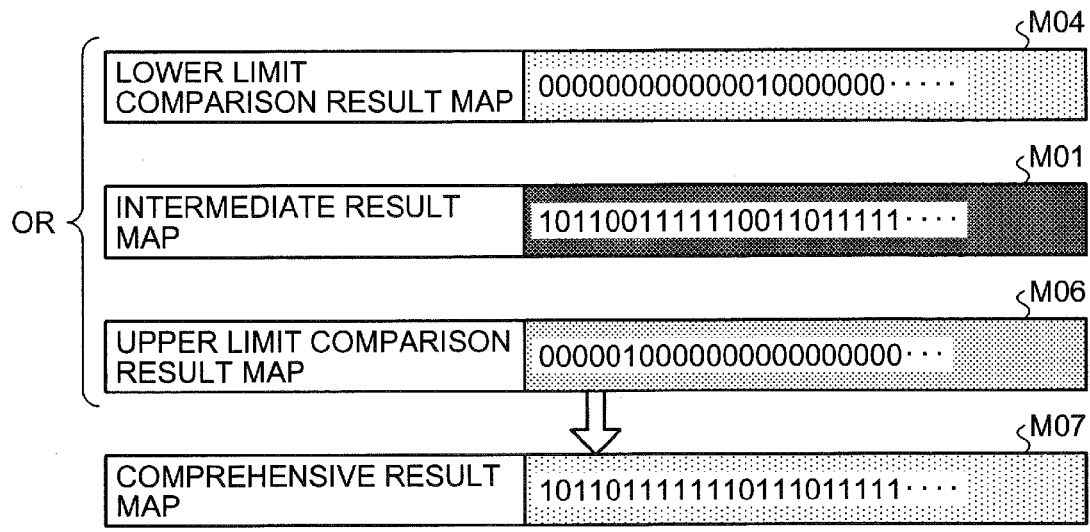

As depicted in FIG. 28D, the logical sum of the lower limit comparison result map M04, the intermediate result map M01, and the upper limit comparison result map M06 is calculated to acquire a comprehensive result map M07. Hence, a forms file fi having numerical value information within the numerical value range "3,700 yen to 6,300 yen" can be specified remaining in a compressed form.

In the examples depicted in FIGS. 28A to 28D, the lower limit numerical value and the upper limit numerical value that define the numerical value range have the same number of places and different numerals in the head places. The above size comparison, however, may also be carried out even when the number of places of the upper limit numerical value is larger (or the number of places of the lower limit numerical value is smaller). For example, when a numerical value range is "3,700 yen to 64,000 yen", four-place/head numeral 4 map to four-place/head numeral 9 map and five-place/head numeral 1 map to five-place/head numeral 5 map are extracted as appearance maps of an intermediate numerical value group.

When a numerical value range is "3,700 yen to 3,900 yen", "3,700 yen to 4,500 yen", etc., an intermediate numerical value group is not present, so that the intermediate result map M01 is not present. In this case, therefore, all bits in the omitted map M02 are set to OFF. Because of the absence of the intermediate result map M01, the comprehensive result map M07 is acquired by calculating the logical sum of the lower limit comparison result map M04 and the upper limit comparison result map M06.

Figure 29:
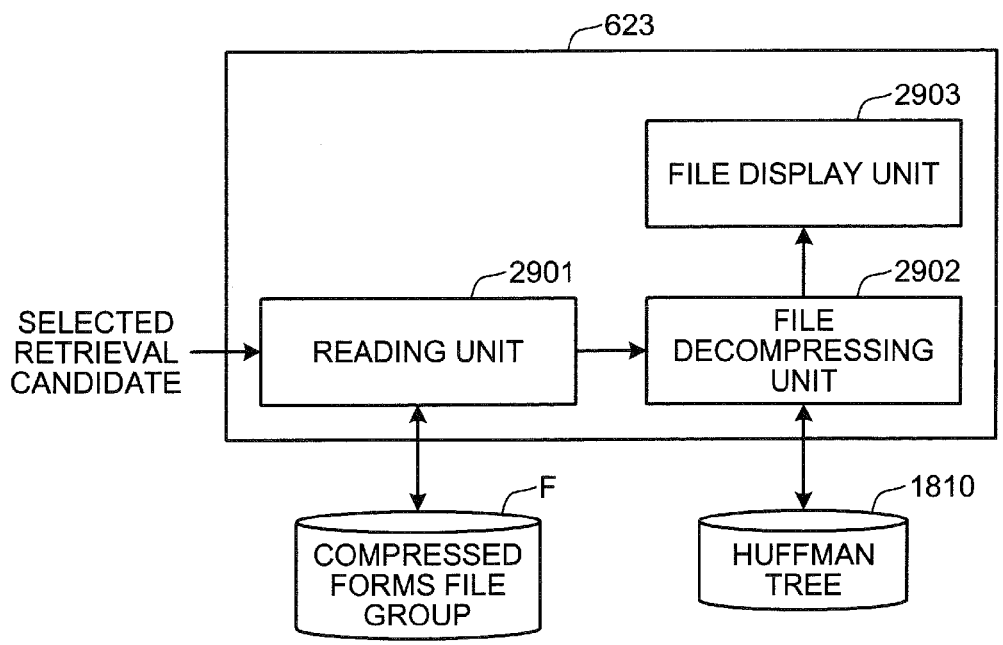
FIG. 29 is a functional diagram of a retrieval result display unit depicted in FIG. 6.

FIG. 29 is a functional diagram of the retrieval result display unit 623 depicted in FIG. 6. As depicted in FIG. 29, the retrieval result display unit 623 includes a reading unit 2901, a file decompressing unit 2902, and a file display unit 2903.

The file decompressing unit 2902 reads from a compressed forms file Fi in the compressed forms file group F, item data, which is a retrieval candidate selected by the retrieval candidate selecting unit 2111. The file decompressing unit 2902 decompresses the item data read out by the reading unit 2901, using the Huffman tree 1801. The file display unit 2903 displays the item data decompressed by the file decompressing unit 2902 as a retrieval result.

Figure 30:
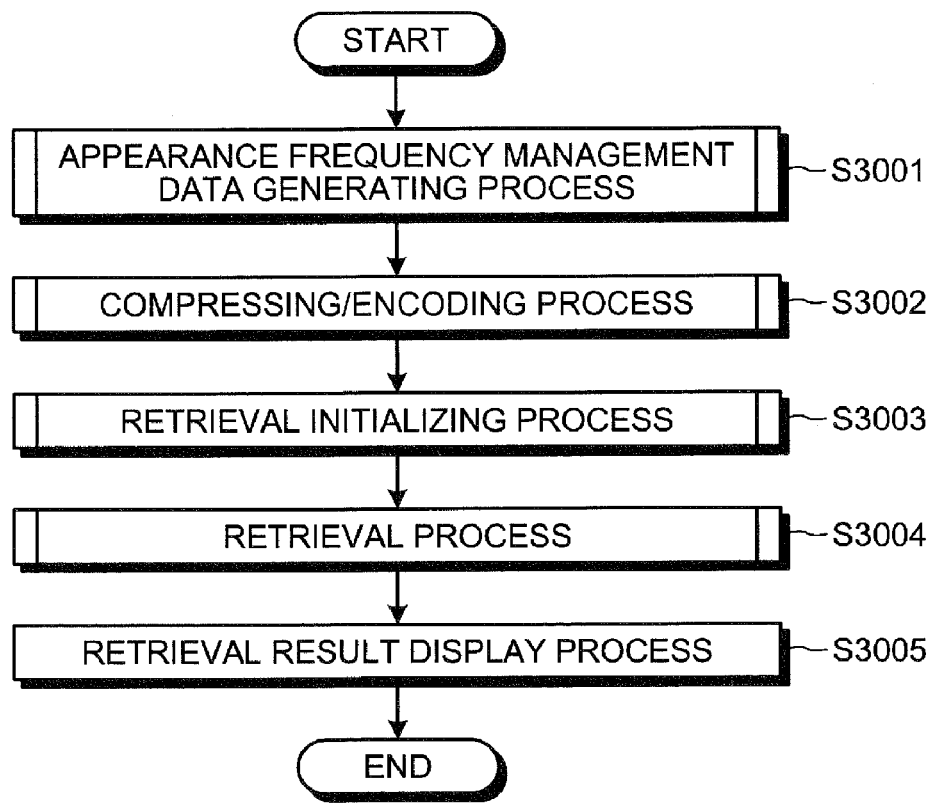
FIG. 30 is a flowchart of an information retrieval process by the information retrieval apparatus according to the embodiment of the present invention.

FIG. 30 is a flowchart of an information retrieval process by the information retrieval apparatus 600 according to the embodiment of the present invention. As depicted in FIG. 30, the appearance frequency management data generating unit 612 executes an appearance frequency management data generating process (step S3001).

The compressing/encoding unit 613 then executes a compressing/encoding process (step S3002). Subsequently, the retrieval initializing unit 621 executes a retrieval initializing process (step S3003). The retrieval executing unit 622 then executes a retrieval process (step S3004).

Finally, the retrieval result display unit 623 executes a retrieval result display process (step S3005). In the retrieval result display process, a retrieval candidate (item data) selected from a retrieval candidate list is read out from the compressed forms file Fi, and is decompressed using the Huffman tree 1810 to display the full text of the item data as a retrieval result.

FIG. 31 is a flowchart of the appearance frequency management data generating process (step S3001) of FIG. 30. As depicted in FIG. 31, an initializing process is executed (step S3101). Specifically, a totaling area corresponding to the row/column code of 8-bit/16-bit numerical value/character data, consecutive characters data, and binary data is established, and segments, etc., of the appearance frequency and the appearance map are initialized. The code for numerical value/character data is set, and various counters are initialized.

A numerical value/character appearance frequency totaling process is then executed (step S3102). A detailed procedure of the numerical value/character appearance frequency totaling process will be described later. Following the numerical value/character appearance frequency totaling process, an area for the appearance frequency management data 500 is established and initialized (step S3103), and the character code and appearance frequency of 8-bit/16-bit numerical value/character data, consecutive characters data, and binary data is set (step S3104).

Respective segments of the appearance map are linked (step S3105), and consecutive characters data in the consecutive characters area are sorted in descending order of appearance frequency (step S3106) to select 256 types of consecutive characters data. This reduces the volume of consecutive characters data.

Subsequently, a consecutive characters/non-standard character substitution process is carried out, and the substitution table 640 is generated (step S3107). Specifically, consecutive characters data is substituted with non-standard character data in descending order of appearance frequency to generate consecutive characters/non-standard character data and the substitution table 640.

Consecutive charters data with a low appearance frequency, that is, consecutive characters data not substituted with non-standard character data, is fragmented into single character data, which are allocated to the corresponding areas in a revision process (step S3108). Specifically, consecutive charters data with a low appearance frequency is divided into phonogramic data, the frequency of which is subject to addition and the appearance map of which is subject to logical OR calculation.

Subsequently, numerical value/character data is sorted in descending order of appearance frequency (step S3109) and numerical value/character data having zero frequency is cut out, and then consecutive characters/non-standard character data and binary data is combined together (step S3110). The appearance frequency management data 500 resulting from the joining is output to a file (step S3111) after which the procedure proceeds to step S3002.

Figure 32A:
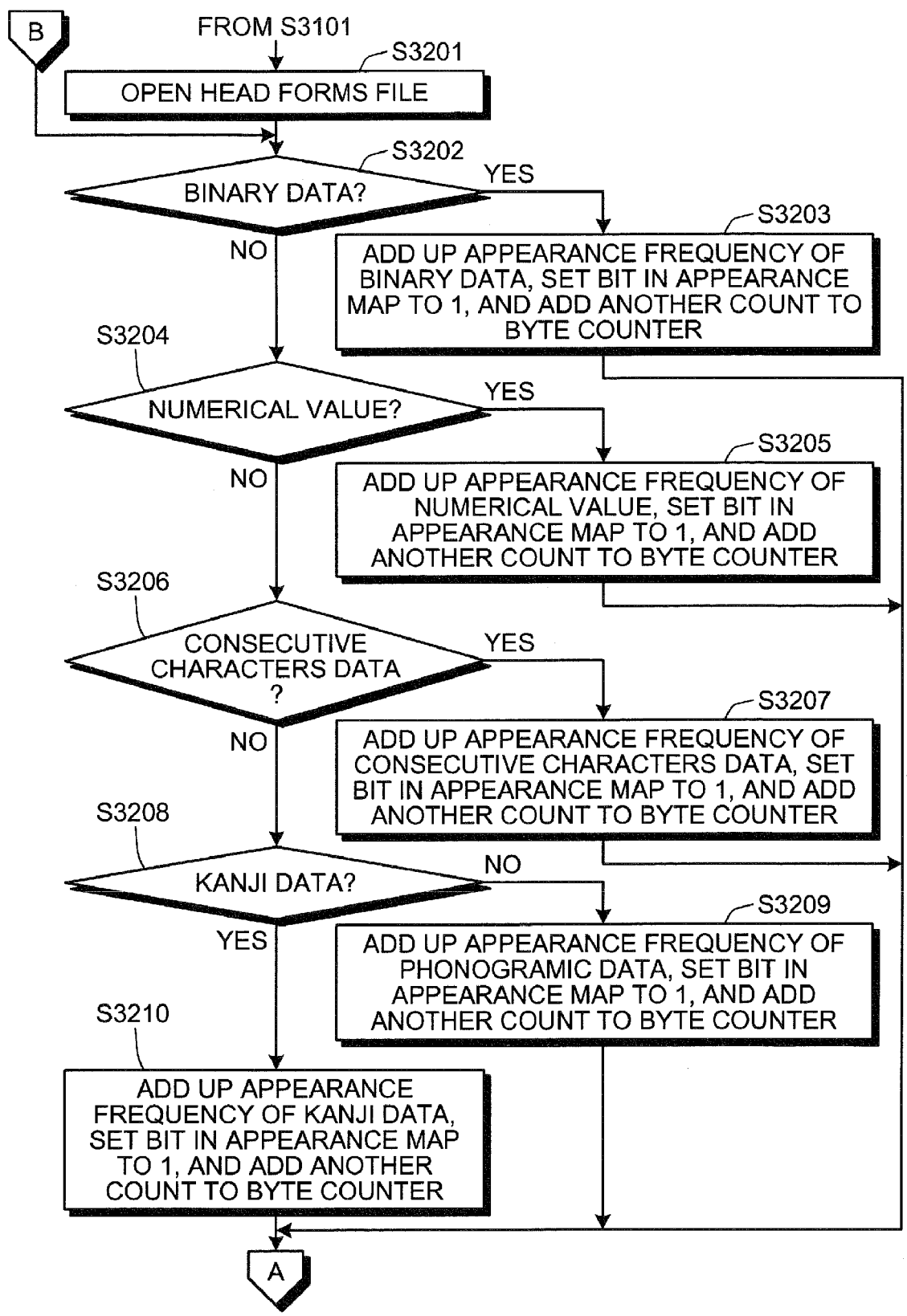
FIG. 32A is a (first half) flowchart of a numerical value/character appearance frequency totaling process (step S3102)

FIG. 32A is a (first half) flowchart of the numerical value/character appearance frequency totaling process (step S3102). As depicted in FIG. 32A, the head forms file f0 is opened first (step S3201).

Data is extracted sequentially from the opened forms file. When extracted data is binary data (step S3202: YES), the appearance frequency of the binary data is added, and the bit corresponding to the opened file on the appearance map of the binary data is set to "1", and then a byte counter adds an additional count (step S3203), after which the procedure proceeds to step S3211 of FIG. 32B.

When extracted data is not binary data at step S3202 (step S3202: NO), whether the extracted data is a numerical value is determined (step S3204). For example, the extracted data of a numerical string consisting of numerals is determined to be a numerical data. The extracted data of a numerical string including a comma "," and a decimal point "." in addition to numerals is also determined to be a numerical value.

When the extracted data is a numerical value (step S3204: YES), the appearance frequency of the numerical value is added, and the bit corresponding to the opened file on the appearance map of the numerical value is set to "1", and then the byte counter adds an additional count (step S3205), after which the procedure proceeds to step S3211 of FIG. 32B.

When the extracted data is not a numerical value at step S3204 (step S3204: NO), whether the extracted data is consecutive characters data is determined (step S3206). When the extracted data is consecutive characters data (step S3206: YES), the appearance frequency of the consecutive characters data is added, and the bit corresponding to the opened file on the appearance map of the consecutive characters data is set to "1", and then the byte counter adds an additional count (step S3207), after which the procedure proceeds to step S3211 of FIG. 32B.

When the extracted data is not consecutive character data at step S3206 (step S3206: NO), whether the extracted data is kanji data is determined (step S3208). When the extracted data is not kanji data (step S3208: NO), the extracted data is phonogramic data. Accordingly, the appearance frequency of the phonogramic data is added, and the bit corresponding to the opened file on the appearance map of the phonogramic data is set to "1", and then the byte counter adds an additional count (step S3209), after which the procedure proceeds to step S3211 of FIG. 32B.

When the extracted data is kanji data at step S3208 (step S3208: YES), the appearance frequency of the kanji data is added, and the bit corresponding to the opened file on the appearance map of the kanji data is set to "1", and then the byte counter adds an additional count (step S3210), after which the procedure proceeds to step S3211 of FIG. 32B.

Figure 32B:
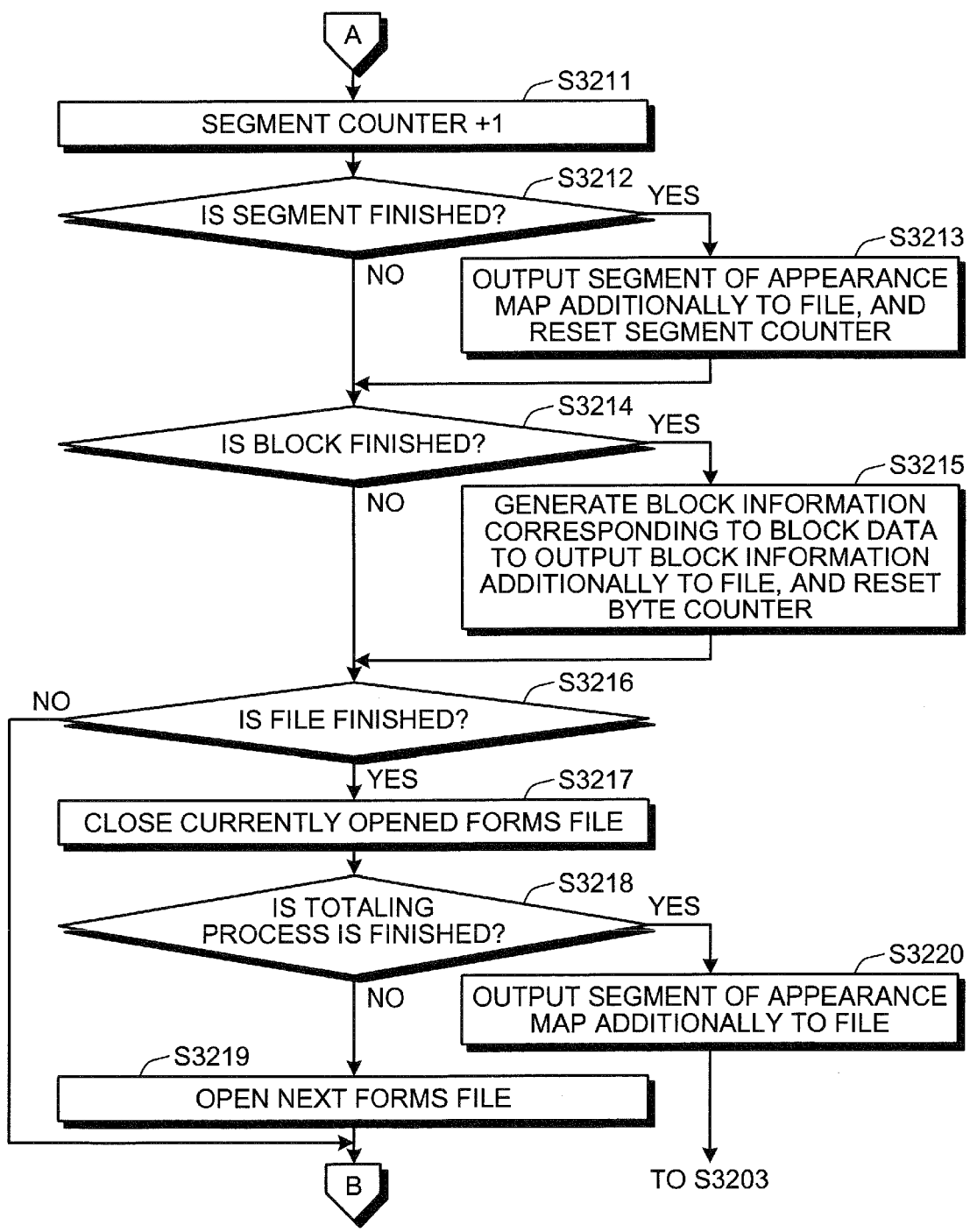
FIG. 32B is a (second half) flowchart of the numerical value/character appearance frequency totaling process (step S3102)

FIG. 32B is a (second half) flowchart of the numerical value/character appearance frequency totaling process (step S3102). As depicted in FIG. 32B, a segment counter for segments of the appearance map adds an additional count (step S3211), and whether a segment is finished, that is, whether the totaling process with respect to the segments is finished is determined (step S3212). When the totaling process with respect to the segments is finished (step S3212: YES), the segment of the appearance map is output additionally to the file, and the segment counter is reset (step S3213), after which the procedure proceeds to step S3214.

When the totaling process on the segments is not finished (step S3212: NO) or after execution of step S3213, whether a block is finished, e.g., whether the total number of numerical value/characters reaches 4,000 characters is determined (step S3214).

When the block is finished (step S3214: YES), block information made up of the file number i of a forms file fi having the block data, and the block number m, offset, number of characters, and length of the block data is generated, and is output additionally to the file, and the byte counter is reset (step S3215), after which the procedure proceeds to step S3216.

When the block is not finished (step S3214: NO) or after execution of step S3215, whether the file is finished, that is, whether the totaling process with respect to the currently opened forms file fi is finished is determined (step S3216). When the totaling process with respect to the currently opened forms file fi is not finished (step S3216: NO), the procedure returns to step S3202 of FIG. 32A, at which the next data is extracted, and the type of the extracted data is specified to perform the totaling process (steps S3202 to S3210).

When the totaling process on the currently opened forms file is over at step S3216 (step S3216: YES), whether the totaling process comes to an end is determined, and the end of the totaling process leads to closing of the currently opened forms file Fi (step S3217). Subsequently, whether the totaling process on each of the forms files F0 to Fn has been completed is determined (step S3218).

When the totaling process on each of the forms files F0 to Fn has not been completed (step S3218: NO), a forms file fi having the next file number i (i=i+1) is opened (step S3219). The procedure then returns to step S3202 of FIG. 32A, at which the next data is extracted, and the type of the extracted data is specified to perform the totaling process (steps S3202 to S3210).

When the totaling process on each of the forms files F0 to Fn has been completed as determined at step S3218 (step S3218: YES), the segment of the appearance map 510 is output additionally to the file (step S3220), after which the procedure proceeds to step S3203 to end a series of processes.

Figure 33:
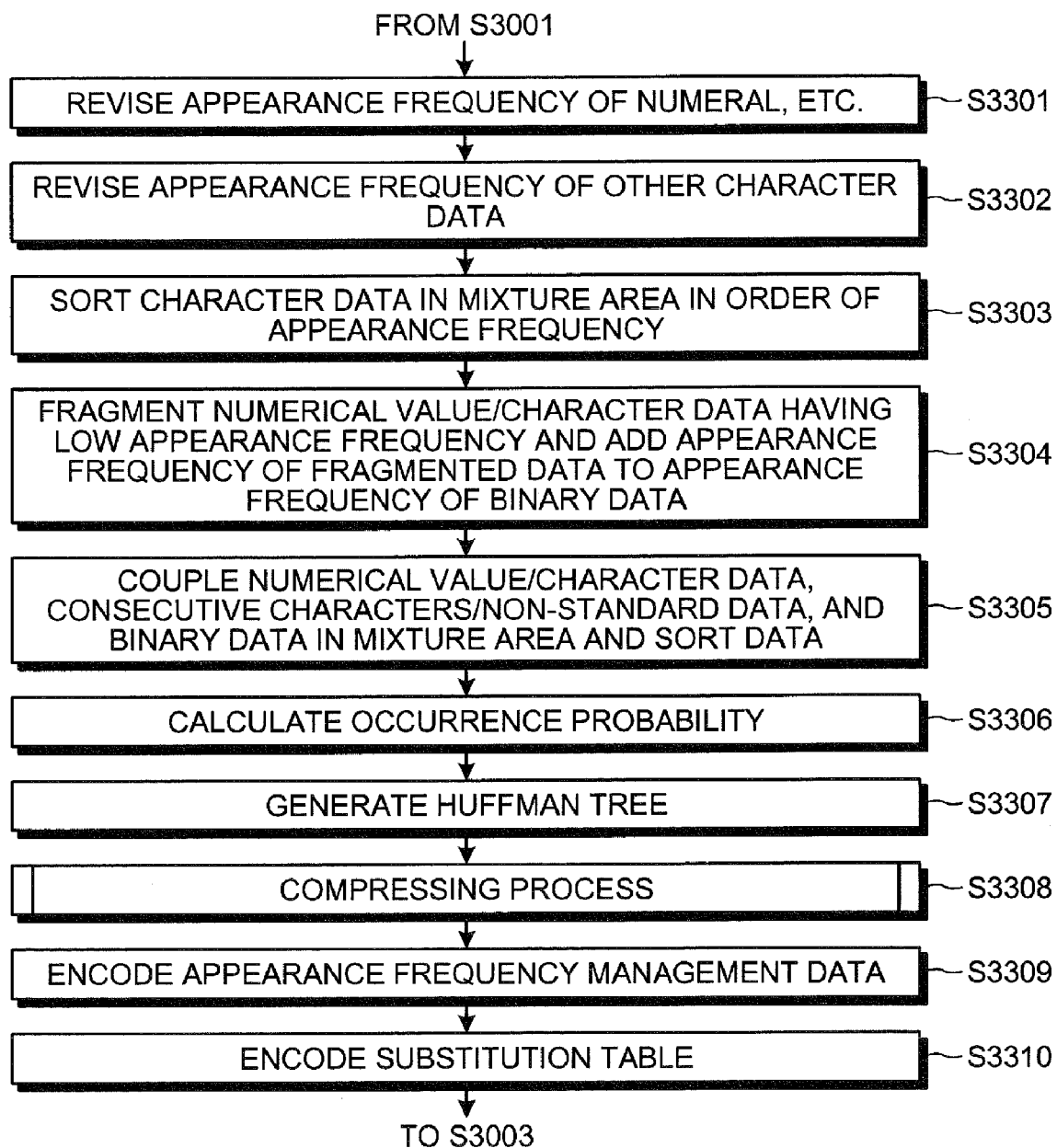
FIG. 33 is a flowchart of a compressing/encoding process (step S3002) of FIG. 30.

FIG. 33 is a flowchart of the compressing/encoding process (step S3002) of FIG. 30. As depicted in FIG. 33, the appearance frequencies of a numeral, a decimal point, and a feeder (hereinafter "numeral, etc.") are revised (step S3301), and the appearance frequency of other character data is also revised (step S3302).

Subsequently, numerical value/character data in the mixture area 812 are sorted in the order of appearance frequency (step S3303). Numerical value/character data with a low appearance frequency is fragmented into 8-bit data, of which the appearance frequency is added to the appearance frequency of binary data corresponding to the 8-bit data (step S3304). Numerical value/character data, consecutive characters/non-standard data, and binary data in the mixture area 812 are linked, and sorted in the order of appearance frequency (step S3305).

Subsequently, the occurrence probability of each type of sorted numerical value/character data is calculated based on the revised appearance frequency (step S3306). Based on the calculated occurrence probability, a Huffman tree common to 8-bit/16-bit numerical value/character data is generated (step S3307).

A compressing process of compressing each of the forms file is then carried out (step S3308). A specific procedure of this compressing process will be described later. The appearance frequency management data 500 is encoded (step S3309). Specifically, an encoding area of the appearance frequency management data 500 (area for numerical value/character data and appearance frequency) is encoded through exclusive-OR (XOR), using a master key.

The substitution table 640 is then encoded (step S3310). Specifically, an encoding area of the substitution table 640 is encoded through exclusive-OR (XOR), using a master key. Subsequently, the procedure proceeds to the retrieval initializing process (step S3003) to end a series of processes.

Figure 34:
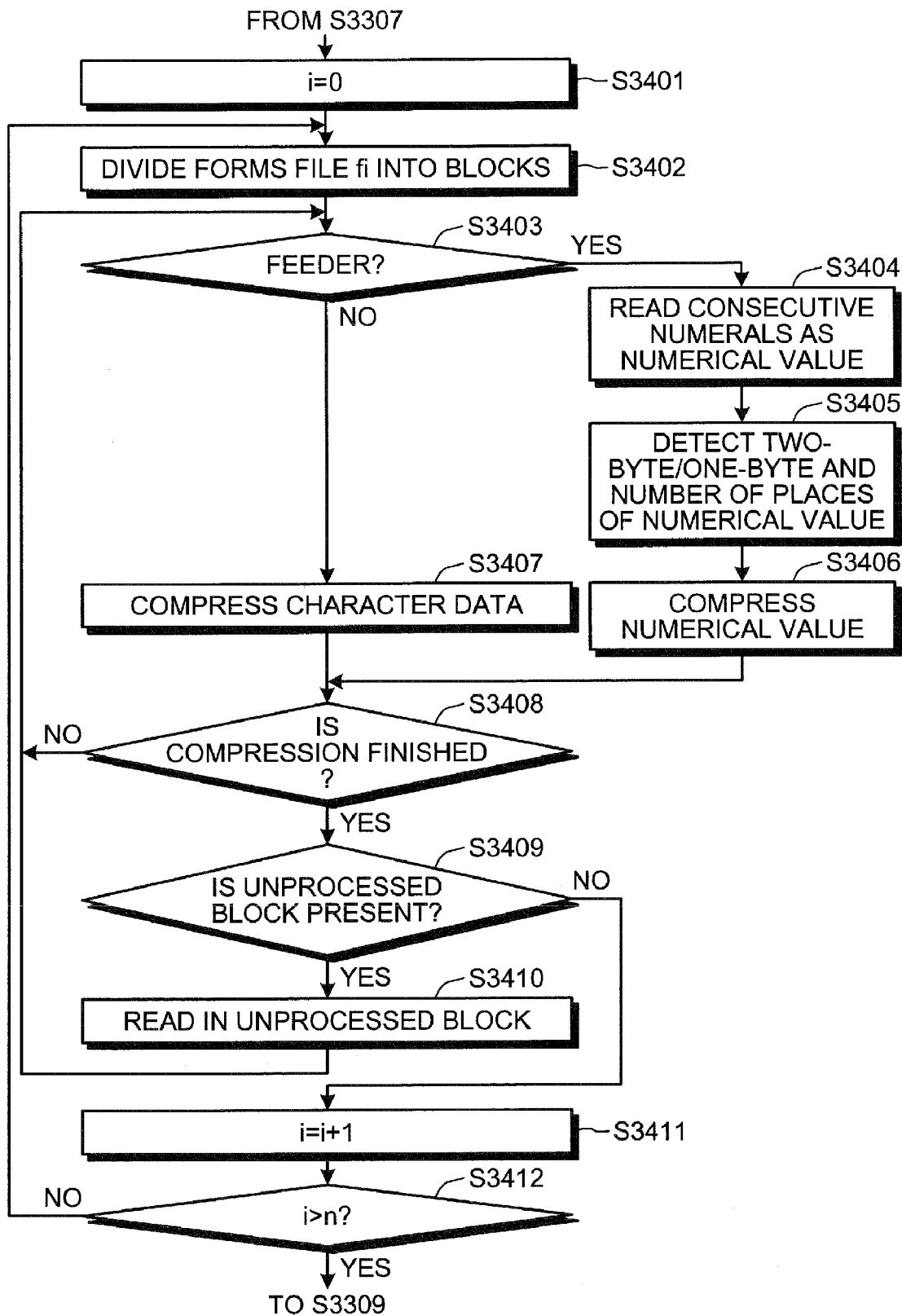
FIG. 34 is a flowchart of a compressing process of step S3308 of FIG. 33.

FIG. 34 is a flowchart of the compressing process of step S3308 of FIG. 33. First, the file number i is set to 0 (step S3401), and the forms file i is divided into blocks of, for example, 4,000 characters (step S3402). Subsequently, data in the forms file i are read in sequentially, and whether read data is a feeder is determined (step S3403).

When the read data is determined to be the feeder (step S3403: YES), a series of numerals following the feeder are read in as a numerical value (step S3404), and the two-byte or one-byte and the number of places of the numerical value are detected (step S3405). The numerical value is then compressed using the Huffman tree (step S3406), after which the procedure proceeds to step S3408.

When the read data is determined to be not the feeder (step S3403: NO), the data is other character data, which is then compressed using the Huffman tree (step S3407) after which the procedure proceeds to step S3408.

At step S3408, whether the compression process in the current block is over is determined (step S3408). When the compression process is not finished (step S3408: NO), the procedure returns to step S3403, at which the next data is read in. When the compression process is over (step S3408: YES), whether an unprocessed block is present is determined (step S3409).

When an unprocessed block is present (step S3409: YES), the unprocessed block is read in (step S3410), and the procedure returns to step S3403, at which data is read in. When an unprocessed block is not present (step S3409: NO), the file number i is increased by 1 (step S3411), and whether i>n is satisfied is determined (step S3412).

When i>n is not satisfied (step S3412: NO), the procedure returns to step S3402, at which the next forms file i is divided into blocks. When i>n is satisfied (step S3412: YES), the procedure proceeds to step S3309 of FIG. 33. Hence, a series of processes making up the compressing process are ended.

Figure 35:
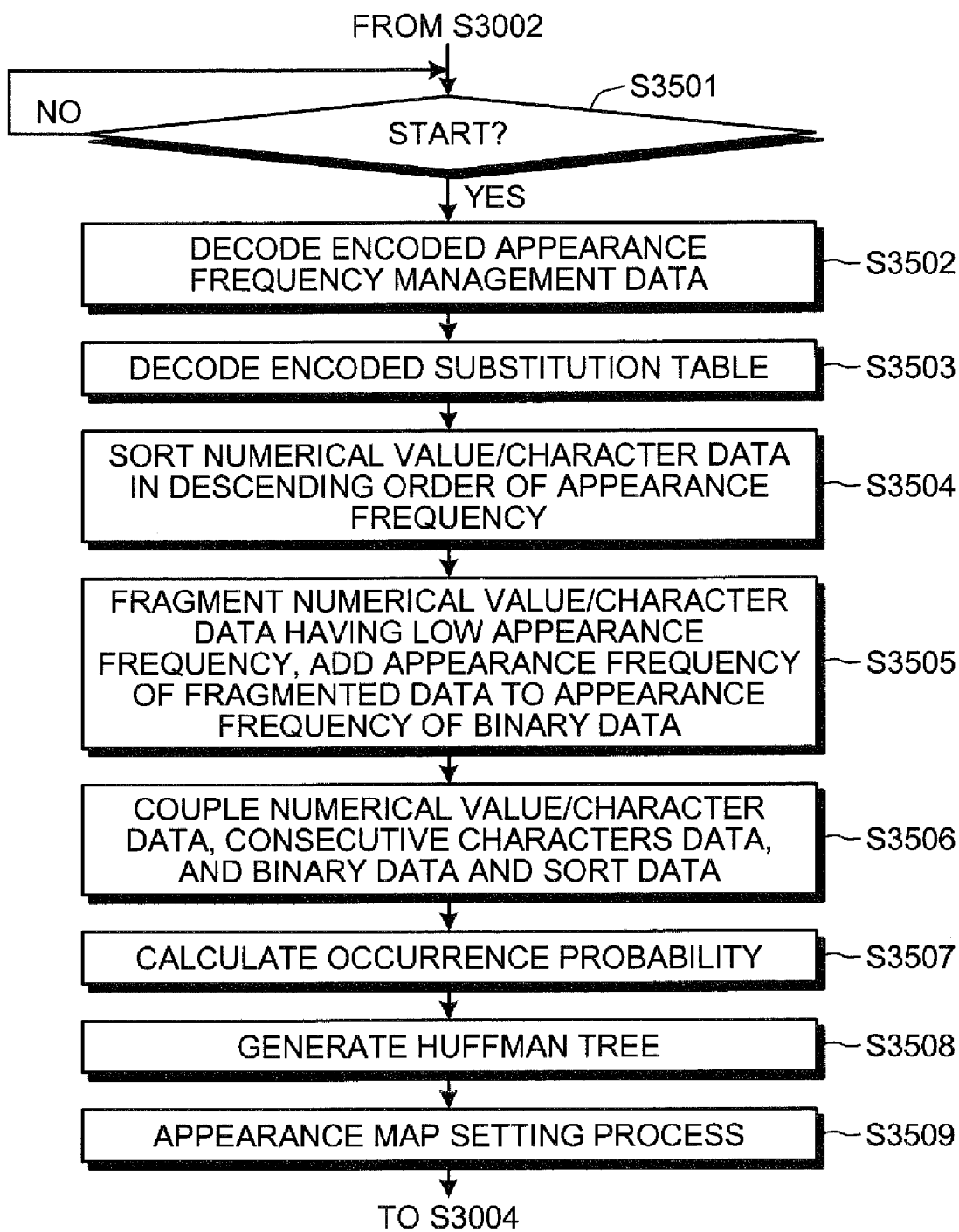
FIG. 35 is a flowchart of a retrieval initializing process (step S3303) of FIG. 30.

FIG. 35 is a flowchart of the retrieval initializing process (step S3303) of FIG. 30.

As depicted in FIG. 35, the start of the retrieval initializing process is waited for (step S3501: NO). When the retrieval initializing process starts (step S3501: YES), the encoded appearance frequency management data 650 encode by the compressing/encoding process is decoded (step S3502). Specifically, the encoding area of the encoded appearance frequency management data 650 (area for numerical value/character data and appearance frequency) is decoded through exclusive-OR (XOR), using the master key used in the encoding process.

The encoded substitution table 660 is decoded (step S3503). Specifically, the encoding area of the encoded substitution table 660 is decoded through exclusive-OR (XOR), using the master key used in the encoding process.

Processes identical to the processes at steps S3401 to S3405 in the compressing/encoding process are then carried out. Specifically, numerical value/character data is sorted in descending order of appearance frequency (step S3504), and numerical value/character data having a low appearance frequency is fragmented into 8-bit data, of which the appearance frequency is added to the appearance frequency of binary data corresponding to the 8-bit data (step S3505).

Numerical value/character data, consecutive characters data, and binary data are linked, and sorted in descending order of appearance frequency (step S3506). Subsequently, the occurrence probability of each type of sorted numerical value/character data is calculated based on the appearance frequency (step S3507). Based on the calculated occurrence probability, a Huffman tree common to 8-bit/16-bit numerical value/character data is generated (step S3508).

Subsequently, a process of setting the appearance map 510 is carried out (step S3509). Specifically, an area for the first row/column corresponding table and the second row/column corresponding table is established, the appearance frequency of each of character data is set to the first row/column corresponding table, the appearance frequency of each of numerical value data is set to the second row/column corresponding table, the appearance map of the decoded appearance frequency management data 500 is expanded on a memory, and the appearance map is linked to the first row/column corresponding table and to the second row/column corresponding table. Subsequently, the procedure proceeds to the retrieval process (step S3004) to end a series of processes.

Figure 36:
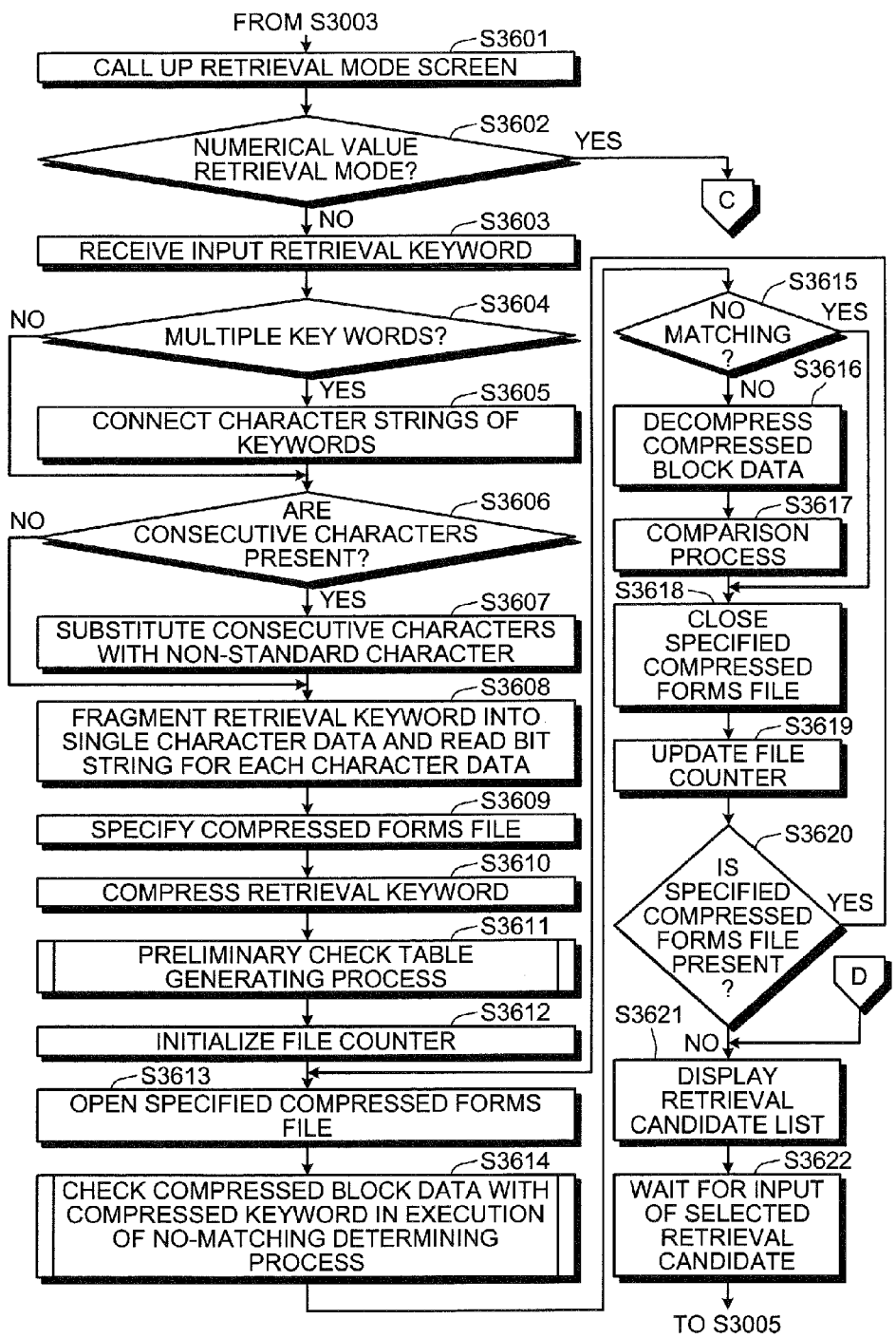
FIG. 36 is a flowchart of the retrieval process (step S3004) of FIG. 30.

FIG. 36 is a flowchart of the retrieval process (step S3004) of FIG. 30. As depicted in FIG. 36, following the retrieval initializing process (step S3003), a retrieval mode screen is called up (step S3601), and selection of a numerical value retrieval mode or of a character retrieval mode is waited for (step S3602).

When the numerical value retrieval mode is selected (step S3602: YES), the procedure proceeds to step S4001 of FIG. 40. When the character retrieval mode is selected (step S3602: NO), an input retrieval keyword is received (step S3603).

When the retrieval keyword does not consist of multiple retrieval keywords (step S3604: NO), the process proceeds to step S3606. When the retrieval keyword consists of multiple keywords (step S3604: YES), character strings of the keywords are connected (step S3605), and the process proceeds to step S3606.

At step S3606, when consecutive characters data is not present in the retrieval keyword (step S3606: NO), the process proceeds to step S3608. When consecutive characters data is present in the retrieval keyword (step S3606: YES), the consecutive characters data is substituted with non-standard character data consisting of two characters, using the substitution table 640 (step S3607) and the process proceeds to step S3608.

At step S3608, the retrieval keyword is fragmented into single character data, and the bit string for each character data indicative of the presence/absence of the character with respect to each forms file is read from the appearance map (step S3608). Subsequently, the logical product of the bit strings indicative of the presence/absence of the character is calculated to specify (i.e., narrow down files to) a compressed forms file (step S3609). The retrieval keyword is compressed using the Huffman tree generated by the retrieval initializing process at step S3003 (step S3610).

A preliminary check table generating process (step S3611) is then executed. A detailed procedure of the preliminary check table generating process will be described later with reference to FIG. 37. Following the generation of the preliminary check table, a file counter is initialized (step S3612).

Subsequently, the compressed forms file specified at step S3609 (hereinafter "specified compressed forms file") is opened (step S3613). Each compressed block data of the opened specified compressed forms file is compared with the compressed keyword in execution of a no-matching determining process (step S3614). This no-matching determining process will be described later with reference to FIG. 38.

In the no-matching determining process, when each of the compressed block data has been determined to not match the compressed keyword (step S3615: YES), the procedure proceeds to step S3618. When any one of compressed block data is determined to match the keyword (step 3615: NO), the compressed block data determined to match is decompressed using the Huffman tree (step S3616). The decompressed block data is then compared with the retrieval keyword, and the file number and the anchor of item data matching the retrieval keyword are recorded (step S3617) then the process proceeds to step S3618.

Subsequently, the opened specified compressed forms file is closed (step S3618), and the file counter is updated (step S3619). When the presence of an unprocessed specified compressed forms file is determined as a result of file counter updating (step S3620: YES), the process proceeds to step S3613, at which the next specified compressed forms file is opened.

When no unprocessed specified compressed forms file are determined to be present (step S3620: NO), the retrieval candidate list is displayed (step S3621), and an input of retrieval candidate selection from a user is waited for (step S3622). The process proceeds to the retrieval result display process (step S3005), ending a series of processes.

In this manner, even if the contents are composed of multiple forms files, the forms files can be processed in common in the form of a single piece of compressed information (appearance frequency management data 500).

The data contents of a forms file of a large size is blocked according to the number of character data. This allows application of the Huffman compression technique to a file-to-be-retrieved having a mixture of 8-bit code character data, 16-bit code character data, and 32-bit code character data.

Blocking is carried out not according to file size (volume) but according to the number of character data, and when the appearance frequency of each type of character data in a forms file is summed, the type of the character data (8-bit code, 16-bit code, and 32-bit code) is determined to total the appearance frequency.

Eight-bit code character data having a high appearance frequency, such as English character data in an English-Japanese dictionary, is substituted with 16-bit code character data, such as "Ox'FF**", and is subjected to Huffman compression. This distinguishes 8-bit code character data with a high appearance frequency from 8-bit code character data with a low appearance frequency to enable efficient compression.

Noncharacter data, such as a pointer, takes a random value, and is, therefore, replaced with an 8-bit code data. For reducing the size of the Huffman tree, 16-bit code character data having a low appearance frequency is divided into 8-bit code character data. This enables efficient compression.

The appearance frequency management data 500, from which the Huffman tree for compression is generated, is encoded entirely or partially. Contents or the Huffman tree for compressing the contents is not directly encoded but the original data from which the Huffman tree is generated is encoded. This improves security.

Based on the appearance frequency management data 500, the speed of full text retrieval is increased. Consecutive characters data consisting of two characters with a high appearance frequency included in consecutive phonogramic data is substituted with non-standard character data, and then contents are compressed. This improves the rate of compression.

Consecutive charters data decreases the number of files to open and close, reducing a character string comparison area to speed up full text retrieval. In full text retrieval, decompressed non-standard character data is directly compared with a retrieval keyword in character string comparison to further increase retrieval speed.

Figure 37:
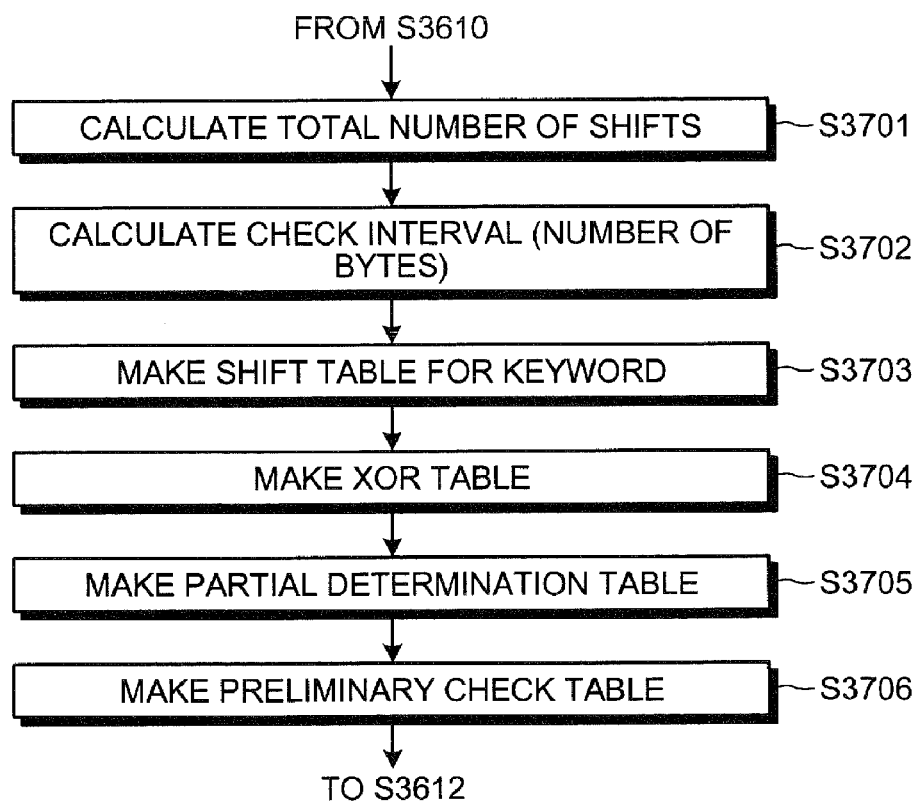
FIG. 37 is a flowchart of a preliminary check table generating process.

FIG. 37 is a flowchart of a preliminary check table generating process. As depicted in FIG. 37, the total number of shifts of the compressed keyword 2302 is calculated first (step S3701). Specifically, the length of bits not holding the compressed keyword 2302 ("*" of FIG. 25) is calculated as the total number of shifts, from the length of the compressed keyword and the length of bits in the register Ra.

Subsequently, a check interval (number of bytes) is calculated referring to the table of shift operation of FIG. 24 (step S3702). The compressed keyword 2302 is then shifted by the total number of shifts on a bit-to-bit basis to make the shift table 2500 (step S3703). The bit strings on the shift table 2500 and the compressed keyword 2302 are subject to XOR calculation to make the XOR table 2501 (step S3704).

The partial determination table 2502 is then made from the XOR table 2501 and the numbers of shifts of the bit strings making up the XOR table 2501 (step S3705). The preliminary check table 2503 is made using the partial determination table 2502 (step S3706), after which the process proceeds to step S3612.

Figure 38:
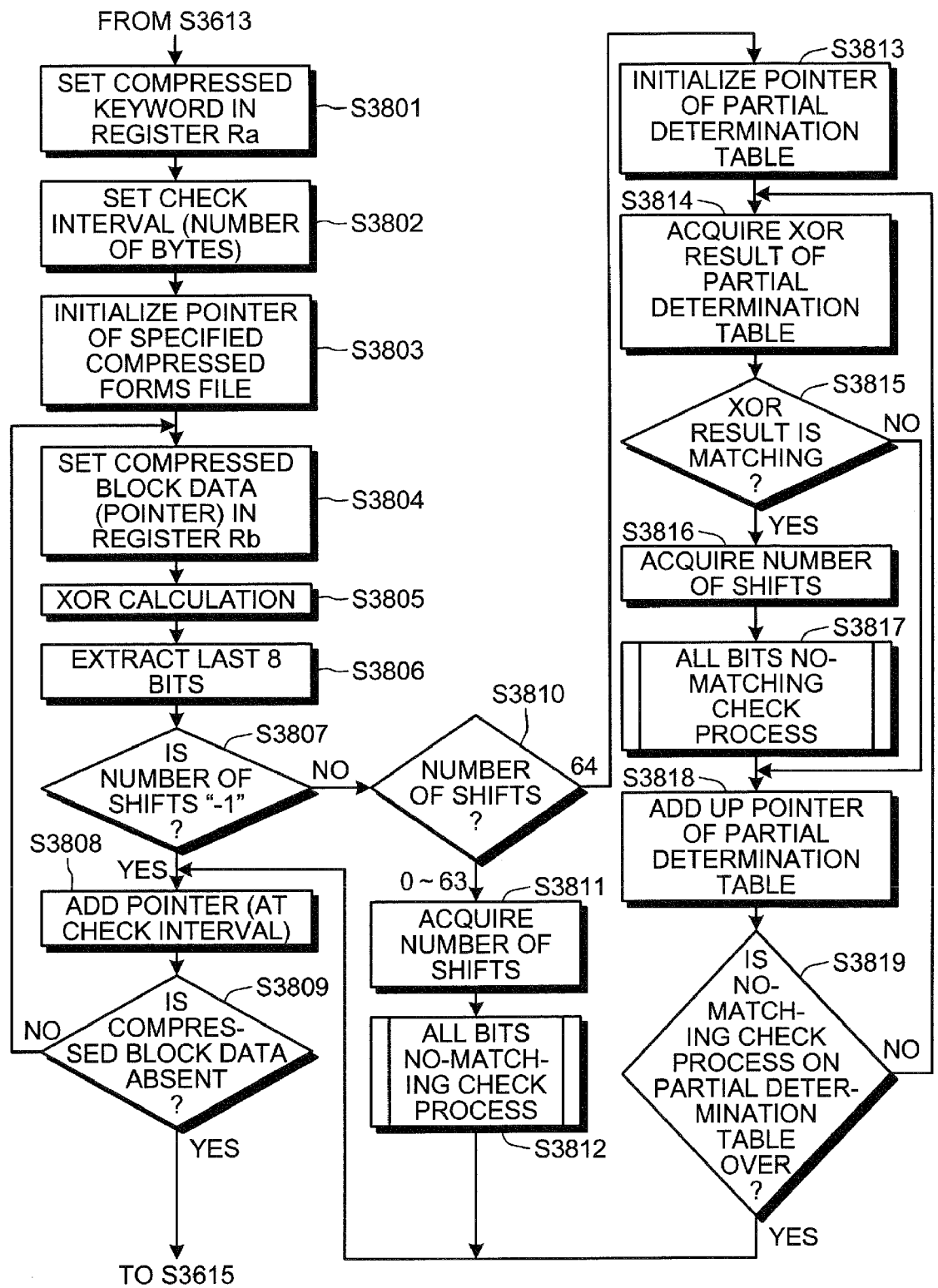
FIG. 38 is a flowchart of a process of determining no matching of compressed block data with respect to a compressed keyword.

FIG. 38 is a flowchart of a process of determining no matching of compressed block data with respect to a compressed keyword. As depicted in FIG. 38, the compressed keyword 2302 is set in the register Ra (step S3801).

Subsequently, a check interval (number of bytes) at which the compressed block data 2312 is shifted is set (step S3802), and a pointer of the specified compressed forms file 2311 is initialized (step S3803). Following the current pointer, the compressed block data 2312 is set in the register Rb (step S3804). The exclusive-OR of the register Ra and the register Rb is then calculated (step S3805) to extract the bit string 2330 consisting of the last 8 bits (step S3806).

Subsequently, the extracted bit string 2330 of the last 8 bits is checked against the preliminary check table 2503 to detect the number of shifts of a bit string matching the bit string 2330 of the last 8 bits among bit strings in the preliminary check table 2503. Whether the detected number of shifts is "−1", that is, whether the compressed block data 2312 does not match the compressed keyword 2302 is determined (step S3807).

When the number of shifts is "−1" (step S3807: YES), a pointer of the specified compressed forms file 2311 is added at the check interval (step S3808), and whether the compressed block data 2312 is not present is determined (step S3809). When the compressed block data 2312 is present (step S3809: NO), the procedure returns to step S3804. When the compressed block data 2312 is not present (step S3809: YES), the procedure proceeds to step S3615. Steps S3804 to S3809: NO form a loop, which enables faster check to determine no matching; thereby, enabling improved retrieval speed.

When the number of shifts is not "−1" at step S3807 (step S3807: NO), but is 0 to 63 (0 to 63 at step S3810), which means partial matching, the number of shifts is acquired (step S3811) to execute an all bits no-matching check process (step S3812), which will be described later. Subsequently, the procedure proceeds to step S3808.

When the number of shifts is 64 at step S3810 (step S3810: 64), which means overlapping partial matching, a pointer of the partial determination table 2502 is initialized (step S3813), and the XOR result of the partial determination table 2502 that corresponds to the current pointer is acquired (step S3814). Whether the bit string corresponding to the number of shifts of 64 matches the XOR result of the partial determination table 2502 that corresponds to the current pointer is then determined (step S3815). When no matching results (step S3815: NO), the process proceeds to step S3818.

When matching results (step S3815: YES), the number of shifts corresponding to the XOR result is acquired from the partial determination table 2502 (step S3816) to execute the all bits no-matching check process (step S3817). This all bits no-matching check process (step S3817) is equivalent to the all bits no-matching check process at step S3812, and will be described later.

Following the all bits no-matching check process (step S3817), pointers of the partial determination table 2502 are summed (step S3818). When the current pointer of the partial determination table 2502 is not the final pointer (step S3819: NO), the process returns to step S3814. When the current pointer of the partial determination table 2502 is the final pointer (step S3819: YES), the process returns to step S3808.

Figure 39:
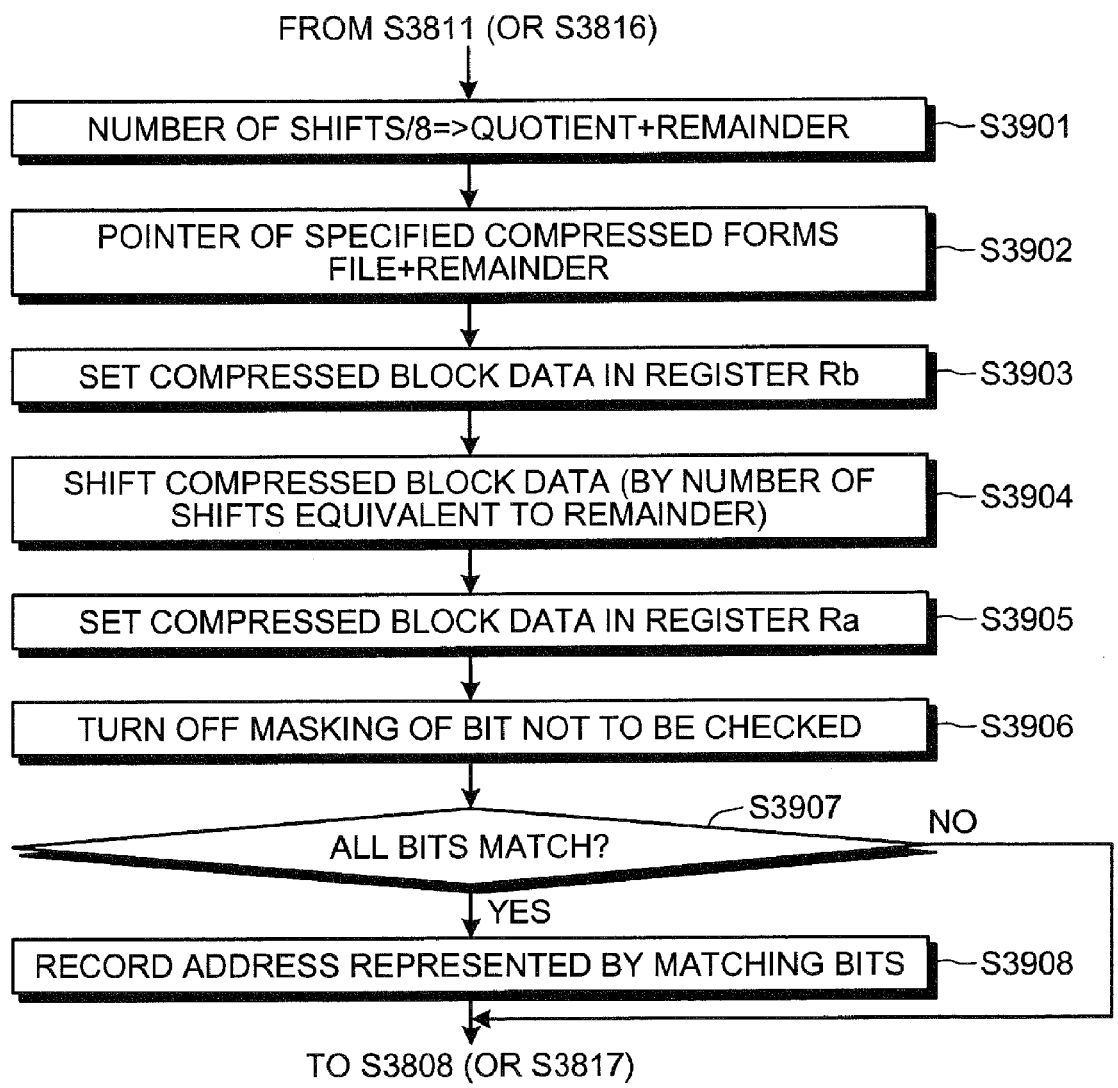
FIG. 39 is a flowchart of an all bits no-matching check process (step S3812 and step S3817)

FIG. 39 is a flowchart of the all bits no-matching check process (step S3812 and step S3817). As depicted in FIG. 39, the number of shifts is divided by 8 to acquire the quotient and the remainder thereof (step S3901).

The quotient is then added to the current pointer of the specified compressed forms file 2311 (step S3902), and the compressed block data 2312 is set in the register Rb (step S3903). The set compressed block data 2312 is shifted by the number of shifts equivalent to the remainder (step S3904).

Subsequently, the compressed keyword 2302 is set in the register Ra (step S3905), and masking of bits not to be subjected to check is turned off in both registers Ra and Rb (step S3906). When both registers match in all bits thereof (step S3907: YES), the address represented by the matching bits is recorded (step S3908), after which the procedure proceeds to step S3808 (or to step S3817). When all of the bits do not match (step S3907: NO), the process proceeds to step S3808 (or to step S3817).

In this manner, the method of no-matching check based on the byte-to-byte operation that the CPU 101 of the computer is well capable of is carried out in no-matching check with respect to the specified compressed forms file 2311. For preliminary check per bit, the XOR of the compressed keyword 2302 made by compressing the input retrieval keyword 2301 and the shift table 2500 representing the set of data resulting from bit-by-bit shifting of the compressed keyword 2302 is calculated, and no-matching check is carried out based on the result of the XOR calculation. A check interval for comparison between the compressed keyword and the specified compressed forms file 2311 is lengthened according to the length of the compressed keyword to speed up no-matching check.

Figure 40:
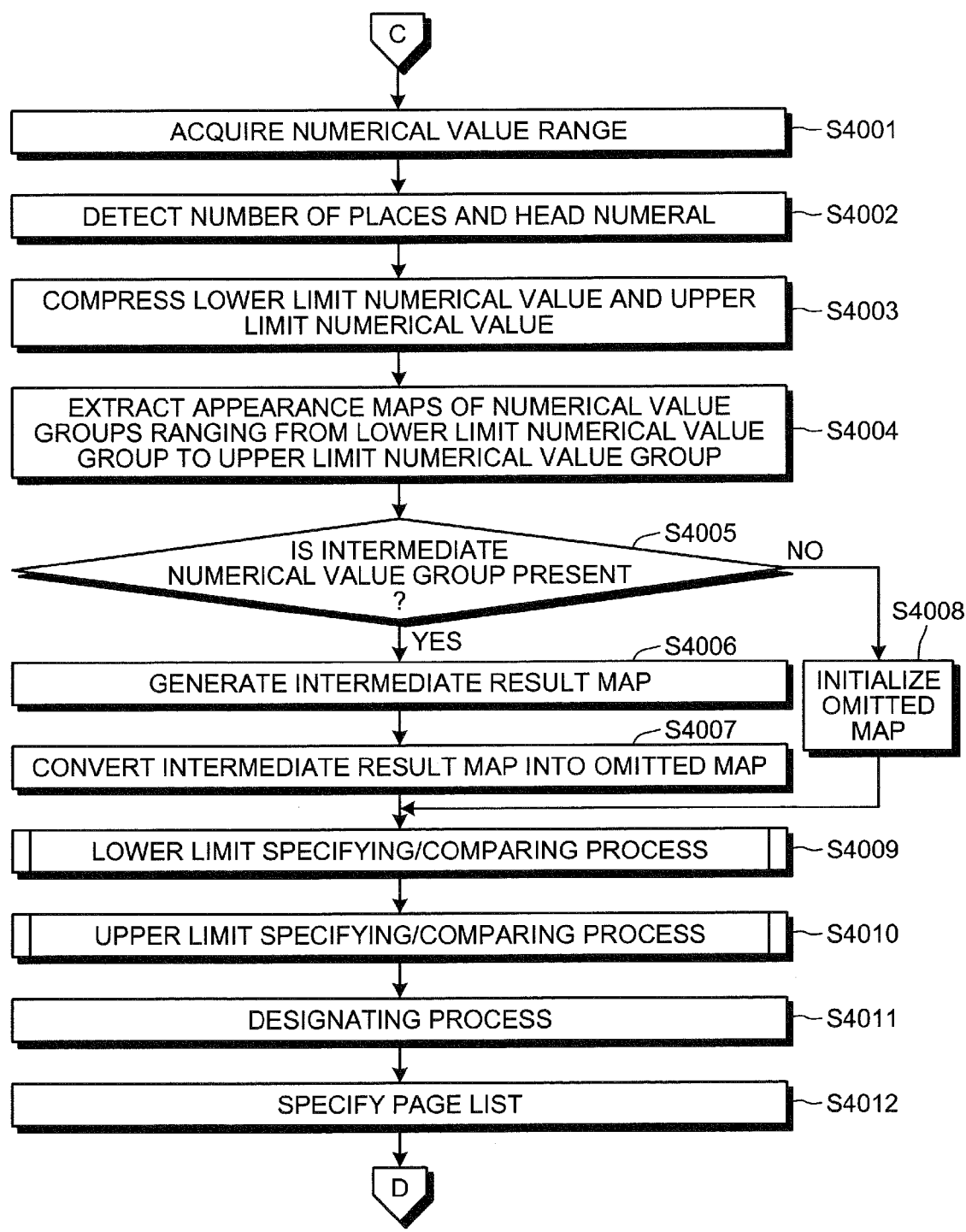
FIG. 40 is a flowchart of a numerical value retrieval executing process in a numerical value retrieval mode according to the embodiment of the present invention.

FIG. 40 is a flowchart of a numerical value retrieval executing process in a numerical value retrieval mode according to the embodiment of the present invention.

Following step S3602: YES of FIG. 36, the acquiring unit 2701 acquires a numerical value range (step S4001). Subsequently, the detecting unit 2703 detects the number of places and the head numeral of a numerical value (lower limit numerical value or upper limit numerical value) defining the boundary of the numerical value range (step S4002). The numerical value compressing unit 2702 then compresses a lower limit numerical value and an upper limit numerical value (step S4003).

Subsequently, the appearance map extracting unit 2705 extracts appearance maps of numerical groups ranging from a lower limit numerical value group to an upper limit numerical value group, from the appearance map 501 (step S4004). The intermediate numerical value group determining unit 2704 then determines whether an intermediate numerical value group is present (step S4005). When the presence of the intermediate numerical value group is determined (step S4005: YES), the omitted map setting unit 2706 calculates the logical sum of appearance maps of intermediate numerical value groups to generate an intermediate result map (step S4006), and reverses all bits in the intermediate result map to convert it into an omitted map (step S4007).

When the absence of the intermediate numerical value group is determined (step S4005: NO), the omitted map is initialized (step S4008). Specifically, bits strings corresponding to the forms files f0 to fn are all set to OFF to acquire the omitted map in which all bits are "0", after which the process proceeds to step S4009.

Subsequently, a lower limit specifying/comparing process (step S4009) and an upper limit specifying/comparing process (step S4010) are executed. A detailed procedure of the lower limit specifying/comparing process (step S4009) and the upper limit specifying/comparing process (step S4010) will be described later.

The designating unit 2711 designates the compressed forms file Fi having a numerical value within the numerical value range (step S4011). The file configuration data specifying unit 2109 then specifies a page list of the compressed forms file Fi having the numerical value within the numerical value range (step S4012), and the process proceeds to step S3621 of FIG. 36. Hence, a series of processes making up the numerical value retrieval executing process ends.

Figure 41:
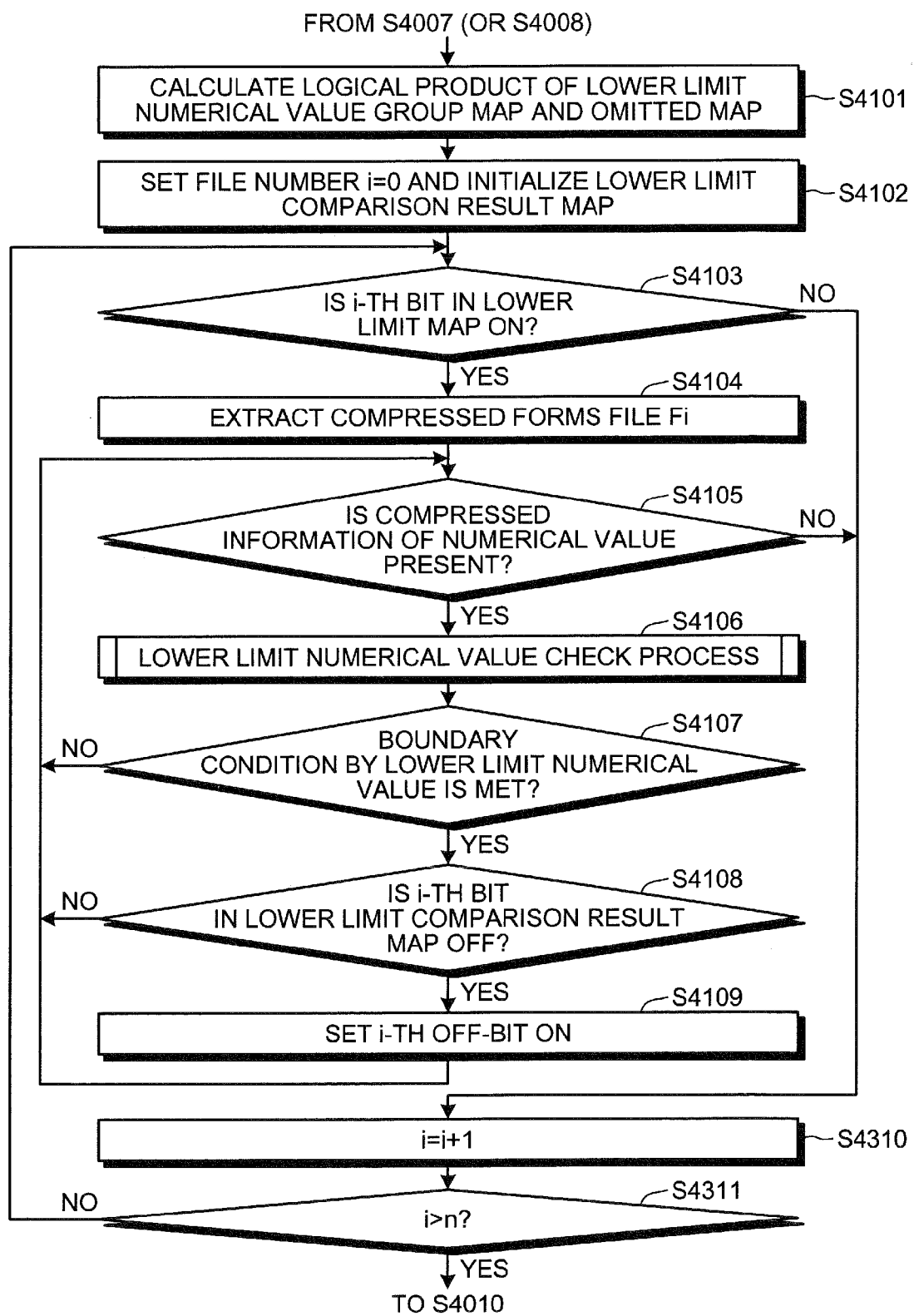
FIG. 41 is a flowchart of a lower limit specifying/comparing process of FIG. 40.

FIG. 41 is a flowchart of the lower limit specifying/comparing process of FIG. 40. The processes depicted in FIG. 41 are described with reference to the size comparison examples of FIGS. 28A to 28D.

As depicted in FIG. 28B, the logical product of the lower limit numerical value group map (four-place/head numeral 3 map M43) and the omitted map M02 is calculated to acquire the lower limit map M03 (step S4101). Subsequently, the file number i is set to 0, and the lower limit comparison result map M04 is initialized (by setting all bits to OFF) (step S4102).

Whether the i-th bit in the lower limit map M03 is ON is determined (step S4103). When the i-th bit is OFF (step S4103: NO), the process proceeds to step S4110.

When the i-th bit is ON (step S4103: YES), the compressed forms file Fi is extracted from the compressed forms file F (step S4104). Following this, whether compressed information of an in-file numerical value (compressed information 2801 of FIG. 28B) is present in the compressed forms file Fi is determined (step S4105).

When the compressed information is present (step S4105: YES), a lower limit numerical value comparing process is executed (step S4106). The lower limit numerical value comparing process will be described later with reference to FIG. 42. Based on the result of the lower limit numerical value comparing process, whether a boundary condition by a lower limit numerical value is satisfied is determined (step S4107).

When the boundary condition is not satisfied (step S4107: NO), the process returns to step S4105. When the boundary condition is satisfied (step S4107: YES), whether the i-th bit in the lower limit comparison result map M04 remains OFF is determined (step S4108). When the i-th bit is already ON (step S4108: NO), the process proceeds to step S4105.

When the i-th bit is OFF (step S4108: YES), the i-th bit is turned from OFF to ON (step S4109), after which the process returns to step S4105. At step S4105, when no unchecked compressed information of an in-file numerical value is present (step S4105: NO), the process proceeds to step S4110. At step S4110, the file number i is increased by 1, and whether i>n is satisfied is determined (step S4111).

When i>n is not satisfied (step S4111: NO), the process returns to step S4103. When i>n is satisfied (step S4111: YES), the process proceeds to step S4011 of FIG. 40. Hence, a series of processes making up the lower limit specifying/comparing process ends.

Figure 42:
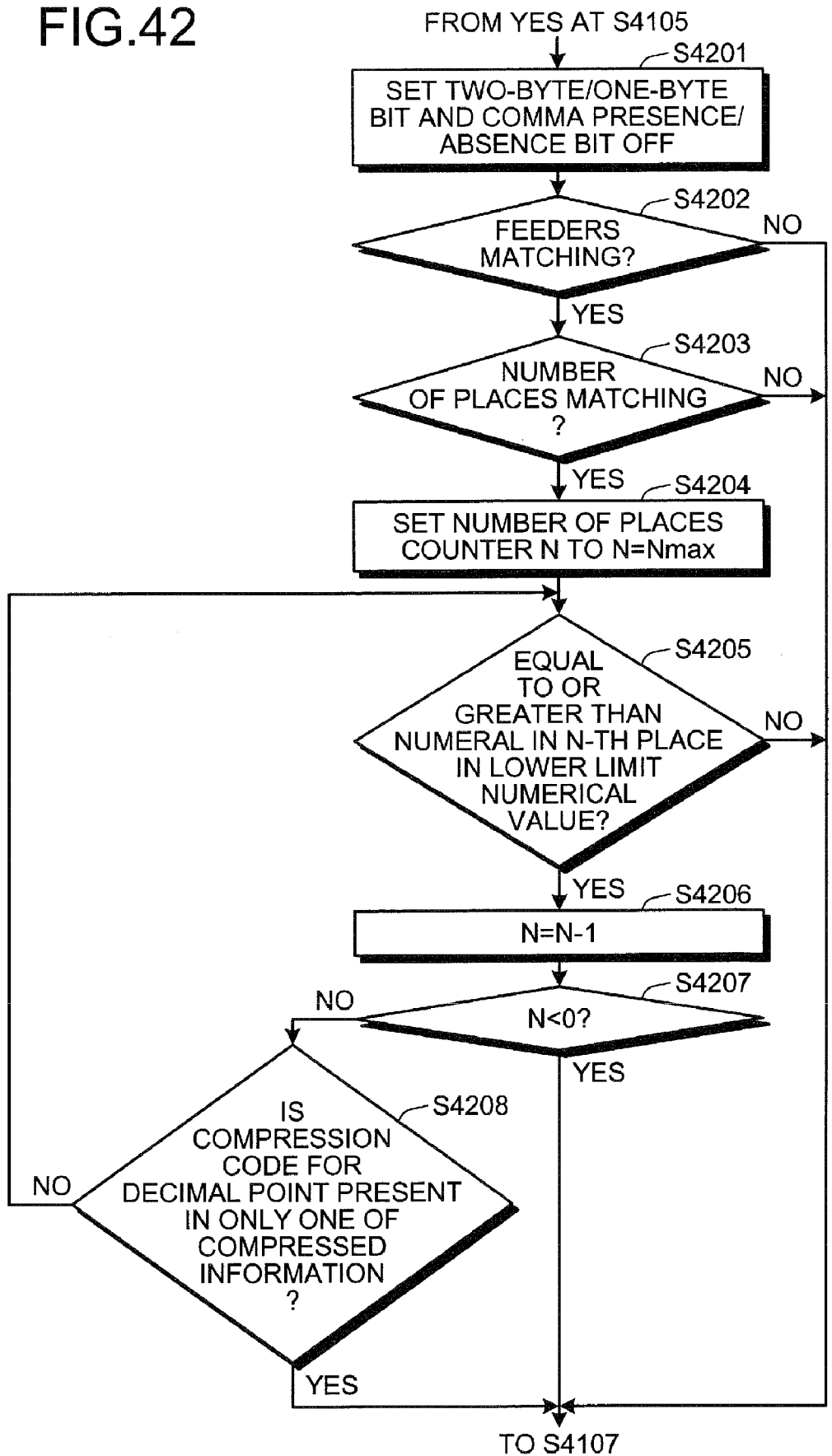
FIG. 42 is a flowchart of a lower limit numerical value check process.

FIG. 42 is a flowchart of the lower limit numerical value check process. As depicted in FIG. 42, a two-byte/one-byte bit and a comma presence/absence bit in compressed information of a lower limit numerical value and a two-byte/one-byte bit and a comma presence/absence bit in compressed information of an in-file numerical value are set to OFF (step S4201).

The compressed information is compared to determine whether feeders in the information match (step S4202). When the feeders do not match (step S4202: NO), the process proceeds to step S4107. When the feeders match (step S4202: YES), whether the number of places match is determined (step S4203).

When the number of places do not match (step S4203: NO), the process proceeds to step S4107. When the number of places also match (step S4203: YES), a number of places counter N is set to N=Nmax (step S4204), which represents the number of places of the lower limit numerical value and the number of places of the in-file numerical value.

Subsequently, whether a numeral in the N-th place in the in-file numerical value is at least equal to a numeral in the N-th place in the lower limit numerical value is determined (step S4205). Being equal to or larger than the numeral in the N-th place in the lower limit numerical value is adopted as a determination criterion because a boundary condition by the lower limit numerical value of a numerical value range is "≦". If the boundary condition is "<", whether the numeral in the N-th place in the in-file numerical value is larger than the numeral in the N-th place in the lower limit numerical value is determined.

When the numeral in the N-th place in the in-file numerical value is not equal to or larger than the numeral in the N-th place in the lower limit numerical value (step S4205: NO), the process proceeds to step S4107. When the numeral in the N-th place in the in-file numerical value is equal to or larger than the numeral in the N-th place in the lower limit numerical value (step S4205: YES), the count of the number of places counter N is decreased by 1 (step S4206), and whether the count N of the number of places counter N satisfies N<0 is determined (step S4207). When N<0 is not satisfied (step S4207: NO), whether a compressed code for a decimal point between a compressed code for a numeral in the (N-1)-th place and a compressed code for a numeral in the n-th place is in only either the compressed information of the lower limit numerical value or in the compressed information of the in-file numerical value is determined (step S4208).

When the compressed code for the decimal point between the compressed code for the numeral in the (N-1)-th place and the compressed code for the numeral in the n-th place is not in only one of the compressed information (step S4208: NO), that is, when the compressed code for the decimal point is present in both compressed information or when the compressed code for the decimal point is absent in both compressed information, the process returns to step S4205.

When the compressed code for the decimal point between the compressed code for the numeral in the (N-1)-th place and the compressed code for the numeral in the n-th place is in only one of the compressed information (step S4208: YES), the process proceeds to step S4107.

When N<0 is satisfied at step S4207 (step S4207: YES), the process proceeds to step S4107. Hence, a series of processes making up the lower limit numerical value comparing process ends.

At step S4107 of FIG. 41, meeting the boundary condition by the lower limit numerical value is determined when N<0 is satisfied at step S4207 (step S4207: YES), while not meeting the boundary condition by the lower limit numerical value is determined when determination of NO is given at step S4202, step S4203, step S4205, or step S4208.

Figure 43:
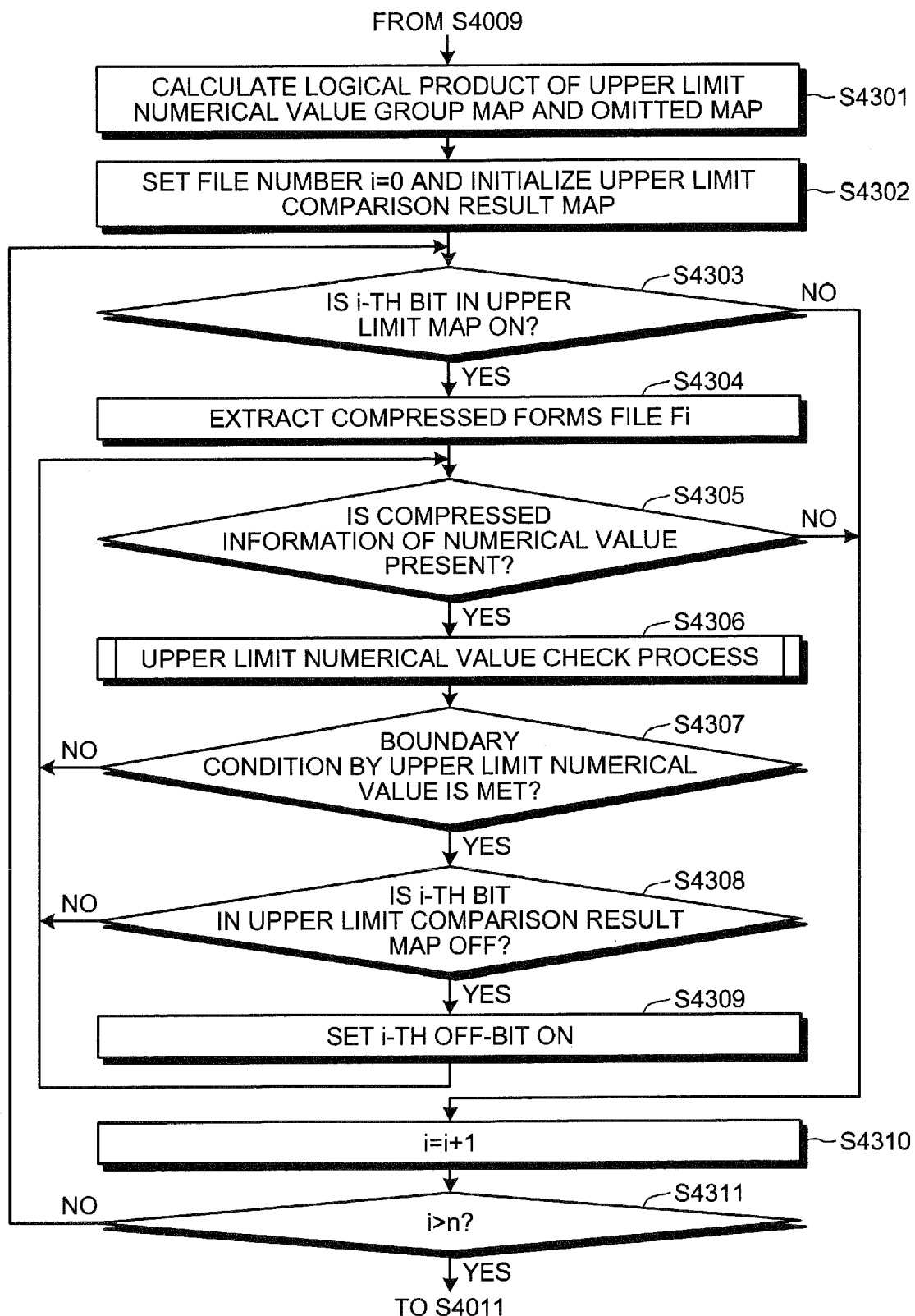
FIG. 43 is a flowchart of an upper limit specifying/comparing process of FIG. 40.

FIG. 43 is a flowchart of the upper limit specifying/comparing process of FIG. 40. The processes depicted in FIG. 43 are described with reference to the size comparison examples of FIGS. 28A to 28D.

As depicted in FIG. 28B, the logical product of the upper limit numerical value group map (four-place/head numeral 6 map M46) and the omitted map M02 is calculated to acquire the upper limit map M05 (step S4301). Subsequently, the file number i is set to 0, and the upper limit comparison result map M06 is initialized (by setting all bits to OFF) (step S4302).

Whether the i-th bit in the upper limit map M05 is ON is determined (step S4303). When the i-th bit is OFF (step S4303: NO), the process proceeds to step S4310.

When the i-th bit is ON (step S4303: YES), the compressed forms file Fi is extracted from the compressed forms file F (step S4304). Following this, whether compressed information of an in-file numerical value (compressed information 2803 of FIG. 28C) is present in the compressed forms file Fi is determined (step S4305).

When the compressed information is present (step S4305: YES), an upper limit numerical value comparing process is executed (step S4306). The upper limit numerical value comparing process will be described later with reference to FIG. 44. Based on the result of the upper limit numerical value comparing process, whether a boundary condition by an upper limit numerical value is satisfied is determined (step S4307).

When the boundary condition is not satisfied (step S4307: NO), the process returns to step S4305. When the boundary condition is satisfied (step S4307: YES), whether the i-th bit in the upper limit comparison result map M06 remains OFF is determined (step S4308). When the i-th bit is already ON (step S4308: NO), the process proceeds to step S4305.

When the i-th bit is OFF (step S4308: YES), the i-th bit is turned from OFF to ON (step S4309), after which the process returns to step S4305. At step S4305, when no unchecked compressed information of an in-file numerical value is present (step S4305: NO), the process proceeds to step S4310. At step S4310, the file number i is increased by 1, and whether i>n is satisfied is determined (step S4311).

When i>n is not satisfied (step S4311: NO), the process returns to step S4303. When i>n is satisfied (step S4311: YES), the process proceeds to step S4011 of FIG. 40. Hence, a series of processes making up the upper limit specifying/comparing process is ended.

Figure 44:
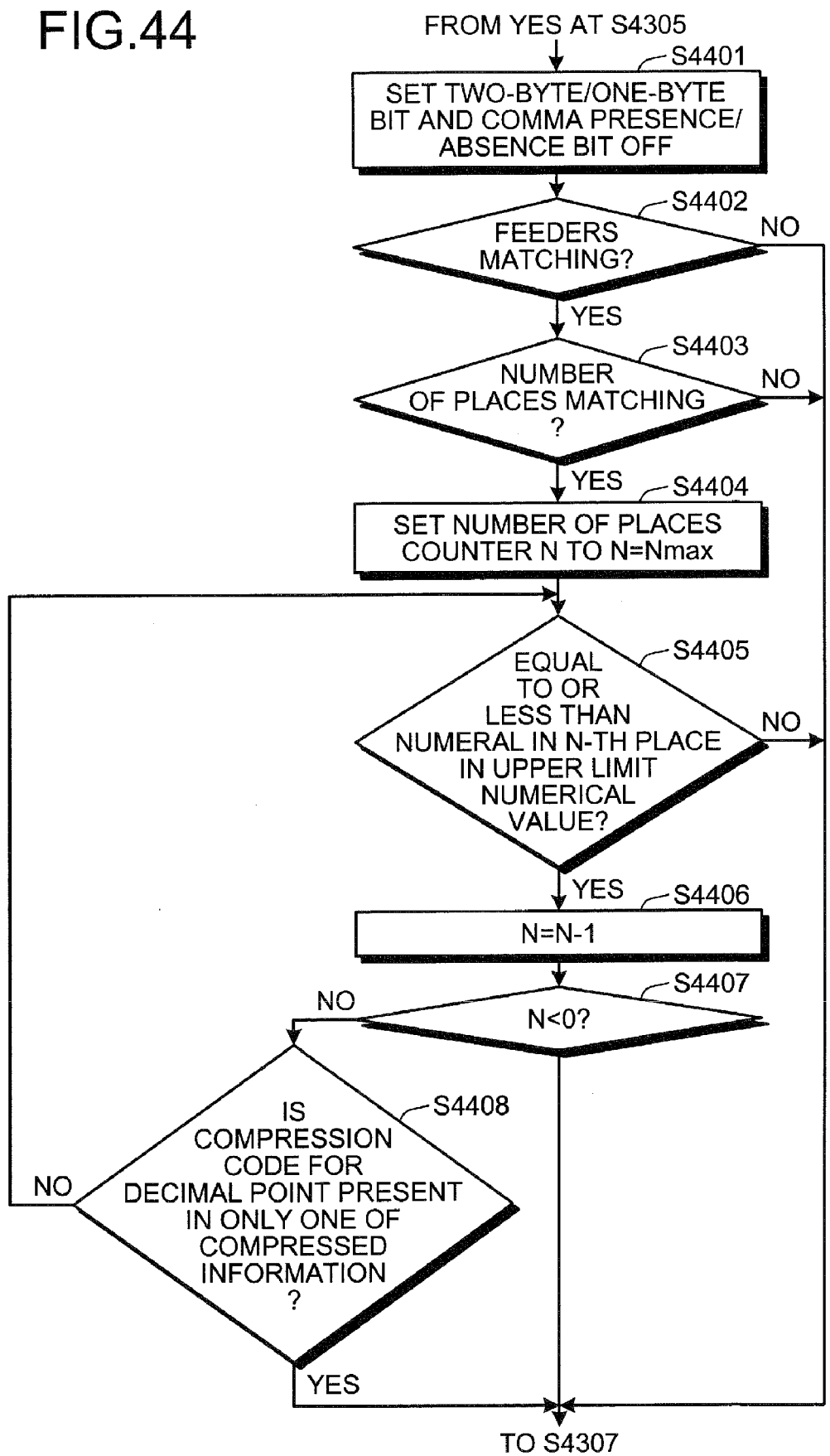
FIG. 44 is a flowchart of an upper limit numerical value check process.

FIG. 44 is a flowchart of the upper limit numerical value check process. As depicted in FIG. 44, a two-byte/one-byte bit and a comma presence/absence bit in compressed information of an upper limit numerical value and a two-byte/one-byte bit and a comma presence/absence bit in compressed information of an in-file numerical value are set to OFF (step S4401).

The compressed information is compared to determine whether feeders in the information match (step S4402). When the feeders do not match (step S4402: NO), the process proceeds to step S4307. When the feeders match (step S4402: YES), whether the number of places match is determined (step S4403).

When the number of places do not match (step S4403: NO), the process proceeds to step S4307. When the number of places also match (step S4403: YES), a number of places counter N is set to N=Nmax (step S4404), which represents the number of places of the upper limit numerical value and the number of places of the in-file numerical value.

Subsequently, whether a numeral in the N-th place in the in-file numerical value is at most equal to a numeral in the N-th place in the upper limit numerical value is determined (step S4405). Being equal to or less than the numeral in the N-th place in the upper limit numerical value is adopted as a determination criterion because a boundary condition by the upper limit numerical value of a numerical value range is "≧". If the boundary condition is ">", whether the numeral in the N-th place in the in-file numerical value is less than the numeral in the N-th place in the upper limit numerical value is determined.

When the numeral in the N-th place in the in-file numerical value is not equal to or less than the numeral in the N-th place in the upper limit numerical value (step S4405: NO), the process proceeds to step S4307. When the numeral in the N-th place in the in-file numerical value is equal to or less than the numeral in the N-th place in the upper limit numerical value (step S4405: YES), the count of the number of places counter N is decreased by 1 (step S4406), and whether the count N of the number of places counter N satisfies N<0 is determined (step S4407). When N<0 is not satisfied (step S4407: NO), whether a compressed code for a decimal point between a compressed code for a numeral in the (N−1)-th place and a compressed code for a numeral in the n-th place is in only either the compressed information of the upper limit numerical value or in the compressed information of the in-file numerical value is determined (step S4408).

When the compressed code for the decimal point between the compressed code for the numeral in the (N−1)-th place and the compressed code for the numeral in the n-th place is not in only one of the compressed information (step S4408: NO), that is, when the compressed code for the decimal point is present in both compressed information or when the compressed code for the decimal point is absent in both compressed information, the process returns to step S4405.

When the compressed code for the decimal point between the compressed code for the numeral in the (N−1)-th place and the compressed code for the numeral in the n-th place is in only one of the compressed information (step S4408: YES), the process proceeds to step S4307.

When N<0 is satisfied at step S4407 (step S4407: YES), the process proceeds to step S4307. Hence, a series of processes making up the upper limit numerical value comparing process ends.

At step S4307 of FIG. 43, meeting the boundary condition by the upper limit numerical value is determined when N<0 is satisfied at step S4407 (step S4407: YES), while not meeting the boundary condition by the upper limit numerical value is determined when determination of NO is given at step S4402, step S4403, step S4405, or step S4408.

As described above, according to the embodiment of the present invention, an intermediate numerical value group is detected and is reflected in the omitted map M02. Because of this, the presence/absence of a numerical value within a numerical value range in a compressed forms file can be detected without carrying out matching check of the numerical value within the numerical value range on the compressed forms file specified by the appearance map of the intermediate numerical value group.

Numerical value matching check is carried out only on the lower numerical value group or the upper numerical value group. In carrying out matching check, because an in-file numerical value is linked to a feeder, numerical value information only can be retrieved at a high speed from the compressed forms file Fi. Because matching check is carried out between pieces of compressed information, size comparison can be carried out by comparing only the compressed codes for feeders and for the number of places for matching. This enables execution of precise retrieval at a high speed.

In the appearance frequency management data 500, the appearance frequency of a numeral, etc., is revised. This increases the speed of matching check and decompression of a numerical value, and the increase of the speed of checking and decompression is particularly effective in a case where numerical value data and character data are present together in a file-to-be-retrieved.

The embodiment of the present invention thus offers an effect of specifying a file having a numerical value within a numerical value range while keeping the file in a compressed form to improve the speed and precision of numerical value range retrieval.

According to the embodiment, files-to-be-retrieved having a numerical value in a numerical value group satisfying the number of places and a head numeral can be narrowed down before execution of numerical value range retrieval.

The embodiment increases the speed of the narrowing down of files-to-be-retrieved having a numerical value in a numerical value group satisfying the number of places and a head numeral.

According to the embodiment, numerical values can be compared in size step by step in a compressed form by carrying out comparison of the number of places, of head place numerals, second place numerals, etc., in sequence.

According to the embodiment, the compression efficiency of a numerical value can be improved preferentially to be higher than the compression efficiency of character data.

According to the embodiment, the compression efficiency of a numerical value having a comma can be improved preferentially to be higher than the compression efficiency of character data.

According to the embodiment, the compression efficiency of a numerical value having a decimal point can be improved preferentially to be higher than the compression efficiency of character data.

According to the embodiment, a numerical value can be extracted at high speed even from a file having character strings mixed with numerals.

According to the embodiment, compressed numerals are classified to able to perform size comparison and numerical value range retrieval on numerical values of the same type.

The embodiment enables determining the presence or absence of a numerical value within a numerical value range without carrying out numerical value retrieval on numerical values in an intermediate numerical value group. This speeds up numerical value retrieval.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A computer-readable recording medium storing therein an information retrieval program that causes a computer to execute:
    acquiring a numerical value defining a boundary of a numerical value range;
    detecting a number of places in and a head numeral of the numerical value acquired at the acquiring;
    extracting from a group of bit strings indicating, according to file, whether numerical values in a numerical value group meeting a number of places and a head numeral are present in files subject to retrieval, a bit string indicating, according to file, whether a numerical value in a numerical value group having the number of places and the head numeral detected at the detecting is present in files subject to retrieval;
    specifying, among the files subject to retrieval, a file corresponding to a bit in the bit string extracted at the extracting, the bit indicating a presence of a numerical value of the numerical value group having the number of places and the head numeral detected at the detecting;
    determining whether an in-file numerical value included in the file specified at the specifying meets a boundary condition of the numerical value defining the boundary; and
    designating, as a file having a numerical value within the numerical value range, the file specified at the specifying, based on a determination result obtained at the determining.

2. The computer-readable recording medium according to claim 1, wherein:
    the information retrieval program further causes the computer to execute determining whether an intermediate numerical value group is present between a first numerical value group having the number of places in and the head numeral of a first numerical value defining the boundary and a second numerical value group having the number of places in and the head numeral of a second numerical value defining the boundary,
    the specifying includes specifying a first file that is among the files having a numerical value in the first numerical value group and does not have a numerical value in the intermediate numerical value group, and specifying a second file that is among the files having a numerical value in the second numerical value group and does not have a numerical value in the intermediate numerical value group,
    the determining includes determining whether an in-file numerical value included in the first file specified at the specifying meets a boundary condition of the first numerical value defining the boundary, and determining whether an in-file numerical value included in the second file specified at the specifying meets a boundary condition of the second numerical value defining the boundary, and
    the designating includes designating the first file, or the second file, or a file having a numerical value in the intermediate numerical value group to be a file having a numerical value within the numerical value range, based on the determination result obtained at the determining whether a boundary condition is met.

3. A computer-readable recording medium storing therein an information retrieval program that causes a computer to execute:
    acquiring a numerical value defining a boundary of a numerical value range;
    compressing, into a given compression format, the numerical value acquired at the acquiring;
    determining whether an in-file numerical value meets a boundary condition of the numerical value by checking compressed information, obtained at the compressing and concerning the numerical value, against compressed information concerning the in-file numerical value, the in-file numerical value being included in a compressed file obtained by a compression, into the given compression format, of a file subject to retrieval; and
    designating the compressed file as a file having a numerical value within the numerical value range, based on a determination result obtained at the determining whether the in-file numerical value meets a boundary condition.

4. The computer-readable recording medium according to claim 3, wherein:
    the compressing includes compressing the numerical value into compressed information including a compression code for a numeral indicative of a number of places in the numerical value and a compression code for a numeral at each place in the numerical value, and
    the determining further includes determining whether the in-file numerical value meets a boundary condition of the numerical value, by comparing the compressed information obtained at the compressing the numerical value into compressed information and the compressed information concerning the in-file numerical value including a compression code for a numeral indicative of the number of places in the in-file numerical value and a compression code for a numeral at each place in the in-file numerical value.

5. The computer-readable recording medium according to claim 3, wherein the information retrieval program further causes the computer to execute:

determining whether an intermediate numerical value group is present between a first numerical value group meeting a number of places in and a head numeral of a first numerical value defining the boundary and a second numerical value group meeting a number of places in and a head numeral of a second numerical value defining the boundary;

specifying a first compressed file that is among compressed files subject to retrieval, has a numerical value in the first numerical value group, and does not have a numerical value in the intermediate numerical value group; and specifying a second compressed file that is among the compressed files subject to retrieval, has a numerical value in the second numerical value group, and does not have a numerical value in the intermediate numerical value group, wherein:

the compressing includes compressing the first numerical value into first compressed information including a compression code for a numeral indicative of the number of places in the numerical value defining the boundary and a compression code for a numeral at each place in the numerical value defining the boundary, and compressing the second numerical value defining the boundary into second compressed information including a compression code for a numeral indicative of the number of places in the numerical value defining the boundary and a compression code for a numeral at each place in the numerical value defining the boundary, the determining includes determining whether a boundary condition is met, by comparing the first compressed information and compressed information concerning an in-file numerical value included in the first compressed file, and comparing the second compressed information and compressed information concerning an in-file numerical value included in the second compressed file, and the designating includes designating the first compressed file, or the second compressed file, or a compressed file having a numerical value in the intermediate numerical value group to be a file having a numerical value within the numerical value range, based on a determination result obtained at the determining whether a boundary condition is met.

6. The computer-readable recording medium according to claim 3, wherein the information retrieval program further causes the computer to execute:

revising an appearance frequency of a numeral present in the file subject to retrieval to an appearance frequency higher than an appearance frequency of a character present in the file; and compressing the file, based on an appearance frequency revised at the revising, wherein:

the determining includes determining whether an in-file numerical value meets a boundary condition of the numerical value defining the boundary, by comparing compressed information that concerns the numerical value defining the boundary and that is obtained at the compressing the numerical value with compressed information concerning the in-file numerical value included in the compressed file obtained at the compressing the file.

7. The computer-readable recording medium according to claim 6, wherein:

the revising includes revising an appearance frequency of a comma present in the file to an appearance frequency higher than an appearance frequency of a character present in the file.

8. The computer-readable recording medium according to claim 6, wherein:

the revising includes revising an appearance frequency of a decimal point present in the file to an appearance frequency higher than an appearance frequency of a character present in the file.

* * * * *